(12) United States Patent
Hwang

(10) Patent No.: US 9,812,464 B1
(45) Date of Patent: Nov. 7, 2017

(54) THREE-DIMENSIONAL SEMICONDUCTOR DEVICE

(71) Applicant: Sung-Min Hwang, Seoul (KR)

(72) Inventor: Sung-Min Hwang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/437,426

(22) Filed: Feb. 20, 2017

(30) Foreign Application Priority Data

May 17, 2016 (KR) ........................ 10-2016-0060331

(51) Int. Cl.
| | | |
|---|---|---|
| *H01L 23/52* | (2006.01) | |
| *H01L 27/11582* | (2017.01) | |
| *H01L 23/522* | (2006.01) | |
| *H01L 23/528* | (2006.01) | |
| *H01L 23/535* | (2006.01) | |

(52) U.S. Cl.
CPC ...... *H01L 27/11582* (2013.01); *H01L 23/528* (2013.01); *H01L 23/5226* (2013.01); *H01L 23/535* (2013.01)

(58) Field of Classification Search
CPC ............. H01L 27/0688; H01L 23/5226; H01L 21/76877; H01L 23/528
USPC .................. 257/211, 296, 300, 621, 622, 786
See application file for complete search history.

(56) References Cited

U.S. PATENT DOCUMENTS

| | | |
|---|---|---|
| 7,952,136 B2 | 5/2011 | Kito et al. |
| 8,183,624 B2 | 5/2012 | Mizukami et al. |
| 8,187,932 B2 | 5/2012 | Nguyen et al. |
| 8,237,211 B2 | 8/2012 | Fukuzumi et al. |
| 8,787,082 B2 | 7/2014 | Son et al. |
| 8,969,162 B2 | 3/2015 | Hwang et al. |
| 8,981,567 B2 | 3/2015 | Hu et al. |
| 9,236,346 B2 | 1/2016 | Hu et al. |
| 2008/0099819 A1 | 5/2008 | Kito et al. |
| 2008/0253183 A1 | 10/2008 | Mizukami et al. |
| 2010/0096682 A1 | 4/2010 | Fukuzumi et al. |
| 2011/0227141 A1 | 9/2011 | Jeong et al. |
| 2012/0091413 A1 | 4/2012 | Nguyen et al. |
| 2012/0322252 A1 | 12/2012 | Son et al. |
| 2013/0295761 A1 | 11/2013 | Hwang et al. |
| 2014/0264898 A1 | 9/2014 | Hu et al. |

(Continued)

FOREIGN PATENT DOCUMENTS

| | | |
|---|---|---|
| JP | 5100080 B2 | 10/2012 |
| KR | 101548674 B1 | 9/2015 |

*Primary Examiner* — S. V. Clark

(74) *Attorney, Agent, or Firm* — Renaissance IP Law Group LLP

(57) ABSTRACT

A three-dimensional semiconductor device may include a lower electrode structure having a plurality of lower electrodes vertically stacked on a substrate and an upper electrode structure having a plurality of upper electrodes stacked on the lower electrode structure. Each of the lower and upper electrodes may include an electrode portion that is parallel to a top surface of the substrate and a vertical pad portion that is inclined with respect to the top surface of the substrate. The vertical pad portions of adjacent lower electrodes may be spaced apart from each other by a first horizontal distance. The vertical pad portions of adjacent lower and upper electrodes may be spaced apart from each other by a second horizontal distance that is greater than the first horizontal distance.

20 Claims, 45 Drawing Sheets

(56) References Cited

U.S. PATENT DOCUMENTS

| | | | |
|---|---|---|---|
| 2015/0035065 A1* | 2/2015 | Park | H01L 27/105 257/368 |
| 2015/0076579 A1 | 3/2015 | Tsuji et al. | |
| 2015/0179575 A1 | 6/2015 | Hu et al. | |
| 2016/0218059 A1* | 7/2016 | Nakada | H01L 27/11556 |
| 2017/0133397 A1* | 5/2017 | Lee | H01L 27/11582 |
| 2017/0148748 A1* | 5/2017 | Jeong | H01L 23/5226 |

* cited by examiner

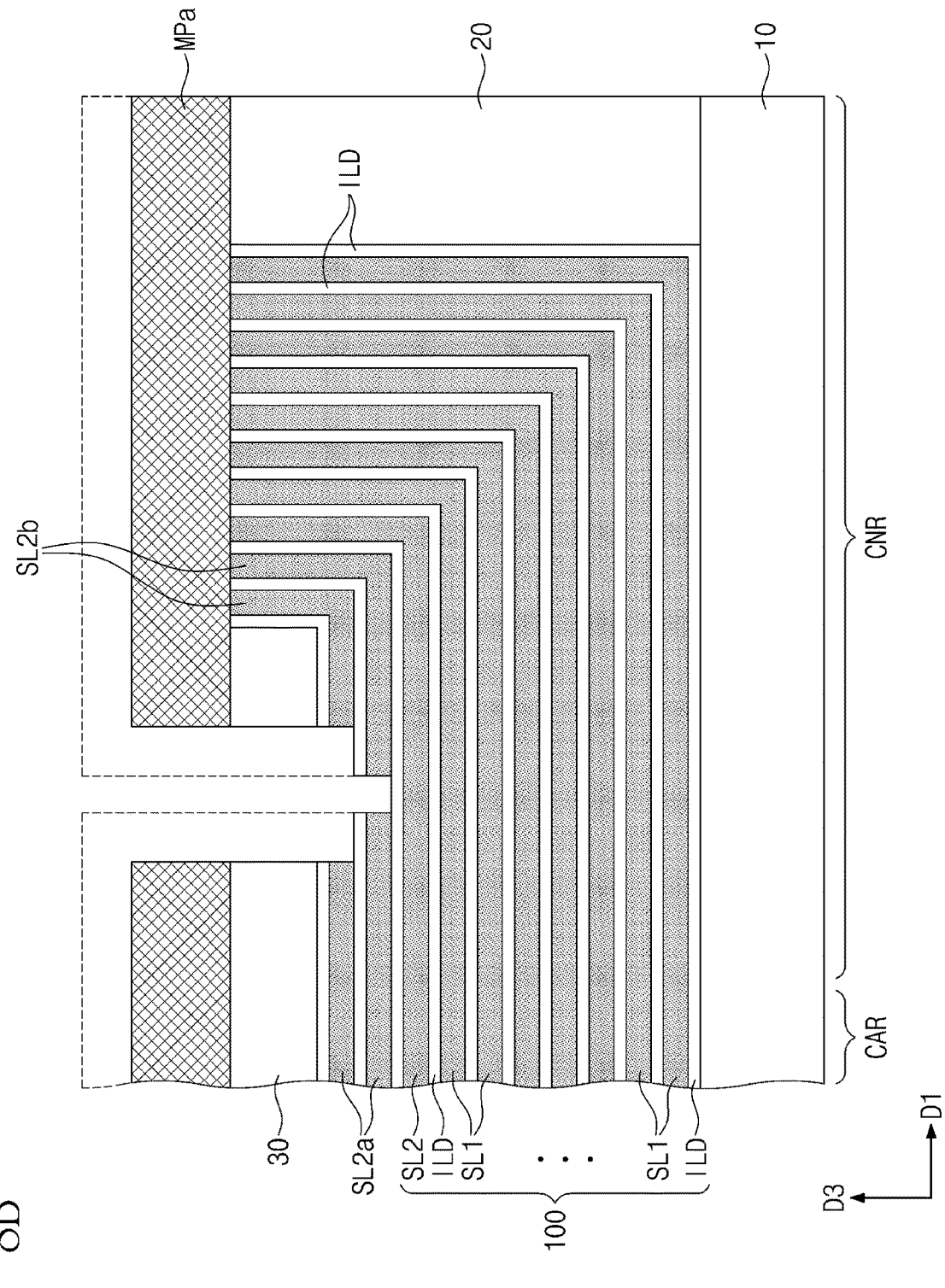

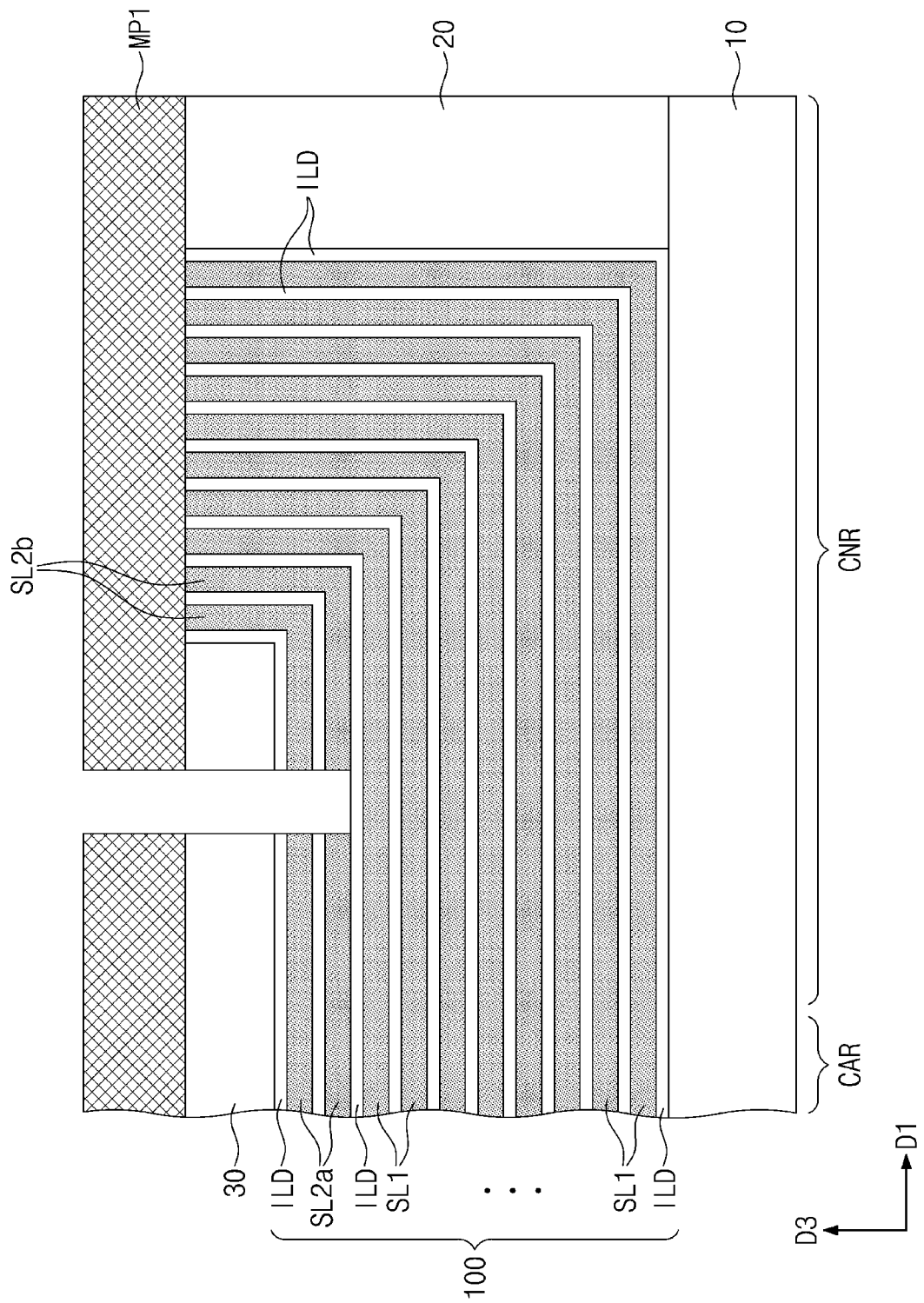

THREE-DIMENSIONAL SEMICONDUCTOR DEVICE

CROSS-REFERENCE TO RELATED APPLICATIONS

This U.S. non-provisional patent application claims priority under 35 U.S.C. §119 to Korean Patent Application No. 10-2016-0060331, filed on May 17, 2016, in the Korean Intellectual Property Office, the entire contents of which are hereby incorporated by reference.

BACKGROUND

The present disclosure relates to a semiconductor device, and in particular, to a three-dimensional semiconductor memory device.

Higher integration of semiconductor devices is needed to satisfy consumer demands for superior performance and inexpensive prices for electronic products. Considering semiconductor devices, because their level of integration is an important factor in determining electronic product prices, an increased level of integration is especially needed. The level of integration of typical two-dimensional or planar semiconductor devices is mainly determined by the area occupied by a unit memory cell, which, in turn is greatly influenced by the technology of a fine pattern forming. Extremely expensive process equipment is used to increase pattern fineness, which sets a practical limitation on increasing the level of integration for two-dimensional or planar semiconductor devices. To overcome such a limitation, three-dimensional semiconductor memory devices that include three-dimensionally arranged memory cells have been recently proposed.

SUMMARY

Some embodiments of the inventive concept provide highly integrated three-dimensional semiconductor devices.

According to some embodiments of the inventive concept, a three-dimensional semiconductor device may include a lower electrode structure that may include a plurality of lower electrodes that may be vertically stacked on a substrate and an upper electrode structure that may include a plurality of upper electrodes that may be stacked on the lower electrode structure. Each of the lower and upper electrodes may include an electrode portion that may be substantially parallel to a top surface of the substrate and a vertical pad portion that may be inclined with respect to the top surface of the substrate. The vertical pad portions of adjacent lower electrodes may be spaced apart from each other by a first horizontal distance. The vertical pad portions of adjacent pairs of the lower electrodes and the upper electrodes may be spaced apart from each other by a second horizontal distance that may be greater than the first horizontal distance.

According to some embodiments of the inventive concept, a three-dimensional semiconductor device may include a lower electrode structure that may include a plurality of lower electrodes that may be stacked on a substrate and an upper electrode structure that may include a plurality of upper electrodes that may be stacked on the lower electrode structure. Each of the lower electrodes may include an electrode portion that may be substantially parallel to a top surface of the substrate and a vertical pad portion that may be inclined with respect to the top surface of the substrate. Each of the upper electrodes may include a pad portion that may be exposed. The pad portions of the upper electrodes may be disposed on the electrode portion of the uppermost one of the lower electrodes.

According to some embodiments of the inventive concept, a method of fabricating a three-dimensional semiconductor device may include forming a first mold pattern on a substrate in which the first mold pattern may have a first recess region; forming a lower layered structure in the first recess region in which the lower layered structure may include lower insulating layers and lower sacrificial layers that may be stacked in an alternate manner and in which the lower layered structure may include a horizontal portion that may be substantially parallel to a top surface of the substrate and a sidewall portion that may be inclined with respect to the top surface of the substrate; forming a second mold pattern on the lower layered structure in which the second mold pattern may have a second recess region that may expose a portion of the horizontal portion of the lower layered structure; and forming an upper layered structure in the second recess region in which the upper layered structure may include upper insulating layers and upper sacrificial layers that may be stacked in an alternate manner in which the upper layered structure may include a horizontal portion that may be substantially parallel to the top surface of the substrate and a sidewall portion that may be inclined with respect to the top surface of the substrate. A top surface of the sidewall portion of the lower layered structure may be substantially coplanar with a top surface of the sidewall portion of the upper layered structure.

According to some embodiments of the inventive concept, a method of fabricating a three-dimensional semiconductor device may include forming a mold pattern on a substrate to define a recess region; forming a lower stack in the recess region in which the lower stack may include lower insulating layers and lower sacrificial layers that may be stacked in an alternate manner in which the lower stack may include a horizontal portion that may be substantially parallel to a top surface of the substrate and a sidewall portion that may be inclined with respect to the top surface of the substrate; forming an upper layered structure on the lower stack in which the upper layered structure may include upper insulating layers and upper sacrificial layers that may be stacked in an alternate manner; and performing a pad-etching process on the upper layered structure to form an upper stack that may have a staircase structure on the horizontal portion of the lower stack.

According to some embodiments of the inventive concept, a semiconductor memory device may include a first layered electrode structure on a surface of a substrate, and a second layered electrode structure on the first layered electrode structure. The first layered electrode structure may include a plurality of first electrodes stacked in a first direction away from the substrate in which each first electrode may have a horizontal electrode portion and a vertical pad portion disposed at a first end of the horizontal portion. The horizontal electrode portion of a first electrode may extend substantially in a second direction and the vertical pad portion of a first electrode may extend substantially in the first direction in which the second direction may be parallel to the surface of the substrate. The first ends of the horizontal portions and the corresponding vertical pad portions of the first electrodes may be grouped together, and the vertical pad portions of the first electrodes may be spaced apart from each other in the second direction by substantially a first distance. The second layered electrode structure may include a plurality of second electrodes stacked in the first direction away from the substrate in which each second electrode may have a horizontal electrode portion and a vertical pad portion disposed at a first end of the horizontal portion. The horizontal electrode portion of a second electrode may extend substantially in the second direction and the vertical pad portion of a second electrode may extend substantially in the first direction. The first ends of the horizontal portions and the vertical pad portions of the second electrodes may be grouped together in which the grouped-together vertical pad portions of the second electrodes may be spaced apart in the second direction from the grouped-together vertical pad portions of the first electrodes by a second distance that is greater than the first distance.

According to some embodiments of the inventive concept, a semiconductor memory device may include a first layered electrode structure on a surface of a substrate, and a second layered electrode structure on the first layered electrode structure. The first layered electrode structure may include a plurality of first electrodes stacked in a first direction away from a top surface of the substrate in which the plurality of first electrodes may be arranged in a plurality of stacks of first electrodes. Each stack of first electrodes may be separated from each other in a second direction in which the second direction may be substantially parallel to the top surface of the substrate. Each first electrode may have a horizontal electrode portion and a vertical pad portion disposed at a first end of the horizontal portion in which the horizontal electrode portion of a first electrode may extend substantially in a third direction and the vertical pad portion of a first electrode may extend substantially in the first direction in which the third direction may be parallel to the surface of the substrate and substantially perpendicular to the second direction. The first ends of the horizontal portions and the corresponding vertical pad portions of the first electrodes may be grouped together, and the vertical pad portions of the first electrodes may be spaced apart from each other in the third direction by substantially a first distance. The second layered electrode structure may include a plurality of second electrodes stacked in the first direction away from the top surface of the substrate in which the plurality of second electrodes may be arranged in a plurality of stacks of second electrodes in which each stack of second electrodes may be separated from each other in a second direction. Each second electrode may have a horizontal electrode portion and a vertical pad portion disposed at a first end of the horizontal portion in which the horizontal electrode portion of a second electrode may extend substantially in the third direction and the vertical pad portion of a second electrode may extend substantially in the first direction. The first ends of the horizontal portions and the vertical pad portions of the second electrodes may be grouped together in which the grouped-together vertical pad portions of the second electrodes may be spaced apart in the third direction from the grouped-together vertical pad portions of the first electrodes by a second distance that is greater than the first distance.

According to some embodiments of the inventive concept, a method to form a semiconductor memory device may include forming a first layered electrode structure on a surface of a substrate in which the first layered electrode structure may include a plurality of first electrodes stacked in a first direction away from the substrate, each first electrode may include a horizontal electrode portion and a vertical pad portion disposed at a first end of the horizontal portion in which the horizontal electrode portion of a first electrode may extend substantially in a second direction and the vertical pad portion of a first electrode may extend substantially in the first direction in which the second direction may be parallel to the surface of the substrate, the first ends of the horizontal portions and the corresponding vertical pad portions of the first electrodes may be grouped together, and the vertical pad portions of the first electrodes may be spaced apart from each other in the second direction by substantially a first distance; and forming a second layered electrode structure on the first layered electrode structure in which the second layered electrode structure may include a plurality of second electrodes stacked in the first direction away from the substrate, each second electrode may include a horizontal electrode portion and a vertical pad portion disposed at a first end of the horizontal portion, the horizontal electrode portion of a second electrode may extend substantially in the second direction and the vertical pad portion of a second electrode may extend substantially in the first direction in which the first ends of the horizontal portions and the vertical pad portions of the second electrodes may be grouped together, and the grouped-together vertical pad portions of the second electrodes may be spaced apart in the second direction from the grouped-together vertical pad portions of the first electrodes by a second distance that is greater than the first distance.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A to 8D, 9A, and 9B are sectional views depicting a pad-etching process that may be used to fabricate a three-dimensional semiconductor device according to some embodiments of the inventive concept.

DETAILED DESCRIPTION

Figure 1:
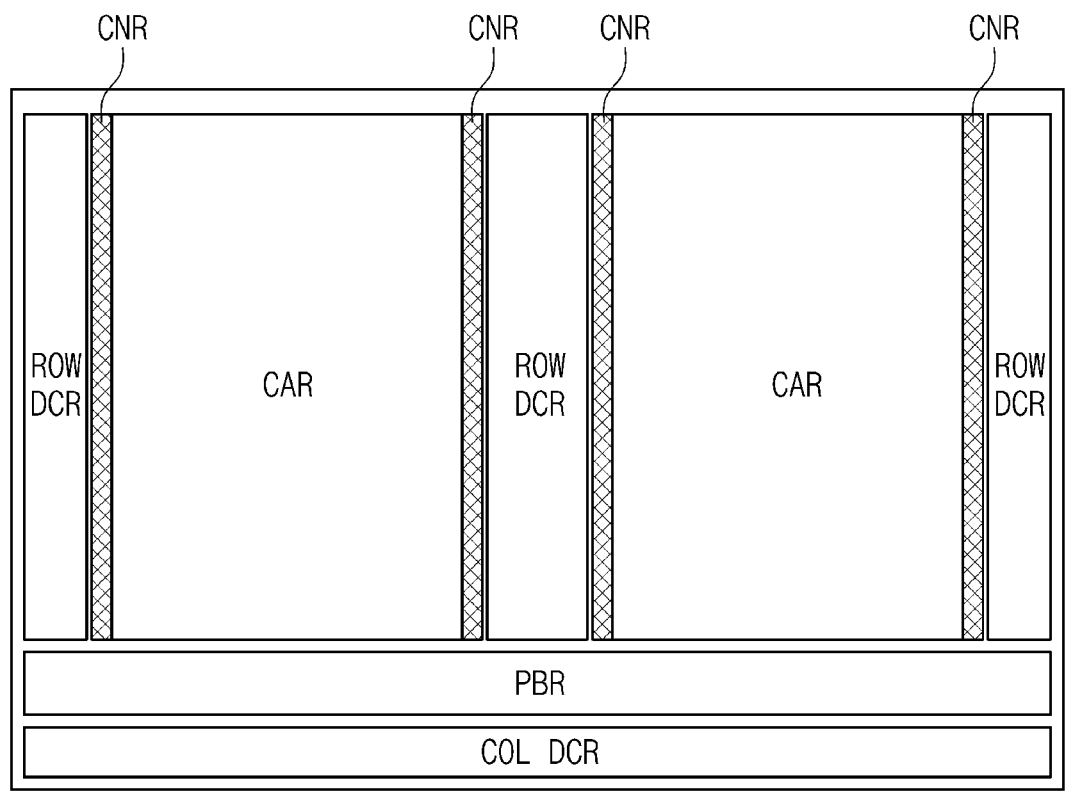
FIG. 1 is a schematic diagram depicting a chip layout of a three-dimensional (3D) semiconductor memory device according to some embodiments of the inventive concept.

Example embodiments of the inventive concepts will now be described more completely with reference to the accompanying drawings in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description will be omitted.

FIG. 1 is a schematic diagram depicting a chip layout of a three-dimensional semiconductor memory device according to some embodiments of the inventive concept.

Referring to FIG. 1, a three-dimensional semiconductor memory device may include a cell array region CAR and one or more peripheral circuit regions. The peripheral circuit regions may include row decoder regions ROW DCR, a page buffer region PBR, a column decoder region COL DCR, and a control circuit region (not shown). In some embodiments, a connection region CNR may be provided between the cell array region CAR and each of the row decoder regions ROW DCR.

A memory cell array may be provided in the cell array region CAR. In some embodiments, the memory cell array may include a plurality of memory cells, which are three-dimensionally arranged in the memory cell array, and a plurality of word and bit lines, which are electrically connected to the memory cells.

In each of the row decoder regions ROW DCR, a row decoder may be provided to select at least one of the word lines that are included in the memory cell array. In the connection region CNR, an interconnection structure (e.g., contact plugs and interconnection lines) may be provided to electrically connect the memory cell array to the row decoder. The row decoder may be configured to select at least one of the word lines based on address information. The row decoder may be configured to apply respectively different word line voltages to selected and unselected word lines in response to control signals from a control circuit (not shown).

In the page buffer region PBR, a page buffer may be provided to read out data stored in the memory cells. Depending on a mode of operation, the page buffer may be configured to temporarily store data in the memory cells or to read out data stored in the memory cells. For example, the page buffer may function as a write driver in a program operation mode or as a sense amplifier in a read operation mode.

A column decoder may be provided in the column decoder region COL DCR. The column decoder may be connected to the bit lines of the memory cell array to provide data-transmission paths between the page buffer and an external device (e.g., a memory controller).

FIGS. 2A to 2I respectively depict perspective views of different stages of a method for fabricating a three-dimensional semiconductor device according to some embodiments of the inventive concept. FIG. 3 is a perspective view depicting an electrode structure that is formed by the method of FIGS. 2A to 2I.

Figure 2A:
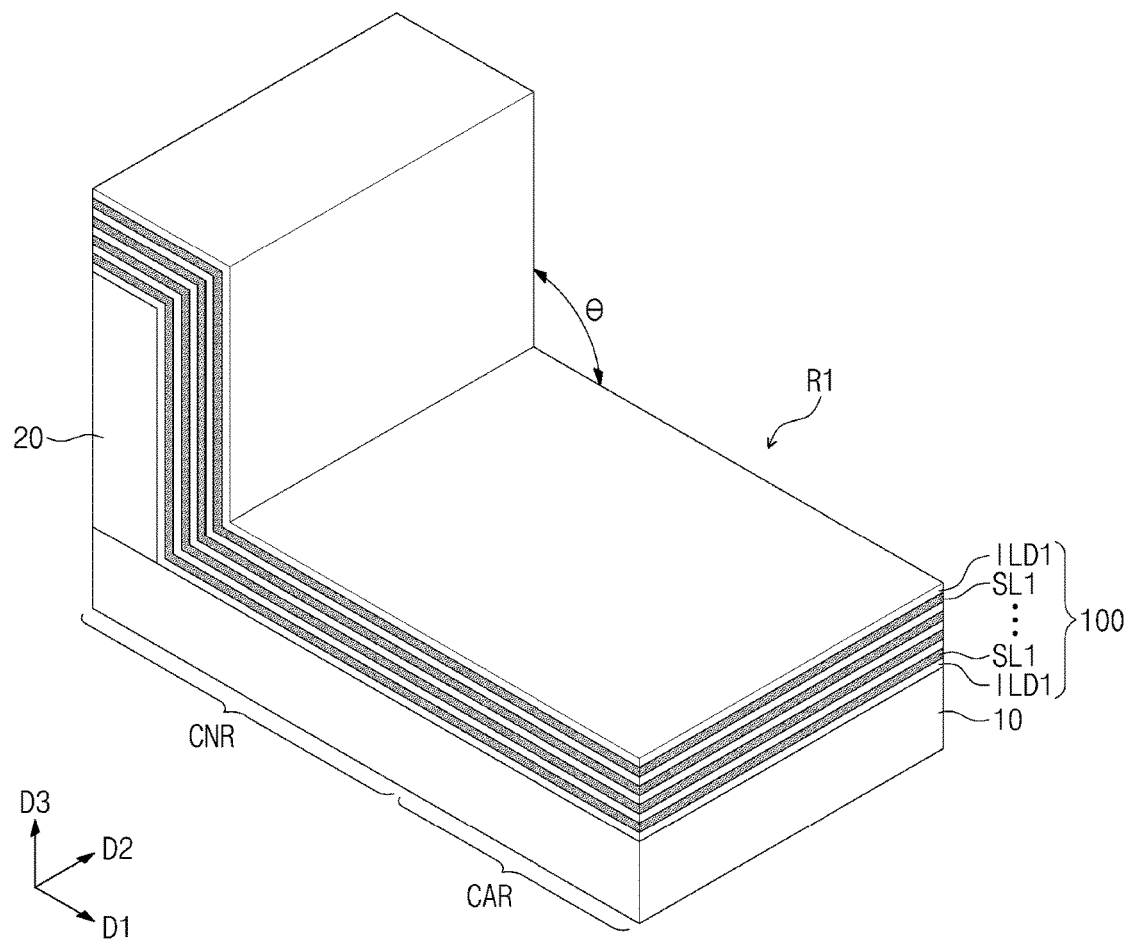
FIGS. 2A to 2I respectively depict perspective views of different stages of a method for fabricating a three-dimensional semiconductor device according to some embodiments of the inventive concept.
Figure 3:
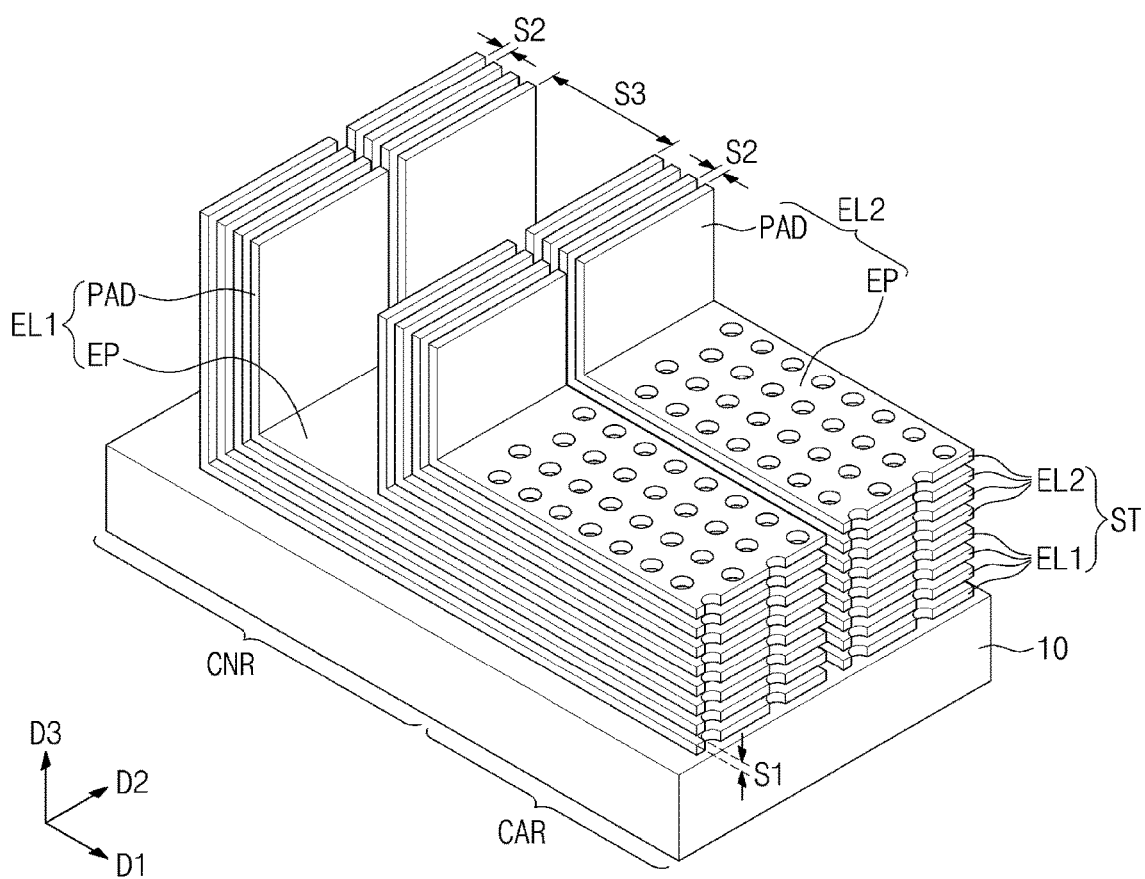
FIG. 3 is a perspective view depicting an electrode structure that is formed by the method of FIGS. 2A to 2I.

Referring to FIG. 2A, a substrate 10 may include a cell array region CAR and a connection region CNR. For example, the substrate 10 may be formed from or may include silicon (Si), germanium (Ge), silicon germanium (SiGe), gallium arsenic (GaAs), indium gallium arsenic (InGaAs), aluminum gallium arsenic (AlGaAs) or a combination thereof. As further examples, the substrate 10 may be a bulk silicon wafer, a silicon-on-insulator (SOI) wafer, a germanium wafer, a germanium-on-insulator (GOI) wafer, a silicon-germanium substrate, or a substrate having an epitaxial layer that has been formed by a selective epitaxial growth (SEG) process. In certain embodiments, the substrate 10 may be formed from or may include one or more insulating layers. For example, the substrate 10 may include a silicon oxide layer, a silicon nitride layer, or low-k dielectric layer.

A first mold pattern 20 may be formed on the substrate 10 and may define a first recess region R1. The first mold pattern 20 may be locally formed on the connection region CNR of the substrate 10 or on both of the connection region CNR and the peripheral circuit region (not shown) of the substrate 10. As an example, forming the first mold pattern 20 may include forming an insulating mold layer on the substrate 10 and etching a portion of the insulating mold layer. After the etching process, the first mold pattern 20 may have a sidewall that is at an angle with respect to a top surface of the substrate 10. For example, the sidewall of the first mold pattern 20 may be formed to have an angle θ that may range from about 90 degrees to about 130 degrees with respect to the top surface of the substrate 10. In certain embodiments, the first mold pattern 20 may be formed by patterning a portion of the substrate 10, in which case the first mold pattern 20 may be formed from the same material as the substrate 10. The first mold pattern 20 may alternatively be a multi-layered structure that includes a plurality of layers.

A lower layered structure 100 may be formed on the substrate 10 and the first mold pattern 20. The lower layered structure 100 may include a plurality of lower insulating layers ILD1 and a plurality of lower sacrificial layers SL1 that are alternately and repeatedly stacked on the substrate 10 and the first mold pattern 20.

The thickness of the lower layered structure 100 in the third direction D3 may be less than a thickness of the first mold pattern 20 in the third direction D3. In this situation, a top surface of the lower layered structure 100 in the cell array region CAR may be lower than a top surface of the first mold pattern 20. That is, on the cell array region CAR of the substrate 10, the lower layered structure 100 may have a concave portion with respect to a top surface of the first mold pattern 20.

In greater detail, the lower sacrificial layers SL1 and the lower insulating layers ILD1 may be formed to conformally cover the structure formed by the substrate 10 and the first mold pattern 20. For example, the lower sacrificial layers SL1 and the lower insulating layers ILD1 may be formed using at least one deposition technique that is capable of providing an excellent step-coverage property. For example, the lower sacrificial layers SL1 and the lower insulating layers ILD1 may be deposited using a thermal chemical vapor deposition (Thermal CVD) technique, a plasma enhanced CVD technique, physical CVD, or an atomic layer deposition technique. If the lower sacrificial layers SL1 and the lower insulating layers ILD1 are formed by one of the deposition techniques listed, the lower sacrificial layers SL1 and the lower insulating layers ILD1 may conformally cover the top surface of the substrate 10, a sidewall of the first mold pattern 20, and a top surface of the first mold pattern 20 in the substantially the same thickness.

In some embodiments, the lower sacrificial layers SL1 may each have the same thickness. In an alternative embodiment, the uppermost and lowermost layers of the lower sacrificial layers SL1 may be formed to be thicker than the layers between the uppermost and the lowermost layers of the lower sacrificial layers SL1. The lower insulating layers ILD1 may each have the same thickness, or some of thicknesses of the lower insulating layers ILD1 may differ from other layers of the lower insulating layers ILD1. Furthermore, the lowermost layer of the lower insulating layers ILD1 may be thinner than the lower sacrificial layers SL1 and the lower insulating layers ILD1 formed above the lowermost layer of the lower insulating layers SL1. The lowermost layer of the lower insulating layers ILD1 may be a silicon oxide layer that may be formed by a thermal oxidation process.

As an example, the lower sacrificial layers SL1 and the lower insulating layers ILD1 may be formed from or may include insulating materials having an etch selectivity with respect to each other. The lower sacrificial layers SL1 may be, for example, silicon layers, silicon oxide layers, silicon carbide layers, silicon germanium layers, silicon oxynitride layers, silicon nitride layers, or a combination thereof. The lower insulating layers ILD1 may be, for example, silicon layers, silicon oxide layers, silicon carbide layers, silicon oxynitride layers, silicon nitride layers, or a combination thereof, although as mentioned, the lower insulating layers ILD1 may be formed from a material that is selected to be different from the lower sacrificial layers SL1. For example, the lower sacrificial layers SL1 may be formed from silicon nitride layers, and the lower insulating layers ILD1 may be formed from low-k dielectric layers. Alternatively, the lower sacrificial layers SL1 may be formed from a conductive material, and the lower insulating layers ILD1 may be formed from an insulating material.

Figure 2B:
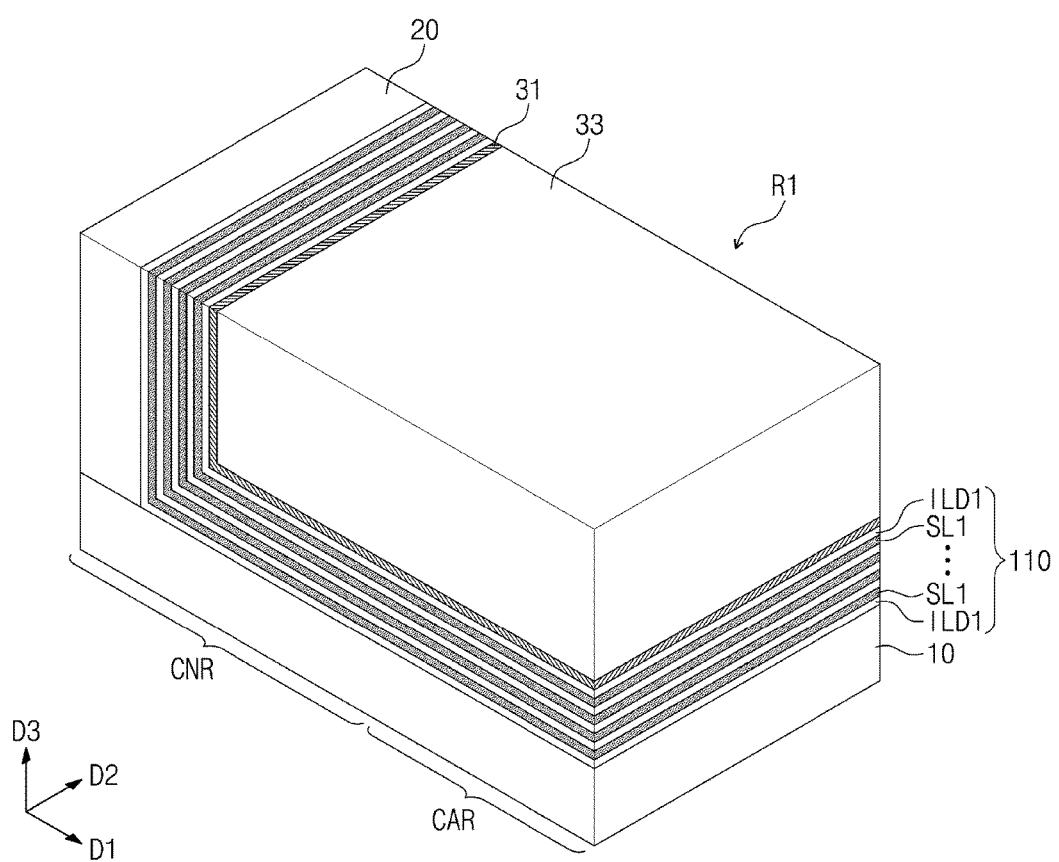

Referring to FIG. 2B, a first planarization process may be performed on the lower layered structure 100 to form a lower stack 110 within the first recess region R1.

The first planarization process may include forming a first insulating planarization layer 33 on the lower layered structure 100 and then performing an etching process on the first insulating planarization layer 33 and the lower layered structure 100 to expose a top surface of the first mold pattern 20. The first insulating planarization layer 33 may contribute to an improved flatness property for the first planarization process. For example, the first insulating planarization layer 33 may be formed from an insulating material having an etch selectivity with respect to the lower sacrificial layers SL1.

In some embodiments, before the first insulating planarization layer 33 is formed, a buffer layer 31 may be formed to conformally cover the lower layered structure 100. The buffer layer 31 may include a material having an etch selectivity with respect to the lower insulating layers ILD1 and the lower sacrificial layers SL1. For example, the buffer layer 31 may be formed from or may include a poly-silicon layer, a silicon carbide layer, a silicon germanium layer, or a combination thereof.

During the first planarization process, the lower sacrificial layers SL1 and the lower insulating layers ILD1 stacked on the first mold pattern 20 may be removed, and thus, the top surface of the first mold pattern 20 may be exposed. Here, the first insulating planarization layer 33 may cover the lower stack 110 within the first recess region R1 that is defined by the first mold pattern 20.

The lower stack 110 may include a horizontal portion that is parallel or substantially parallel to the top surface of the substrate 10 and a sidewall portion that is parallel or substantially parallel to the sidewall of the first mold pattern 20. The sidewall portion of the lower stack 110 may have a top surface that is substantially coplanar with the top surface of the first mold pattern 20. Accordingly, in the sidewall portion of the lower stack 110, the lower sacrificial layers SL1 and the lower insulating layers ILD1 may have top surfaces that are substantially coplanar with the top surface of the first mold pattern 20.

Figure 2C:
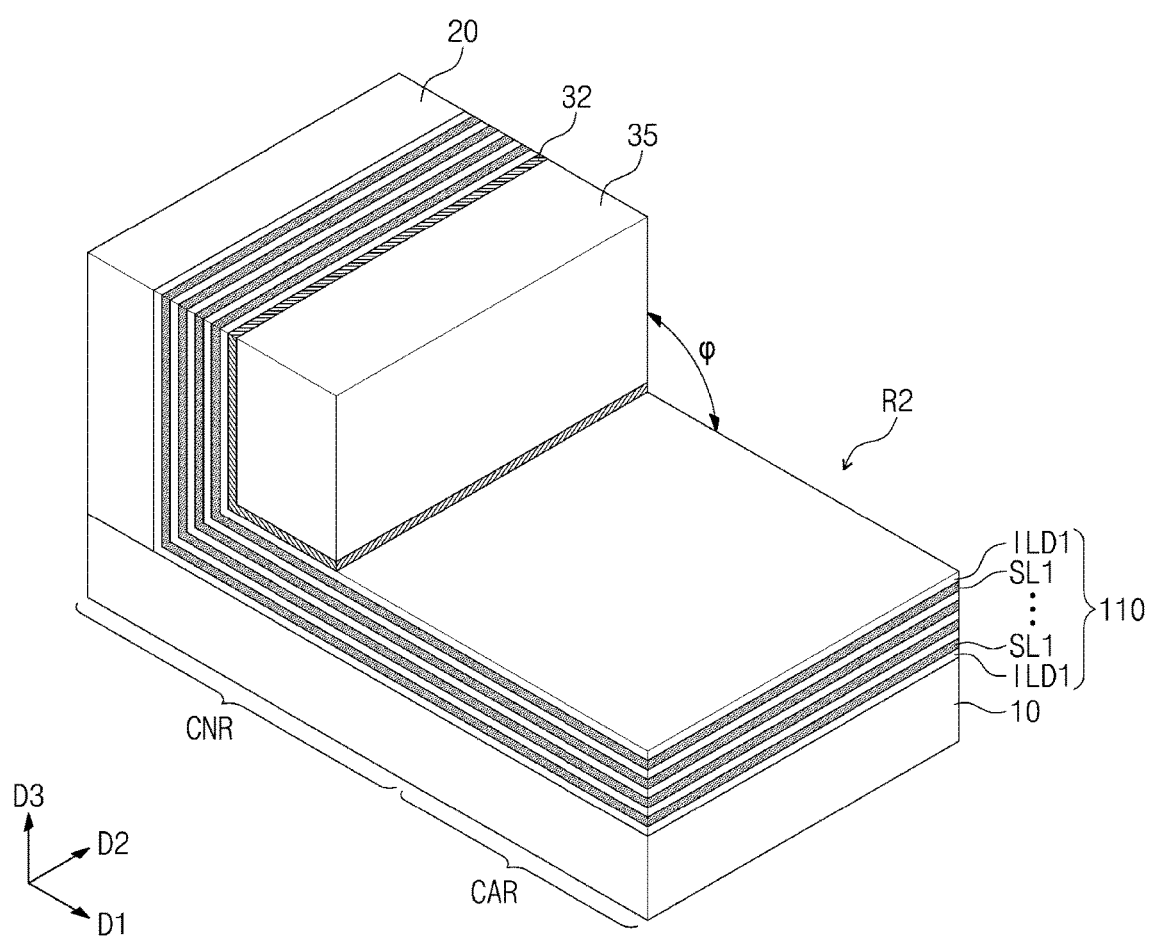

Referring to FIG. 2C, a second mold pattern 35 may be formed on the lower stack 110 to define a second recess region R2. In some embodiments, the second mold pattern 35 may be a portion of the first insulating planarization layer 33.

Forming the second mold pattern 35 may include forming a mask pattern (not shown) that exposes a portion of the first insulating planarization layer 33 that was formed on the cell array region CAR of the substrate 10, and then, anisotropically etching the first insulating planarization layer 33 using the mask pattern as an etch mask to expose a portion of a horizontal portion of the lower stack 110. The buffer layer 31 (FIG. 2B) may be used as an etch-stop layer during the anisotropically etching of the first insulating planarization layer 33. Accordingly, a portion of the buffer layer 31 may be etched to form a buffer pattern 32 between the lower stack 110 and the second mold pattern 35.

In some embodiments, the second recess region R2 of the second mold pattern 35 may be formed to expose a lower insulating layer ILD1 of the lower stack 110 or to expose a lower sacrificial layer SL1 of the lower stack 110. A top surface of the second mold pattern 35 may be at substantially the same level as the top surface of the first mold pattern 20 and a top surface of the sidewall portion of the lower stack 110. In other words, the top surface of the second mold pattern 35 may be substantially coplanar with the top surfaces of the lower sacrificial layers SL1. In certain embodiments, after the etching process of the first insulating planarization layer 33, the second mold pattern 35 may have a sidewall that is at an angle φ with respect to the top surface of the substrate 10. In some embodiments, the sidewall of the second mold pattern 35 may be formed to have an angle φ that may range from about 90 degrees to about 130 degrees with respect to the top surface of the substrate 10.

Figure 2D:
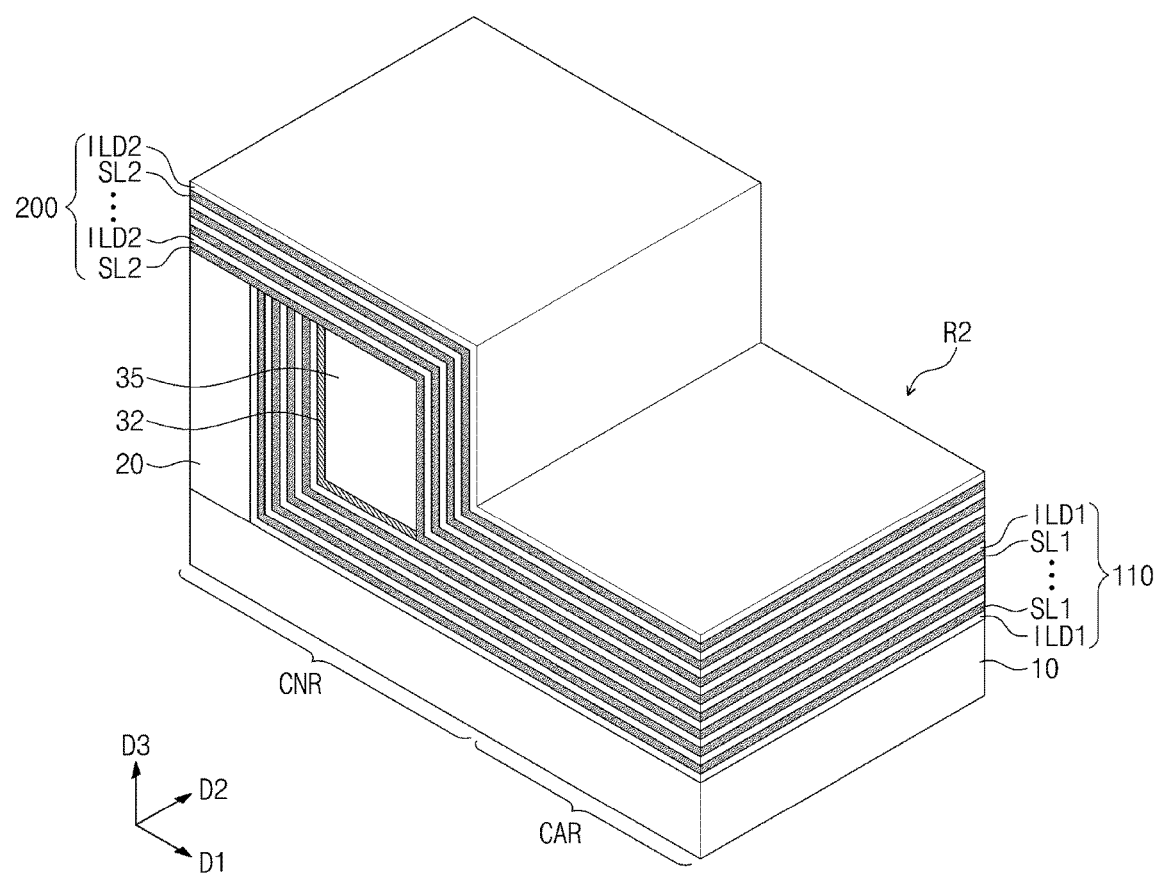

Referring to FIG. 2D, an upper layered structure 200 may be formed in the second recess region R2 of the second mold pattern 35. The upper layered structure 200 may be formed by alternately and repeatedly stacking upper insulating layers ILD2 and upper sacrificial layers SL2 on the substrate 10, the lower layered structure 100, and the second mold pattern 35. The upper insulating layers ILD2 and the upper sacrificial layers SL2 may be formed using at least one deposition technique that is capable of providing an excellent step-coverage property. The upper sacrificial layers SL2 and the upper insulating layers ILD2 may be formed to have substantially the same thicknesses and to cover a top surface of the lower stack 110, a sidewall of the second mold pattern 35, and the top surface of the second mold pattern 35. In some embodiments, the upper sacrificial layers SL2 may have substantially the same thicknesses as the lower sacrificial layers SL1.

In some embodiments, if the second recess region R2 exposes a lower insulating layer ILD1 of the lower stack 110, an upper sacrificial layer SL2 may be formed on the lower insulating layer ILD1 that has been exposed by the second recess region R2. Alternatively, if the second recess region R2 exposes a lower sacrificial layer SL1 of the lower stack 110, an upper insulating layer ILD2 may be formed on the lower sacrificial layer SL1 that has been exposed by the second recess region R2. That is, when the upper layered structure 200 is formed on the lower layered structure 100, the alternating nature of sacrificial layers and insulating layers is maintained across the two layered structures 100 and 200.

In the second recess region R2 and on the top surface of the second mold pattern 35, the upper layered structure 200 may be thinner in the third direction D3 than the second mold pattern 35 in the third direction D3. Additionally, on the cell array region CAR of the substrate 10, the top surface of the upper layered structure 200 may be positioned below a top surface of the second mold pattern 35. In other words, the upper layered structure 200 may have a concave portion with respect to a top surface of the second mold pattern 35.

Figure 2E:
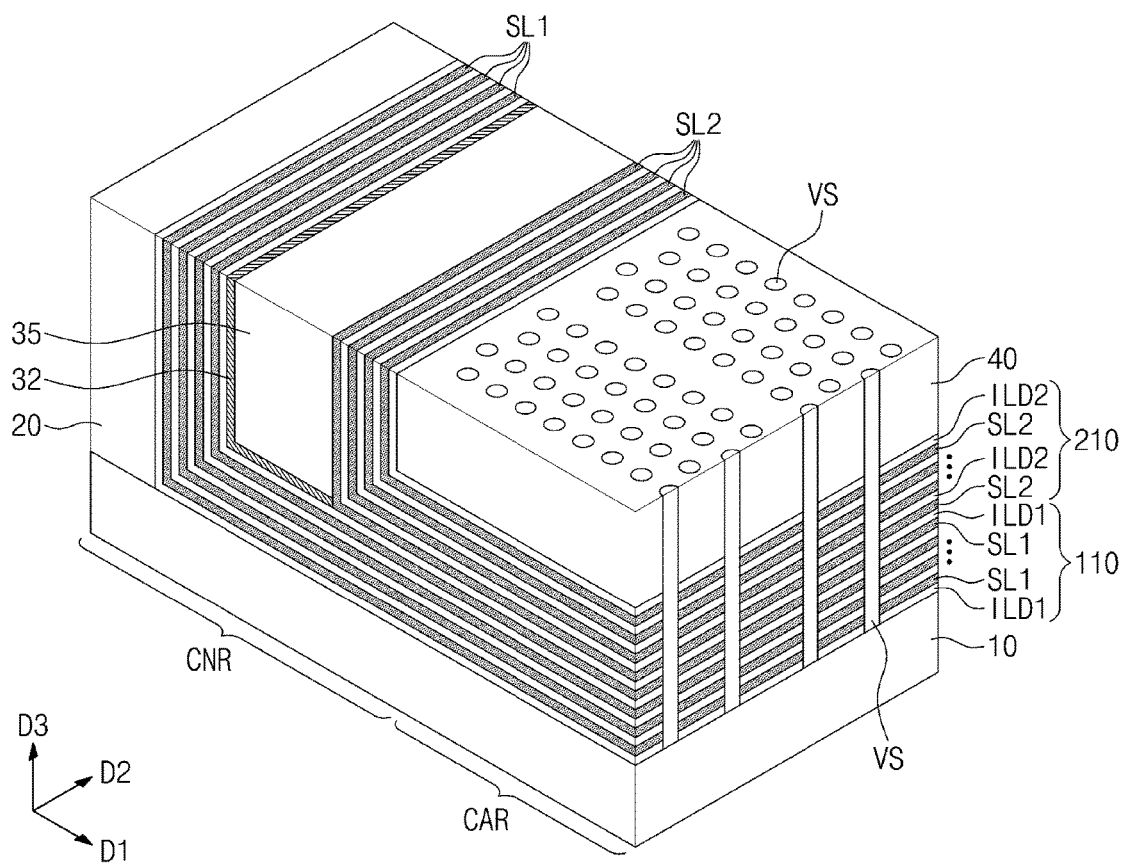

Referring to FIG. 2E, a second planarization process may be performed on the upper layered structure 200 to form an upper stack 210 in the second recess region R2.

The second planarization process may include forming a second insulating planarization layer 40 on the upper layered structure 200 and performing an etching process on the second insulating planarization layer 40 and the upper layered structure 200 to expose the top surface of the second mold pattern 35. The second insulating planarization layer 40 may be formed to completely fill the concave portion formed in the upper layered structure 200. The second insulating planarization layer 40 may be formed from or may include an insulating material having an etch selectivity with respect to the upper sacrificial layers SL2.

The upper stack 210 may include a horizontal portion, which is parallel or substantially parallel to the top surface of the substrate 10, and a sidewall portion, which is parallel or substantially parallel to the sidewall of the second mold pattern 35. As a result of the second planarization process, the sidewall portion of the upper stack 210 may have a top surface that is at substantially the same level as the top surface of the second mold pattern 35. In other words, the top surface of the sidewall portion of the upper stack 210 may be substantially coplanar with the top surface of the second mold pattern 35.

The top surface of the sidewall portion of the upper stack 210 may be positioned at substantially the same level as the top surface of the sidewall portion of the lower stack 110. That is, the sidewall portion of the upper sacrificial layers SL2 and the sidewall portion of the lower sacrificial layers SL1 may be at substantially the same level. Furthermore, the sidewall portion of the upper stack 210 may be horizontally spaced apart from the sidewall portion of the lower stack 110 by the second mold pattern 35.

Thereafter, vertical structures VS may be formed on the cell array region CAR to penetrate the lower and upper stacks 110 and 210. The vertical structures VS may be formed from or may include a semiconductor, a conductive material or a combination thereof.

Forming the vertical structures VS may include forming openings to penetrate both of the lower and upper stacks 110 and 210, and forming semiconductor patterns in the respective openings. If viewed in a plan view, the vertical structures VS may be arranged in a linear manner or, alternatively, a zigzag manner. Furthermore, before the semiconductor patterns are formed in the openings, a vertical insulating layer (not shown) may be formed in the openings. The vertical insulating layer may include a single layer or a plurality of layers. In some embodiments, the vertical insulating layer may be used as a part of a data-storing layer of a charge-trap FLASH memory transistor. The data-storing layer will be described in more detail in connection with FIGS. 15A to 15D.

Figure 2F:
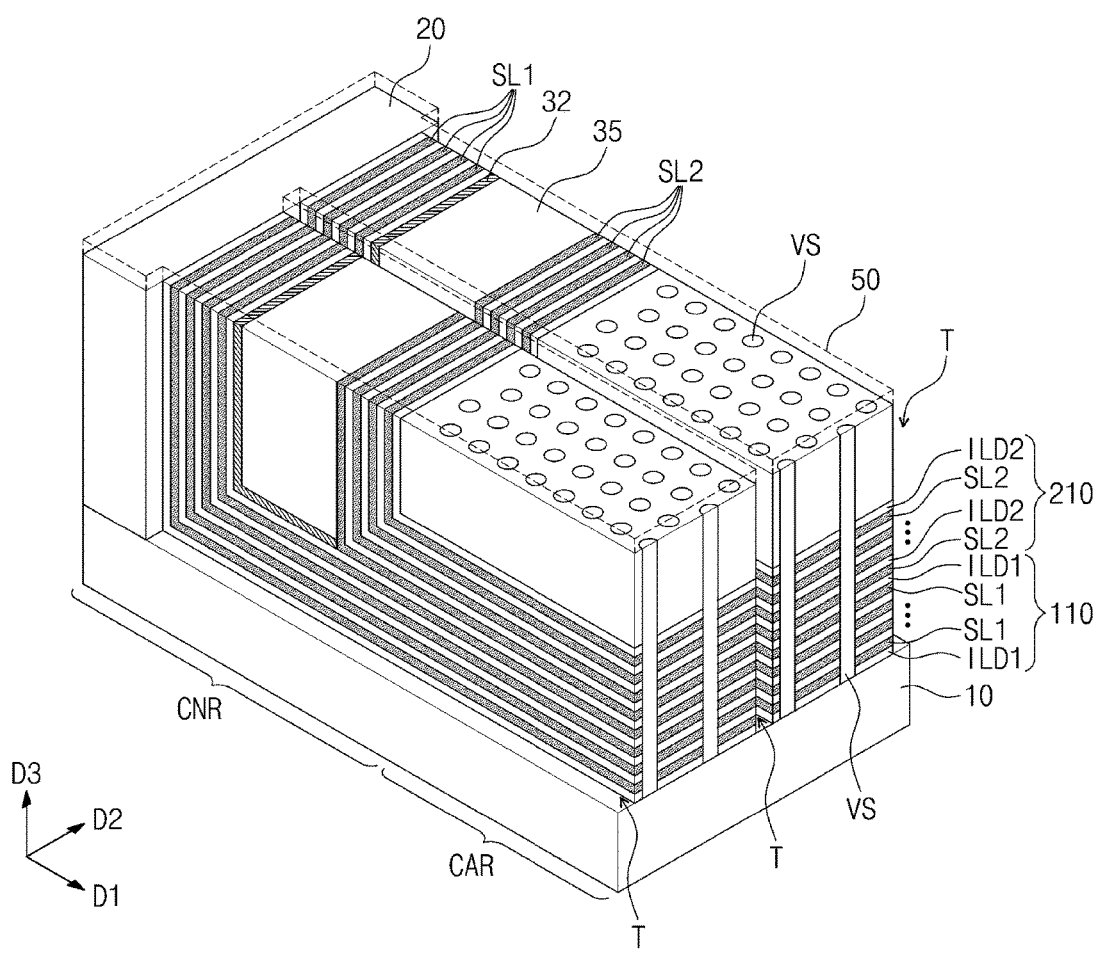

Referring to FIG. 2F, the lower and upper stacks 110 and 210 may be patterned to form trenches T that extend in the first direction D1. The trenches T may also extend in the third direction D3 through the upper and lower stacks 110 and 210, the second mold pattern 35, and the second insulating planarization layer 40 to the top surface or about to the top surface of the substrate 10. Additionally, the trenches T may be spaced apart from each other in the second direction D2.

In greater detail, after the vertical structures VS have been formed, a capping layer 50 (indicated in phantom in FIG. 2F) may be formed on the lower and upper stacks 110 and 210. The capping layer 50 may be used as a hard mask during an etching process that forms the trenches T.

The trenches T may be spaced apart from the vertical structures VS in the second direction D2 and may expose side surfaces of the horizontal and sidewall portions of the lower and upper stacks 110 and 210. For example, the trenches T may be formed to expose side surfaces of the lower and upper sacrificial layers SL1 and SL2 in the cell array region CAR and the connection region CNR of the substrate 10.

Figure 2G:
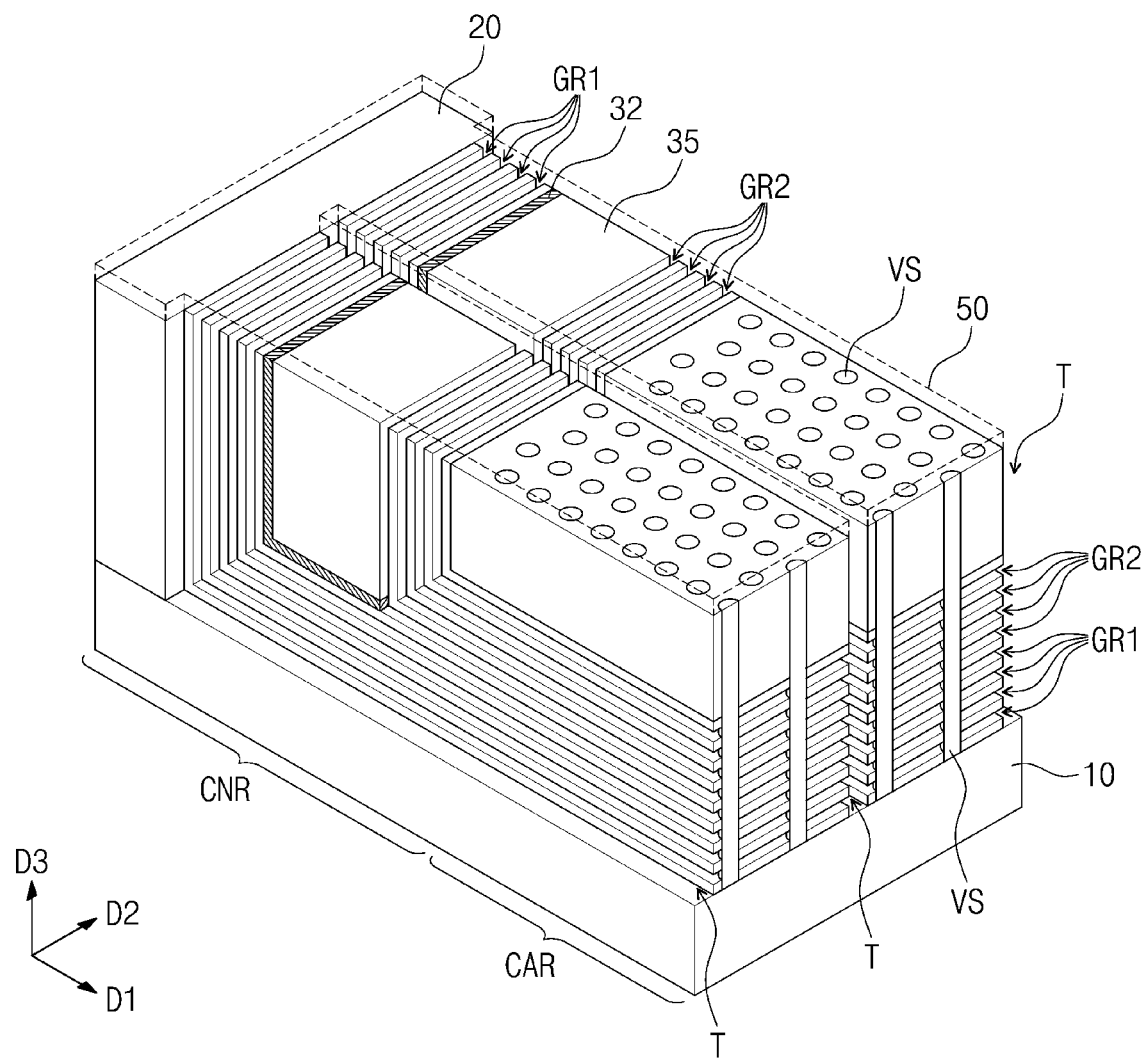

Referring to FIG. 2G, the lower and upper sacrificial layers SL1 and SL2 that have been exposed by the trenches T may be removed to form lower gate regions GR1 between the lower insulating layers ILD1 and to form upper gate regions GR2 between the upper insulating layers ILD2.

The lower and upper gate regions GR1 and GR2 may be formed by isotropically etching the lower and upper sacrificial layers SL1 and SL2 using an etching solution that has an etch selectivity with respect to the lower and upper insulating layers ILD1 and ILD2, the vertical structures VS, and the substrate 10. In some embodiments, an isotropic-etching process may be performed to completely remove the lower and upper sacrificial layers SL1 and SL2. For example, in the case in which the lower and upper sacrificial layers SL1 and SL2 are formed from silicon nitride and the lower and upper insulating layers ILD1 and ILD2 are formed from silicon oxide, an isotropic-etching process may be performed using an etching solution containing phosphoric acid. Furthermore, the vertical insulating layer (not shown) enclosing the vertical structures VS may be used as an etch-stop layer if the lower and upper gate regions GR1 and GR2 are formed by an isotropic-etching process.

On the cell array region CAR of the substrate 10, the lower and upper gate regions GR1 and GR2 may extend horizontally from the trenches T and may be respectively positioned between the lower and upper insulating layers ILD1 and ILD2. For example, the lower and upper gate regions GR1 and GR2 may be formed to partially expose a side surface of the vertical insulating layer or the vertical structure VS at different levels.

In some embodiments, the lower and upper gate regions GR1 and GR2 may extend from the cell array region CAR to the connection region CNR and may be empty spaces from which the lower and upper sacrificial layers SL1 and SL2 are removed. For example, each of the lower and upper gate regions GR1 and GR2 may include horizontal regions, which are parallel or substantially parallel to the top surface of the substrate 10, and sidewall regions, which are parallel or substantially parallel to the sidewalls of the first and second mold patterns 20 and 35.

Figure 2H:
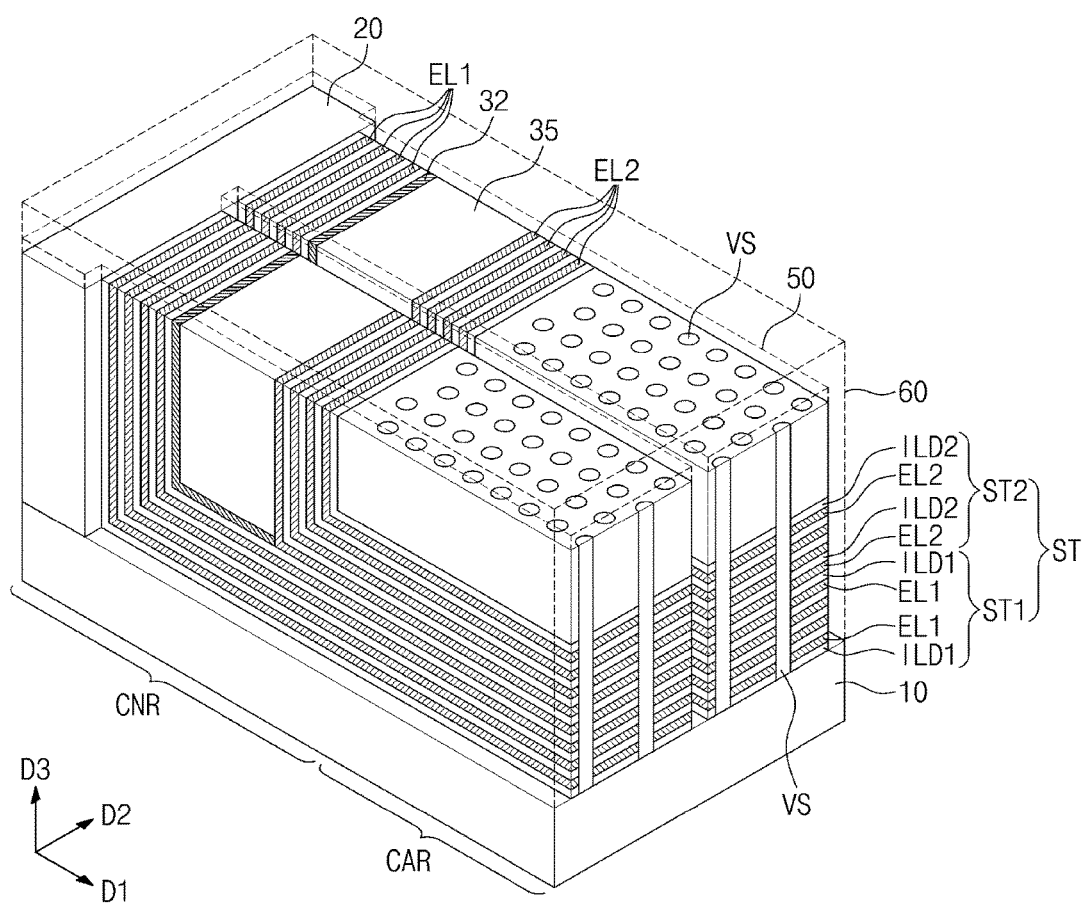

Referring to FIG. 2H, lower electrodes EL1 may be formed in the lower gate regions GR1, and upper electrodes EL2 may be formed in the upper gate regions GR2. The lower and upper electrodes EL1 and EL2 may be formed at substantially the same time by the same process, and may be formed from the same material.

In some embodiments, forming the lower and upper electrodes EL1 and EL2 may include depositing a gate conductive layer to fill the lower and upper gate regions and then removing a portion of the gate conductive layer from the trenches T to respectively form local lower and upper electrodes EL1 and EL2 in the lower and upper gate regions GR1 and GR2. Here, the gate conductive layer may be formed to partially or completely fill the trenches T. In some embodiments, the formation of the gate conductive layer may include sequentially depositing a barrier metal layer and a metal layer. The barrier metal layer may be formed from or may include, for example, one or more metal nitride materials (e.g., TiN, TaN, and/or WN). The metal layer may be formed from or may include, for example, one or more metallic materials (e.g., W, Al, Ti, Ta, Co, or Cu). The removal of the portion of the gate conductive layer may be performed using an anisotropic-etching process or an isotropic-etching process.

In certain embodiments, before the lower and upper electrodes EL1 and EL2 have been formed, a horizontal insulating layer (not shown) may be formed to conformally cover inner surfaces of the lower and upper gate regions GR1 and GR2. In the case of a charge-trap FLASH memory device, the horizontal insulating layer may serve as a part of a data-storing layer. The horizontal insulating layer may also be used as an etch-stop layer during a process of etching a gate conductive layer.

As a result of the formation of the lower and upper electrodes EL1 and EL2, an electrode structure ST may be formed. The electrode structure ST may extend from the cell array region CAR to the connection region CNR in the first direction D1 parallel or substantially parallel to the top surface of the substrate 10. In certain embodiments, on the connection region CNR, the electrode structure ST may be inclined with respect to the top surface of the substrate 10. Since the shapes of the lower and upper electrodes EL1 and EL2 are defined by the lower and upper gate regions, each of the lower and upper electrodes EL1 and EL2 may include an electrode portion and a vertical pad portion. The lower and upper electrodes EL1 and EL2 may be parallel or substantially parallel to the top surface of the substrate 10, and extends from the cell array region CAR to the connection region CNR in the first direction D1. The vertical pad portion PAD may be parallel or substantially parallel to the sidewall of the mold pattern 35.

Figure 2I:
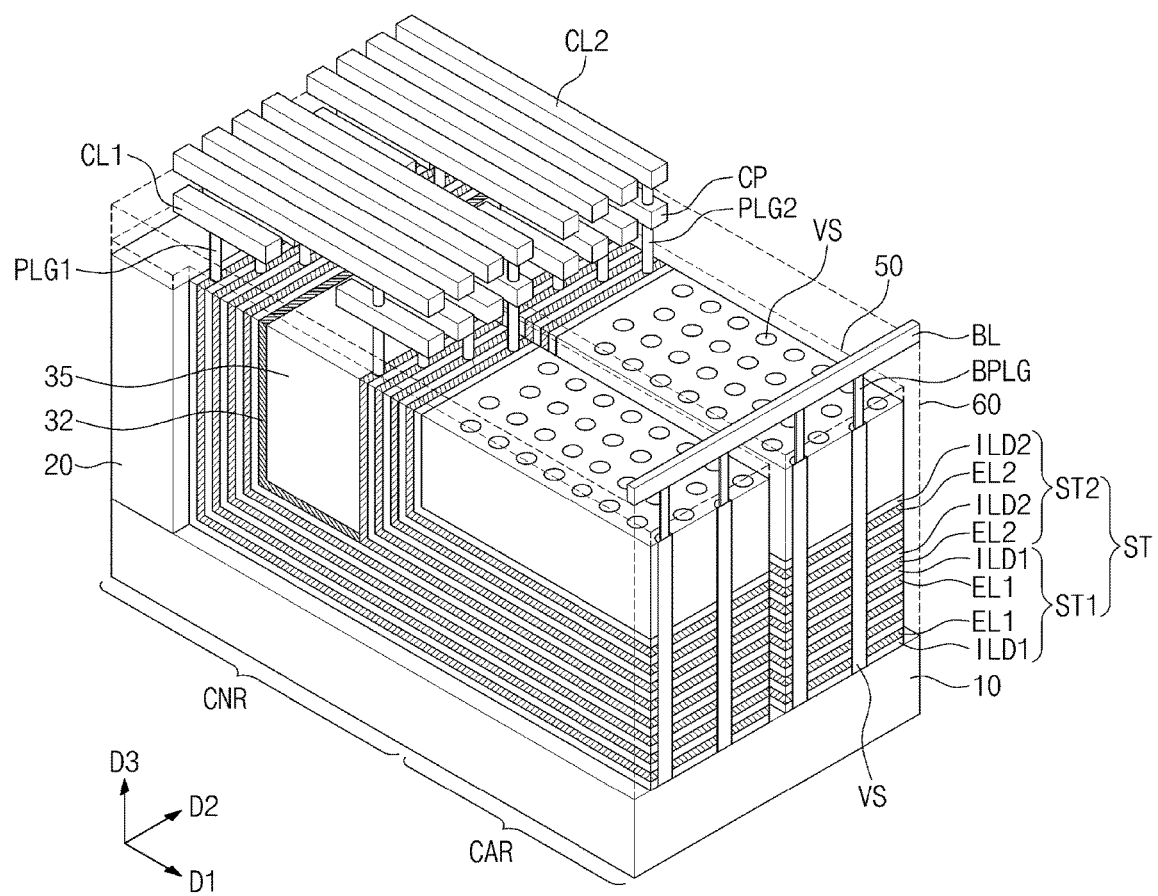

In further detail, as depicted in FIGS. 2I and 3, the electrode structure ST may include a lower electrode structure ST1 having a plurality of the lower electrodes EL1 that are sequentially stacked on the substrate 10, and an upper electrode structure ST2 having a plurality of the upper electrodes EL2 that are sequentially stacked on the lower electrode structure ST1. Although the number of the lower electrodes EL1 is shown in the figures to be the same as that of the upper electrodes EL2, it should be understood that the inventive concept is not so limited and the lower electrodes EL1 and the upper electrodes EL2 may each have a different number of electrodes. That is, if necessary, the numbers of the lower and upper electrodes EL1 and EL2 may be different from each other.

Each of the lower electrodes EL1 and the upper electrodes EL2 may include an electrode portion EP and a vertical pad portion PAD. An electrode portion EP may be is parallel or substantially parallel to the top surface of the substrate 10. A vertical pad portion PAD may be at an angle with respect to the top surface of the substrate 10.

As measured in the first direction D1, the electrode portions EP of the lower and upper electrodes EL1 and EL2 may have a length that decreases with increasing distance from the substrate 10. In some embodiments, the electrode portions EP of the lower and upper electrodes EL1 and EL2 may have holes through which the vertical structures VS described in connection with FIG. 2E penetrate.

The vertical pad portions PAD of the lower and upper electrodes EL1 and EL2 may have respective top surfaces that are at substantially the same level from the substrate 10. The top surfaces of the vertical pad portions PAD of the lower and upper electrodes EL1 and EL2 may be positioned at a higher level than the electrode portion EP of the uppermost electrode of the upper electrodes EL2. In the lower and upper electrodes EL1 and EL2, a length of the vertical pad portions PAD in a third direction D3 may decrease with increasing distance of the corresponding electrode portions EP of the lower and upper electrodes EL1 and EL2 from the top surface of the substrate 10.

The vertical pad portions PAD of the lower and upper electrodes EL1 and EL2 may have the same width or substantially the same width in the second direction D2. A width of the vertical pad portions PAD of the lower and upper electrodes EL1 and EL2 in the second direction D2 may be substantially equal to the widths of the electrode portions EP in the second direction D2.

On the cell array region CAR of the substrate 10, the electrode portions EP of the lower and upper electrodes EL1 and EL2 may be vertically spaced apart from each other by a first vertical distance S1. On the connection region CNR of the substrate 10, the vertical pad portions PAD of the lower electrodes EL1 may be horizontally spaced apart from each other by a first horizontal distance S2. Also on the connection region CNR of the substrate 10, the vertical pad portions PAD of the upper electrodes EL2 may be horizontally spaced apart from each other by the first horizontal distance S2. In some embodiments, the first horizontal distance S2 may be substantially equal to the first vertical distance S1, and in certain embodiments, the first vertical distance S1 may be less than the first horizontal distance S2.

In some embodiments, the vertical pad portions PAD of an adjacent pair of the lower electrodes EL1 and the upper electrodes EL2 may be horizontally spaced apart from each other by a second horizontal distance S3, which is greater than the first horizontal distance S2. In the adjacent pair of the lower electrodes EL1 and the upper electrodes EL2, the electrode portions EP may be vertically spaced apart from each other by the first vertical distance S1, whereas the vertical pad portions PAD of the adjacent pair of lower electrodes EL1 and the upper electrodes EL2 may be horizontally spaced apart from each other by the second horizontal distance S3. In this case, the second horizontal distance S3 may be greater than the first vertical distance S1.

After the electrode structure ST has been formed, an insulating isolation layer 60 (shown in phantom in FIGS. 2H and 2I) may be formed to fill the trenches T. Thereafter, an interconnection structure connected to the electrode structure ST may be formed on the connection region CNR of the substrate 10. The interconnection structure may be used to electrically connect the memory cells of a memory cell array (that will be formed) to a row decoder.

In some embodiments, first contact plugs PLG1 may be respectively coupled to the top surfaces of the vertical pad portions PAD of the lower electrodes EL1. The first contact plugs PLG1 may have the same vertical length, and, if viewed in a plan view, the first contact plugs may be arranged in a diagonal direction with respect to the first direction D1 and with respect to the second direction D2. First conductive lines CL1 that extend in the first direction D1 may respectively be coupled to the first contact plugs PLG1.

Second contact plugs PLG2 may be respectively coupled to the top surfaces of the vertical pad portions PAD of the upper electrodes EL2. The second contact plugs PLG2 may have the same vertical length, and, if viewed in a plan view, the second contact plugs PLG2 may be arranged in a diagonal direction with respect to both of the first and second directions D1 and D2.

Second conductive lines CL2 that extend in the first direction D1 may be respectively coupled to the upper electrodes EL2. The second conductive lines CL2 may be formed at a level that is different from the level of the first conductive lines CL1, and may be respectively coupled to the second contact plugs PLG2 through conductive patterns CP.

According to some embodiments of the inventive concept, the connection structure of the interconnection structure connected to the electrode structure ST may vary depending upon design considerations.

Additionally, bit lines BL may be formed on the cell array region CAR of the substrate 10 and may be electrically connected to the vertical structures VS through bit line contact plugs BPLG. The bit lines BL may extend in the cell array region CAR in the second direction D2 and may cross the lower and upper electrodes EL1 and EL2. Each of the bit lines BL may be electrically connected to the vertical structures VS that are aligned in the second direction D2.

Figure 4A:
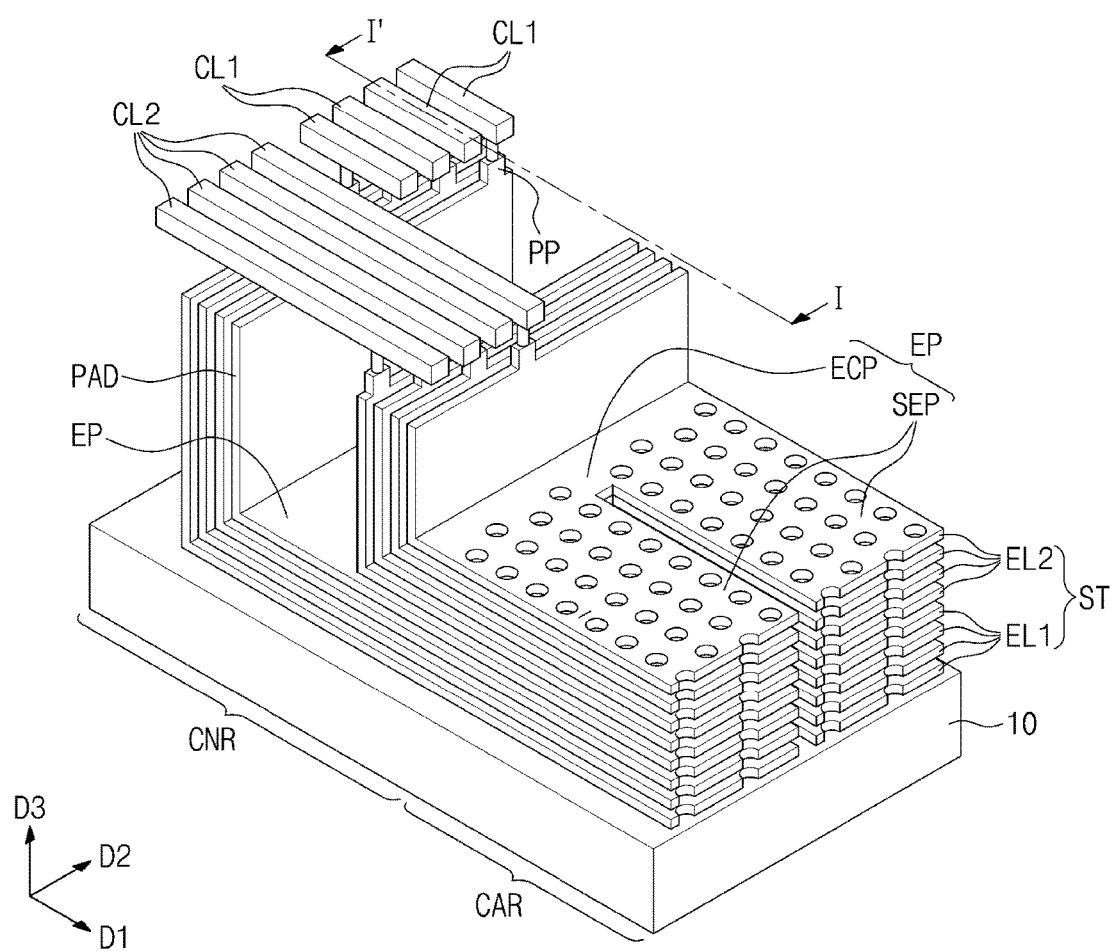
FIG. 4A is a perspective view depicting a three-dimensional semiconductor device according to some embodiments of the inventive concept.
Figure 4B:
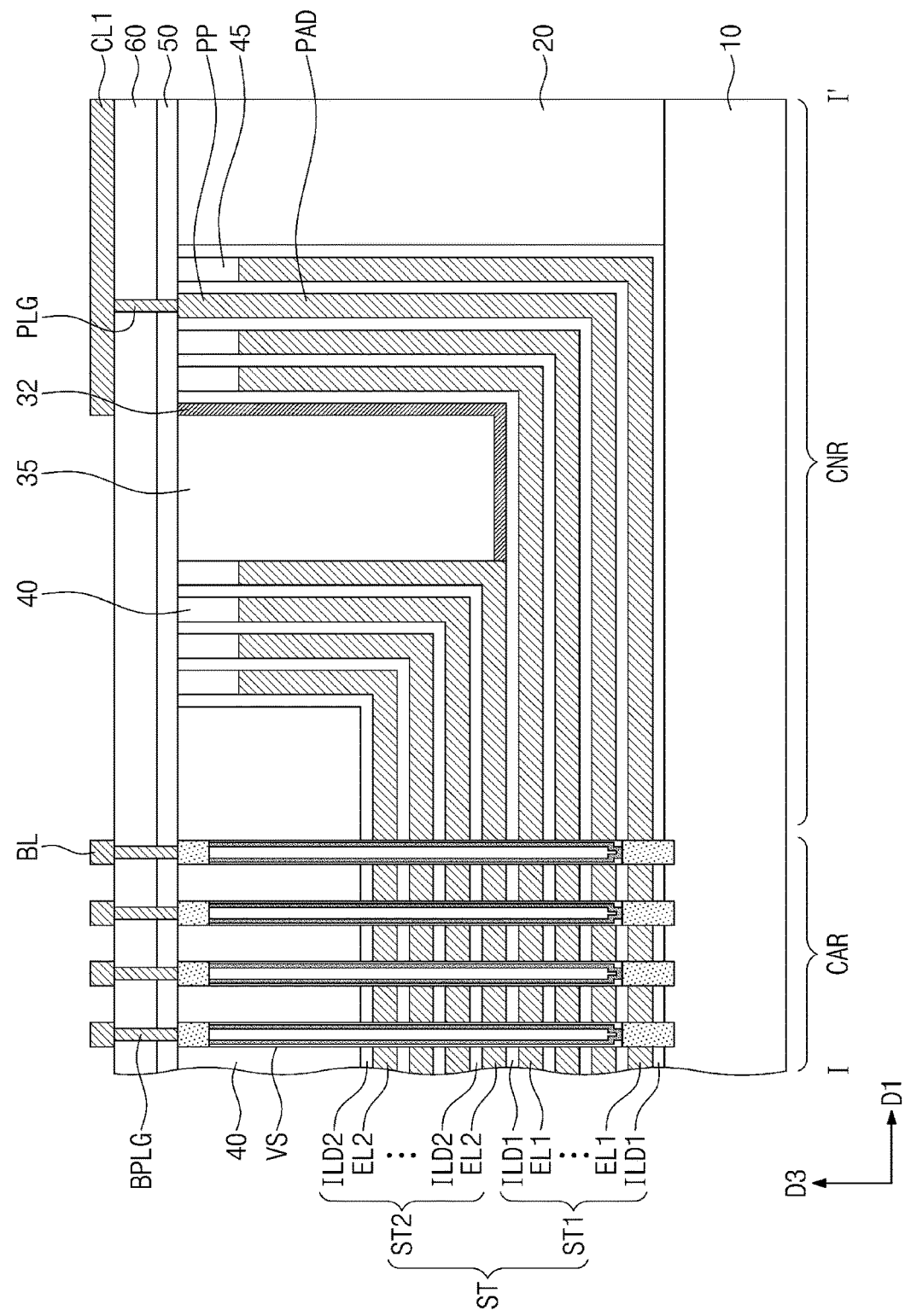
FIG. 4B depicts a sectional view taken along line I-I' of FIG. 4A.

FIG. 4A is a perspective view schematically depicting a three-dimensional semiconductor device according to some embodiments of the inventive concept, and FIG. 4B depicts a sectional view taken along line I-I' of FIG. 4A. For ease of description, an element or component that has been previously described in connection with FIG. 3 may be identified by a similar or an identical reference number without repeating a description of the element or component.

Referring to FIGS. 4A and 4B, an electrode structure ST that includes the lower and upper electrode structures ST1 and ST2 may be provided on the substrate 10. The lower electrode structure ST1 may include a plurality of the lower electrodes EL1 that are sequentially stacked on the substrate 10, and the upper electrode structure ST2 may include a plurality of the upper electrodes EL2 that are sequentially stacked on the lower electrode structure ST1.

In some embodiments, each of the lower and upper electrode structures ST1 and ST2 may include a sidewall portion that is inclined with respect to the top surface of the substrate 10. On the connection region CNR of the substrate 10, the sidewall portion of the lower electrode structure ST1 may be horizontally spaced apart from the sidewall portion of the upper electrode structure ST2. That is, for an adjacent pair of the lower electrodes EL1 and the upper electrodes EL2, a horizontal distance between the respective vertical pad portions PAD may be greater than a vertical distance between the electrode portions EP. The horizontal distance between the vertical pad portions PAD in the adjacent pair of the lower electrodes EL1 and the upper electrodes EL2 may be greater than a horizontal distance between the vertical pad portions PAD in an adjacent pair of the lower electrodes EL1 or the upper electrodes EL2.

In some embodiments, each of the electrode portions EP of the lower and upper electrodes EL1 and EL2 may extend in the first direction D1, but may include a plurality of sub-electrode portions SEP and an electrode-connecting portion ECP. The plurality of sub-electrode portions SEP may be horizontally spaced apart from each other in the second direction D2, and the electrode-connecting portion ECP may be configured to horizontally connect the sub-electrode portions SEP to each other. That is, each of the electrode portions EP of the lower and upper electrodes EL1 and EL2 may include a plurality of sub-electrode portions SEP and an electrode-connecting portion ECP. The plurality of sub-electrode portions SEP may be horizontally spaced apart from each in the second direction, whereas the electrode-connecting portion ECP may be configured to horizontally connect the sub-electrode portions SEP to each other. The vertical pad portions PAD of the lower and upper electrodes EL1 and EL2 may extend in the third direction D3 from the electrode-connecting portions ECP. Here, the vertical pad portions PAD of the lower and upper electrodes EL1 and EL2 may have the same width in the second direction D2. The widths in the second direction D2 of the vertical pad portions PAD may be substantially the same as the widths in the second direction D2 of all of the electrode portions EP of a lower electrode EL1 or an upper electrode EL2. As measured in the second direction D2, the width of the vertical pad portions PAD may, for example, be substantially the same as the width of the electrode-connecting portions ECP. In some embodiments, top surfaces of the vertical pad portions PAD may be positioned at a lower level than the top surfaces of the first and second mold patterns 20 and 35.

Additionally, each of the lower and upper electrodes EL1 and EL2 may include a protruding portion PP that vertically protrudes from the vertical pad portion PAD away from the substrate 10. The protruding portions PP of the lower and upper electrodes EL1 and EL2 may be positioned at the same level from the top surface of the substrate 10. The protruding portions PP of the lower and upper electrodes EL1 and EL2 may have substantially the same height in the third direction D3 from the substrate 10.

As an example, the top surfaces of the protruding portions PP may be substantially coplanar with the top surfaces of the first and second mold patterns 20 and 35. Furthermore, if viewed in a plan view, the protruding portions PP of the lower and upper electrodes EL1 and EL2 may be arranged in a diagonal direction with respect to both of the first and second directions D1 and D2.

Insulating gap-fill patterns 45 (FIG. 4B) may be provided on the vertical pad portions PAD of the lower and upper electrodes EL1 and EL2. The top surfaces of the insulating gap-fill patterns 45 may be substantially coplanar with the top surfaces of the protruding portions PP. In some embodiments, the insulating gap-fill patterns 45 may fill gap regions between the lower insulating layers ILD1 and between the upper insulating layers ILD2, and may be in contact with sidewalls of the protruding portions PP.

In some embodiments, the first conductive lines CL1 that extend in the first direction D1 may be respectively coupled to the protruding portions PP of the lower electrodes EL1 through the contact plugs PLG1. The second conductive lines CL2 may be respectively coupled to the protruding portions PP of the upper electrodes EL2 through the contact plugs PLG2. In the case in which the protruding portions PP of the lower and upper electrodes EL1 and EL2 are arranged in a diagonal direction with respect to the first direction D1, the first and second conductive lines CL1 and CL2 may be directly connected to the protruding portions PP of the lower and upper electrodes EL1 and EL2 without using the contact plugs PLG1 and PLG2.

Figure 5A:
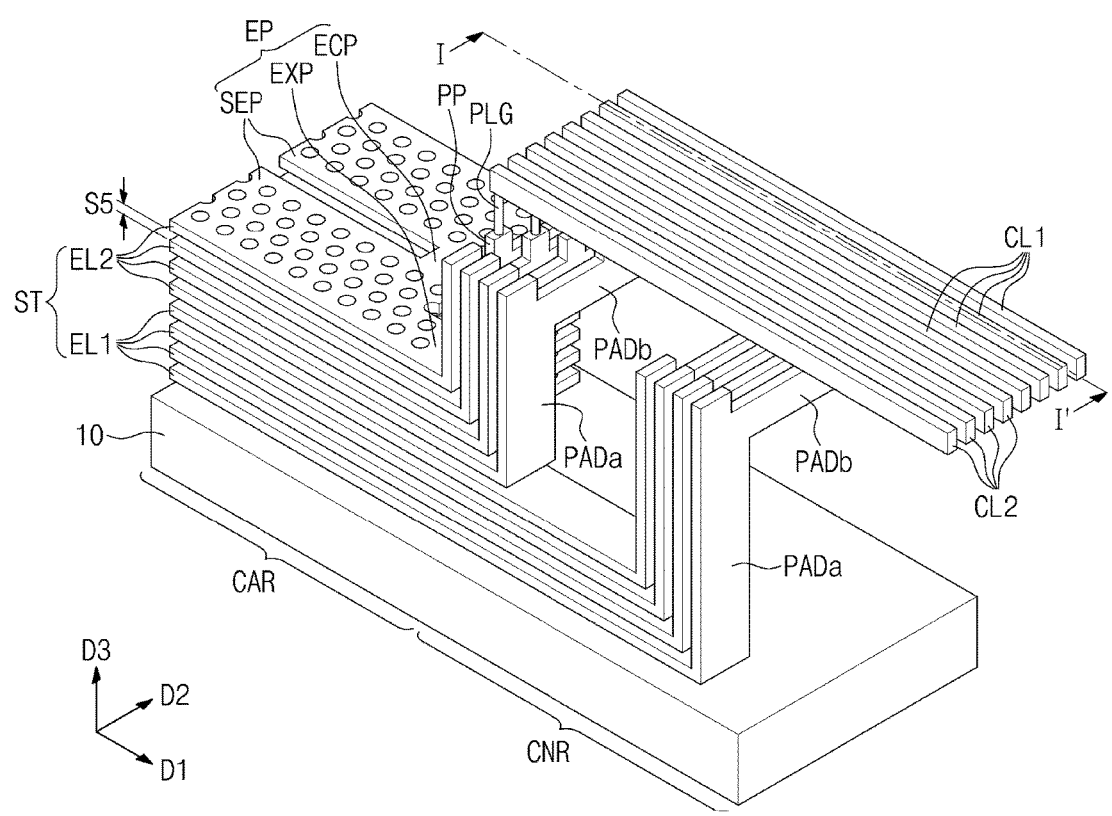
FIG. 5A is a perspective view depicting a three-dimensional semiconductor device according to some embodiments of the inventive concept.
Figure 5B:
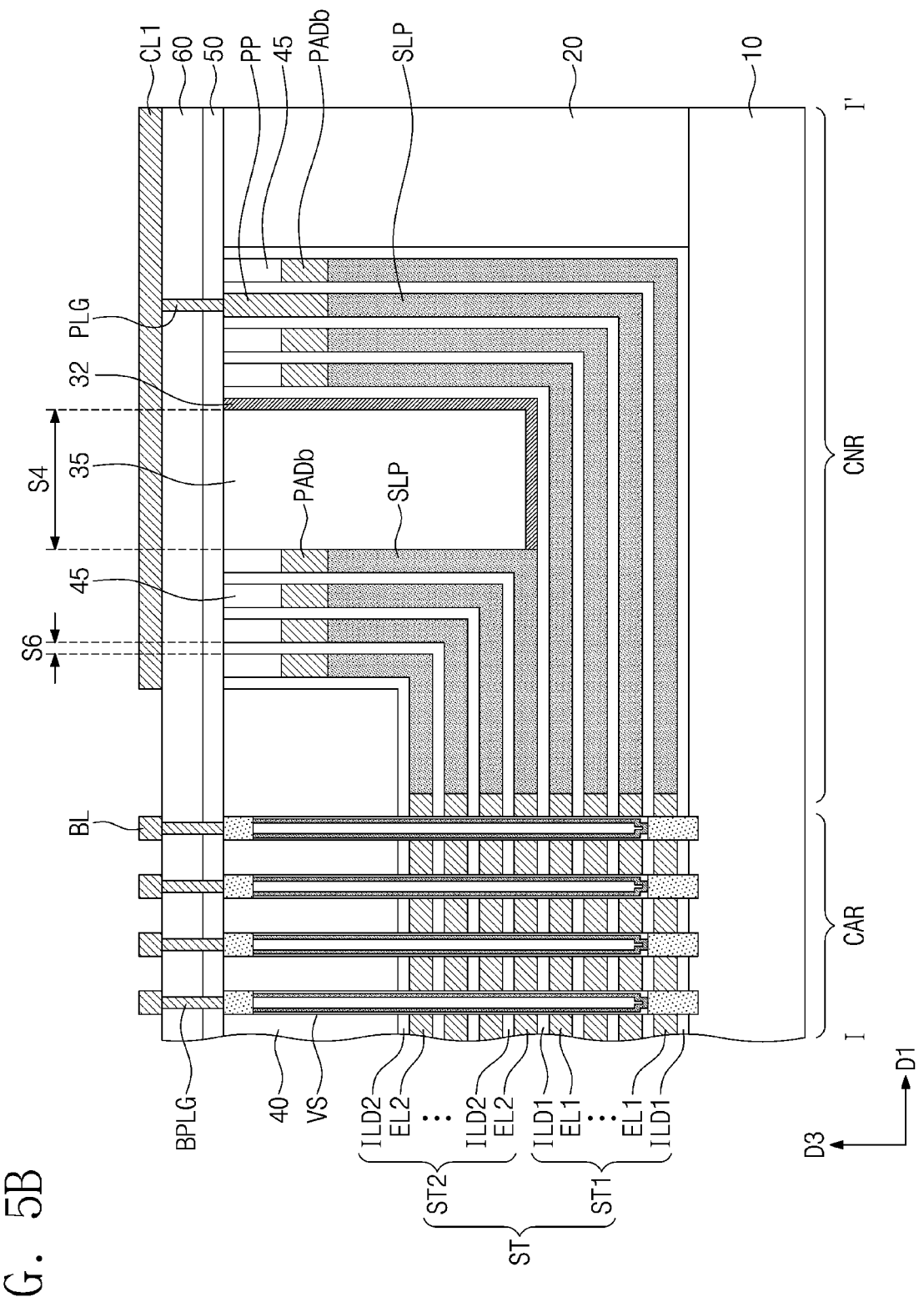
FIG. 5B depicts a sectional view taken along line I-I' of FIG. 5A.

FIG. 5A is a perspective view depicting a three-dimensional semiconductor device according to some embodiments of the inventive concept, and FIG. 5B depicts a sectional view taken along line I-I' of FIG. 5A. For ease of description, an element or a component that has been previously described in connection with FIG. 3 may be identified by a similar or an identical reference number without repeating a description of the element or component.

Referring to FIGS. 5A and 5B, an electrode structure ST may be provided on the substrate 10 in the cell array region CAR and in the connection region CNR. In some embodiments, the electrode structure ST may include a lower electrode structure ST1 having a plurality of the lower electrodes EL1 that are sequentially stacked on the substrate 10 and an upper electrode structure ST2 having a plurality of the upper electrodes EL2 that are sequentially stacked on the lower electrode structure ST1.

In some embodiments, each of the lower and upper electrodes EL1 and EL2 may include an electrode portion EP, a vertical pad portion PADa, a horizontal pad portion PADb, and a protruding portion PP. The electrode portion EP may be provided on the cell array region CAR of the substrate 10 and may extend in the first direction D1 and may be parallel or substantially parallel to the top surface of the substrate 10. The vertical pad portion PADa may be provided on the connection region CNR of the substrate 10, and may extend in the third direction D3 and may be inclined with respect to the top surface of the substrate 10. The horizontal pad portion PADb may extend from a portion of the vertical pad portion PADa in the second direction D2 that is parallel or substantially parallel to the top surface of the substrate 10 and that is perpendicular or substantially perpendicular to the first direction D1. The protruding portion PP may protrude from a portion of the horizontal pad portion PADb in the third direction D3.

In some embodiments, the second mold pattern 35 may be provided between the sidewall portion of the lower electrode structure ST1 and the sidewall portion of the upper electrode structure ST2. Accordingly, in an adjacent pair of the lower and upper electrodes EL1 and EL2, a horizontal distance S4 between the vertical pad portions PADa may be greater than a vertical distance S5 between the electrode portions EP. The horizontal distance S4 between the vertical pad portions PADa in the adjacent pair of the lower and upper electrodes EL1 and EL2 may be greater than a horizontal distance S6 between the vertical pad portions PADa within the lower electrodes EL1 or within the upper electrodes EL2. In adjacent electrodes of the lower and upper electrodes EL1 and EL2, a horizontal distance S6 between the vertical pad portions PADa may be substantially equal to a horizontal distance between the horizontal pad portions PADb.

Each of the electrode portions EP of the lower and upper electrodes EL1 and EL2 may include sub-electrode portions SEP, electrode-connecting portions ECP, and extended portions EXP. The sub-electrode portions EP may be spaced apart from each other in the second direction D2 and extend in the first direction D1. The electrode connecting portion ECP may be provided on the connection region CNR to connect the sub-electrode portions SEP to each other. The extended portion EXP may extend from a portion of the electrode-connecting portion ECP in the first direction D1. In an embodiment, as measured in the second direction D2, a width of the extended portion EXP may be greater than a width of the sub-electrode portion SEP. The sub-electrode portions SEP and the electrode-connecting portions ECP of the lower and upper electrodes EL1 and EL2 may overlap each other, if viewed in a plan view, and the extended portions EXP of the lower and upper electrodes EL1 and EL2 may have a length that decreases in the first direction D1 as a height above the substrate 10 increases.

In some embodiments, a width of the vertical pad portion PADa as measured in the second direction D2 may be substantially equal to a width of the extended portion EXP of the electrode portion EP. As an example, the vertical pad portions PADa of the lower and upper electrodes EL1 and EL2 may have substantially the same width as measured in the second direction D2. The horizontal pad portions PADb of the lower and upper electrodes EL1 and EL2 may have a width that is different from the width of the vertical pad portions PADa as measured in the second direction D2. For example, the width of the horizontal pad portions PADb in the second direction D2 may increase or decrease with increasing distance of the electrode portions EP of the lower and upper electrodes EL1 and EL2 from the substrate 10. The protruding portions PP of the electrodes of the lower and upper electrodes EL1 and EL2 may be respectively provided at ends of the horizontal pad portions PADb. Accordingly, if viewed in a plan view, the protruding portions PP of the electrodes of the lower and upper electrodes EL1 and EL2 may be arranged in a direction that is diagonal to both of the first and second directions D1 and D2.

The insulating gap-fill patterns 45 may be provided on the vertical pad portions PAD of the lower and upper electrodes EL1 and EL2, and may have top surfaces that are substantially coplanar with the top surfaces of the protruding portions PP. In some embodiments, the insulating gap-fill patterns 45 may be provided to fill gap regions between the lower insulating layers ILD1 and between the upper insulating layers ILD2, and may be in contact with sidewalls of the protruding portions PP.

Furthermore, the electrode structure ST may include sacrificial patterns SLP that are positioned at the same level as the lower and upper electrodes EL1 and EL2. The sacrificial patterns SLP may be portions of the lower and upper sacrificial layers SL1 and SL2 that have been described in connection with FIGS. 2A to 2I. The sacrificial patterns SLP may be formed to have an "L-shaped" section, on the connection region CNR of the substrate 10. In an embodiment, the sacrificial patterns SLP may be in contact with bottom surfaces of the horizontal pad portions PADb of the lower and upper electrodes EL1 and EL2.

Figure 6A:
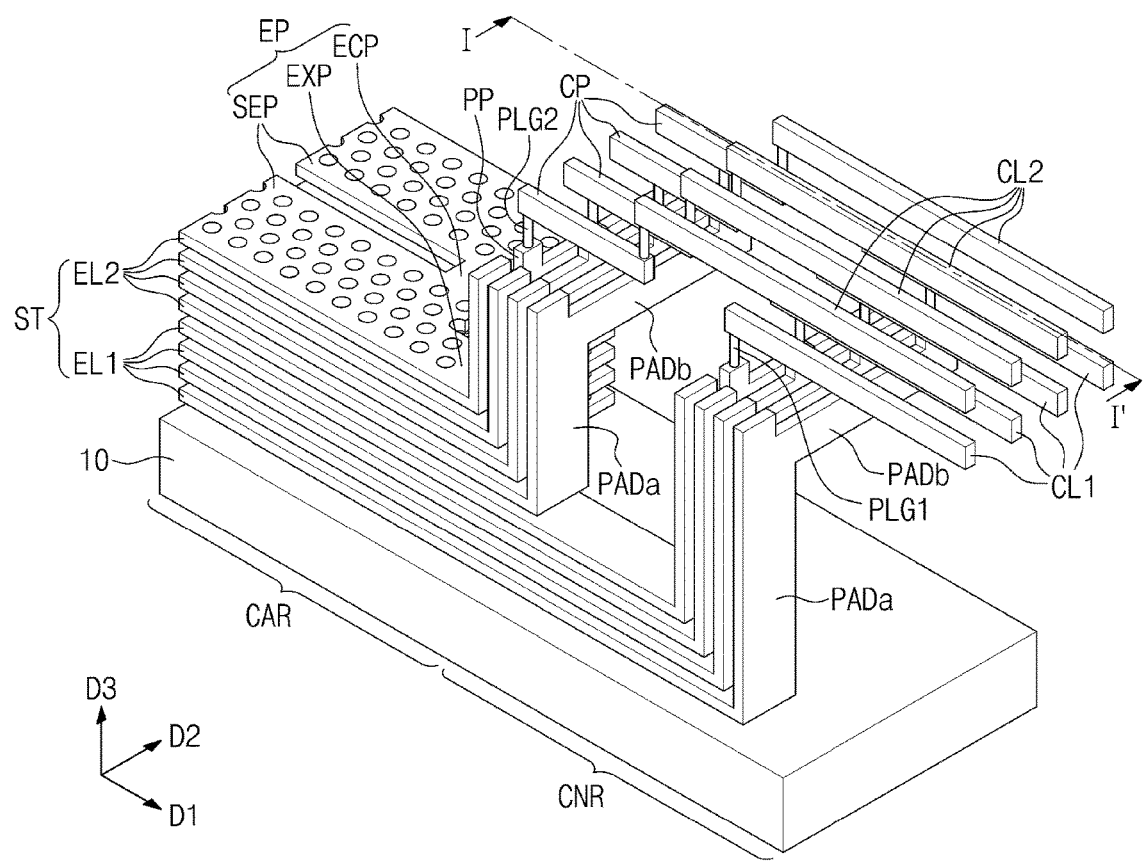
FIG. 6A is a perspective view depicting a three-dimensional semiconductor device according to some embodiments of the inventive concept.
Figure 6B:
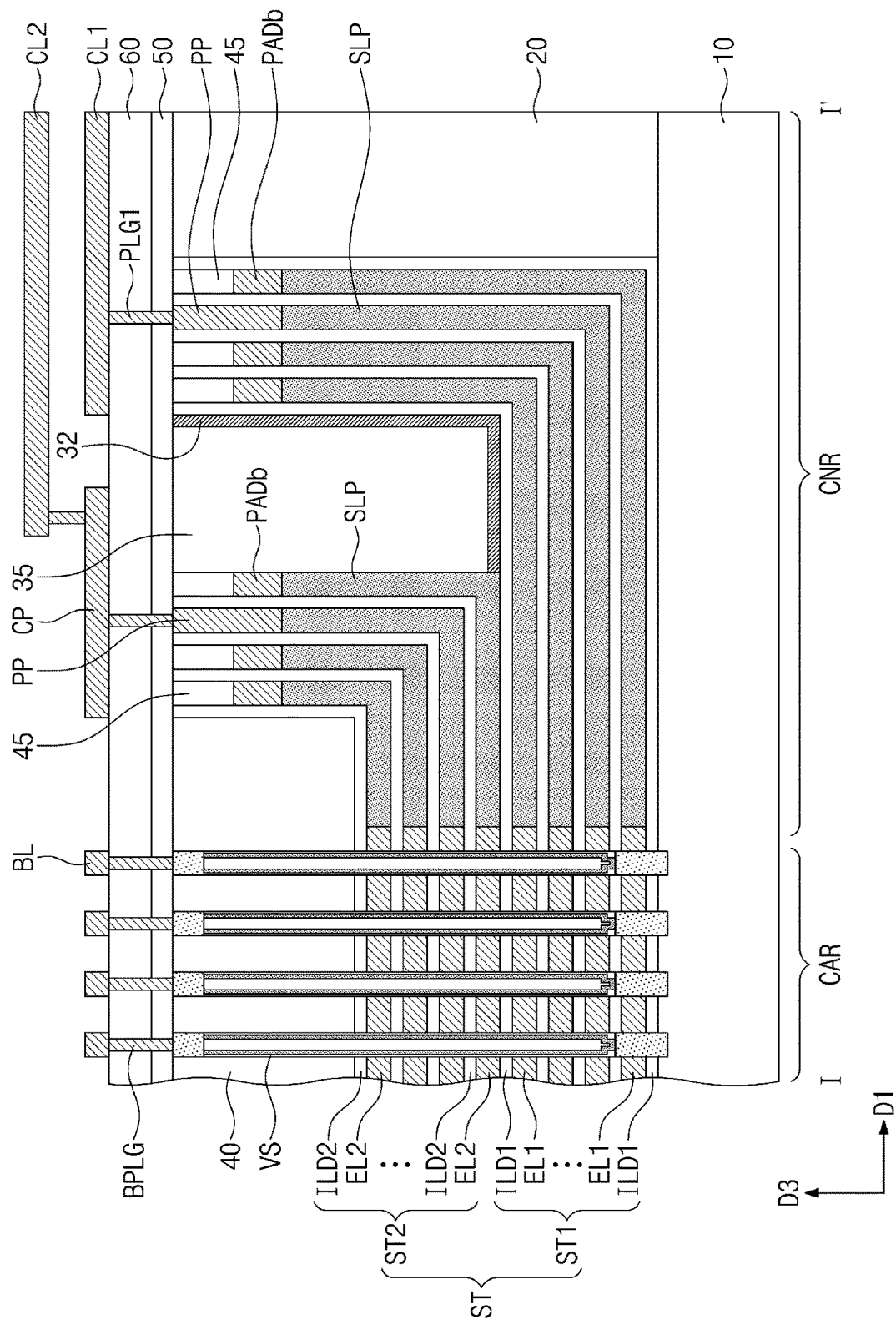
FIG. 6B depicts a sectional view taken along line I-I' of FIG. 6A.

FIG. 6A is a perspective view depicting a three-dimensional semiconductor device according to some embodiments of the inventive concept, and FIG. 6B depicts a sectional view taken along line I-I' of FIG. 6A. For each of description, details of similar elements or components that have been previously described in connection with FIG. 5 may be omitted.

Referring to FIGS. 6A and 6B, each of the lower and upper electrodes EL1 and EL2 may include vertical pad portion PADa, horizontal pad portion PADb, and protruding portion PP on the connection region CNR of the substrate 10.

The protruding portions PP of the lower and upper electrodes EL1 and EL2 may have top surfaces that are substantially coplanar with each other and may be arranged in a diagonal direction (e.g., with respect to the first direction D1) if viewed in a plan view. In some embodiments, the protruding portions PP of the lower electrodes EL1 may be arranged in a diagonal direction that is parallel or substantially parallel to the arrangement direction of the protruding portions PP of the upper electrodes EL2. The protruding portions PP of the lower electrodes EL1 may be spaced apart from the protruding portions PP of the upper electrodes EL2 in the first direction D1. In certain embodiments, the protruding portions PP, which are adjacent to each other in the first direction D1, may be spaced apart from each other by substantially the same distance.

In some embodiments, the interconnection structure that may be used to electrically connect the memory cells of a memory cell array (that will be formed) to a row decoder may be connected to the electrode structure ST. In one embodiment, the interconnection structure may include the lower contact plugs PLG1 and the first conductive lines CL1, and upper contact plugs PLG2 and the second conductive lines CL2. The first conductive lines CL1 may be electrically connected to the lower electrodes EL1, and the second conductive lines CL2 may be electrically connected to the upper electrodes EL2.

The first lower contact plugs PLG1 may be respectively coupled to the protruding portions PP of the lower electrodes EL1, and the first conductive lines CL1 that extend in the first direction D1 may be respectively connected to the first lower contact plugs PLG1. Also, the second lower contact plugs PLG2 may be respectively coupled to the protruding portions PP of the upper electrodes EL2, and the lower conductive patterns CP may be respectively connected to the second lower contact plugs PLG2. Here, the lower conductive patterns CP may be positioned at the same level as the first conductive lines CL1 as measured from the substrate 10. The second conductive lines CL2 may respectively be electrically coupled to the lower conductive patterns CP through the upper contact plugs PLG2. The second conductive lines CL2 may extend in the first direction D1 and may partially overlap the first conductive lines CL1, if viewed in a plan view.

In certain embodiments, the first conductive lines CL1 and the conductive patterns CP may be in direct contact with the protruding portions PP of the lower and upper electrodes EL1 and EL2 without using the first and second lower contact plugs PLG1 and PLG2.

Figure 10A:
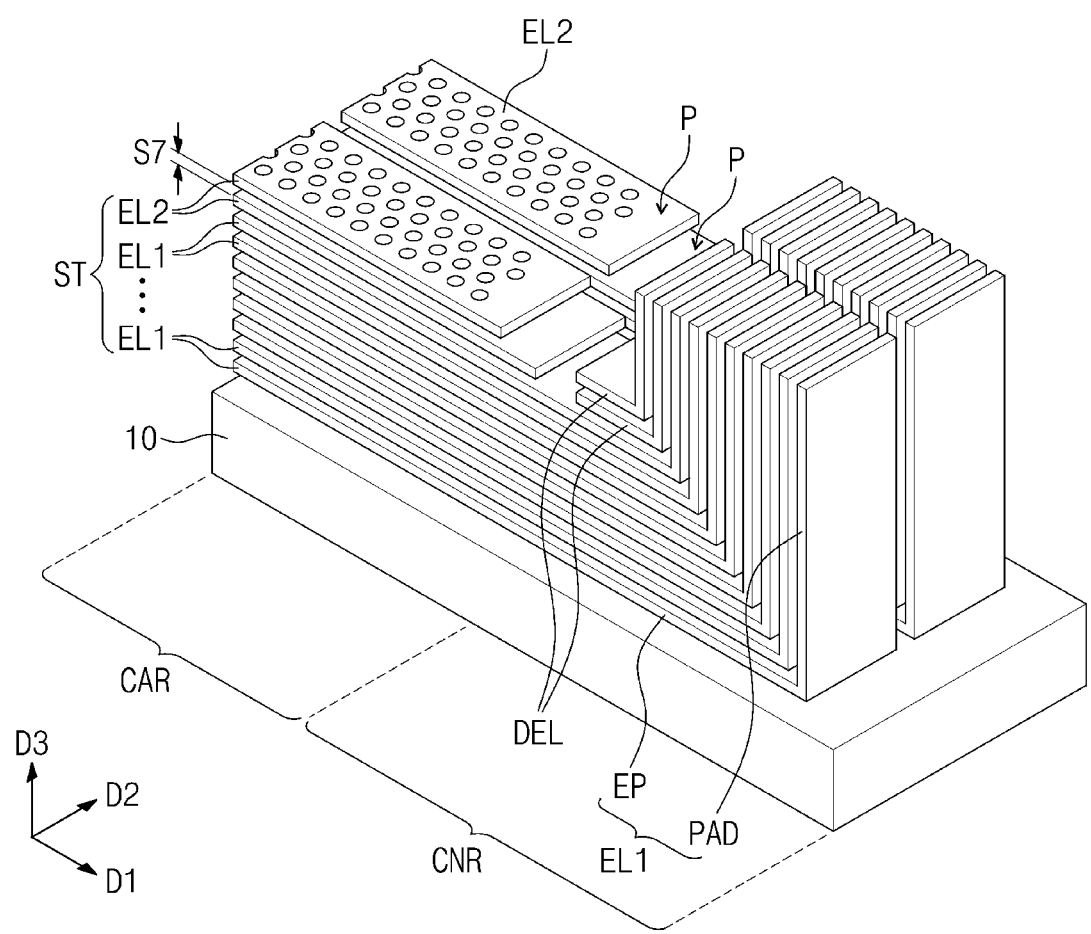
FIG. 10A is a perspective view depicting an electrode structure that is formed by the method of FIGS. 7A to 7F.
Figure 10B:
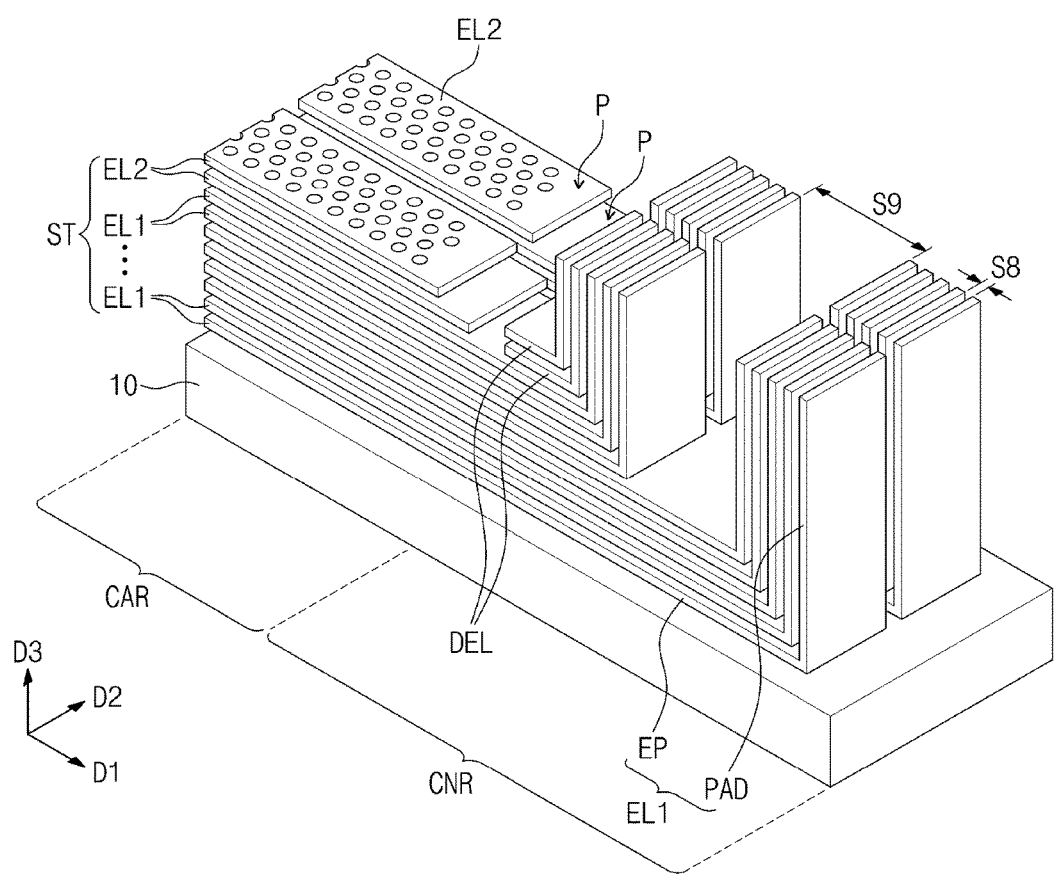
FIGS. 10B and 10C are perspective views depicting modifications of the electrode structure of FIG. 10A.
Figure 10C:
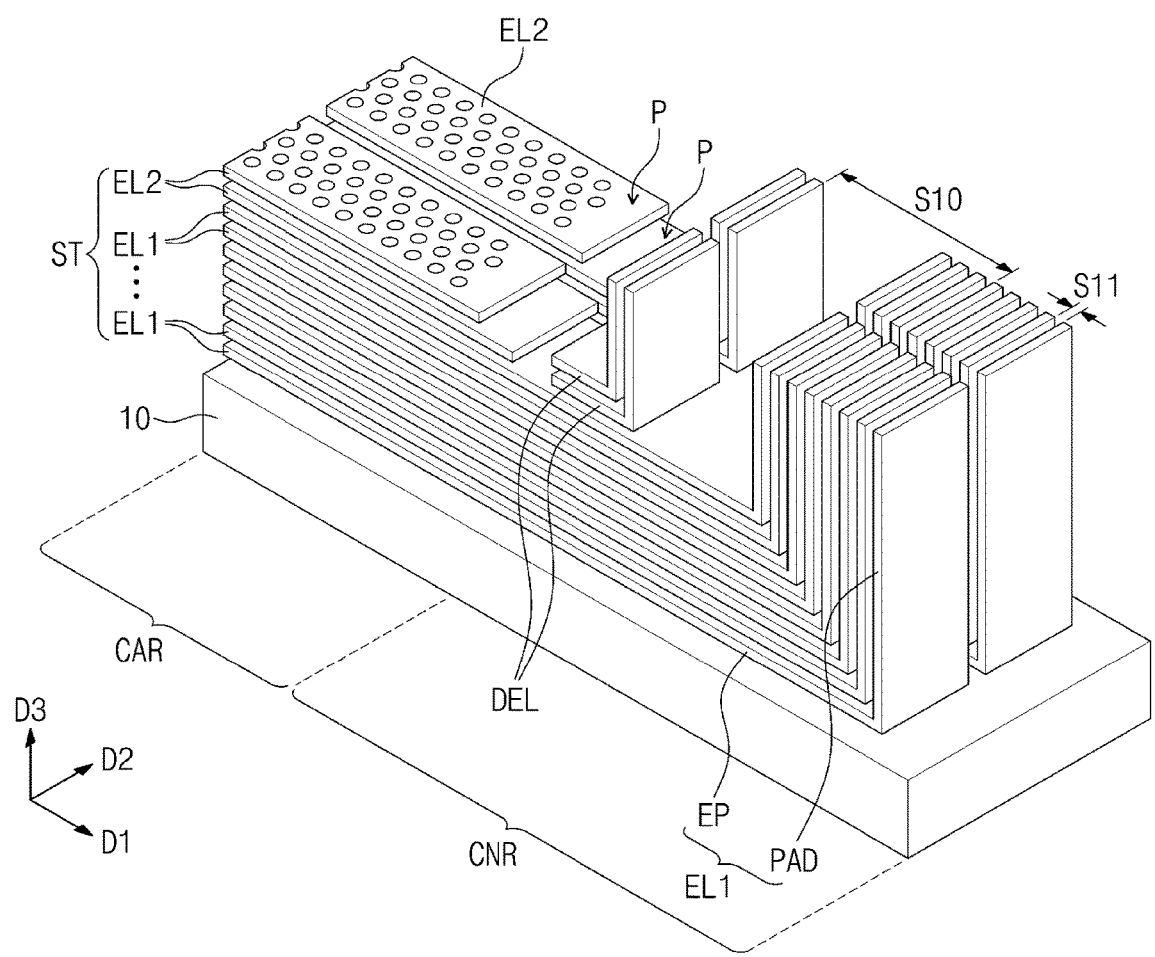

FIGS. 7A to 7F are perspective views depicting different stages of another method of fabricating a three-dimensional semiconductor device according to some embodiments of the inventive concept. FIG. 10A is a perspective view depicting an electrode structure that is formed by the method of FIGS. 7A to 7F. FIGS. 10B and 10C respectively are perspective views depicting modifications of the electrode structure of FIG. 10A.

For ease of description, details of elements or components previously described in connection with FIGS. 2A to 2I may be omitted.

Figure 7A:
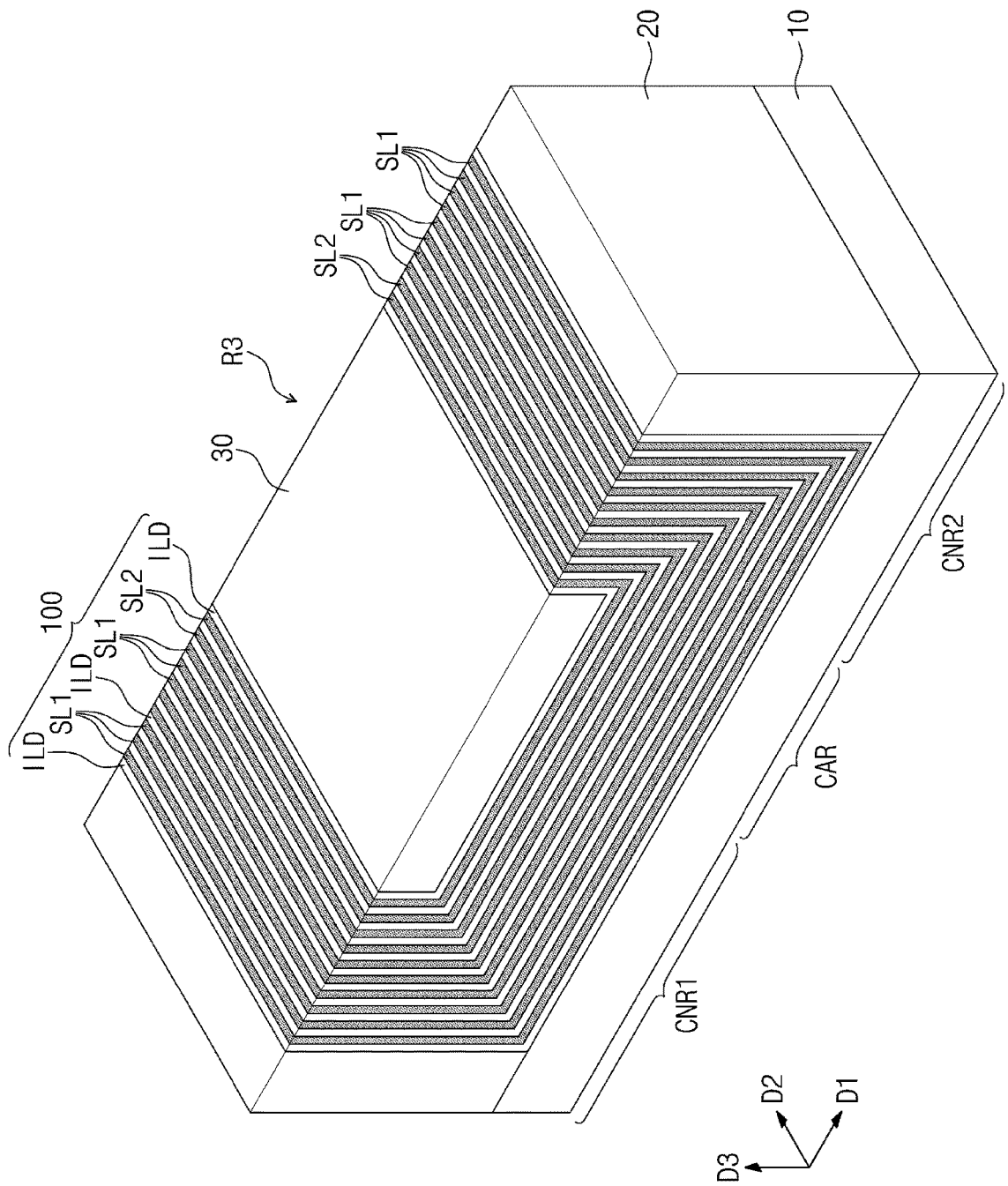
FIGS. 7A to 7F are perspective views depicting different stages of another method of fabricating a three-dimensional semiconductor device, according to some embodiments of the inventive concept.

Referring to FIG. 7A, a substrate 10 may include first and second connection regions CNR1 and CNR2, and a cell array region CAR that is disposed between the first and second connection regions CNR1 and CNR2. A mold pattern 20 may be formed on the substrate 10 to define a recess region R3. The mold pattern 20 may be formed to have a sidewall at an angle with respect to the top surface of the substrate 10. As an example, the mold pattern 20 may be formed on portions of the first and second connection regions CNR1 and CNR2 to expose the substrate 10 in the cell array region CAR. The mold pattern 20 may be formed from an insulating material or from the same material as the substrate 10.

A stack 100 may be formed in the recess region R3 of the mold pattern 20. The stack 100 may be formed by alternately and repeatedly stacking insulating layers ILD and sacrificial layers SL1 and SL2 on the substrate 10 and the mold pattern 20, and then, performing a planarization process. The insulating layers ILD and the sacrificial layers SL1 and SL2 may be formed to respectively have a uniform thickness on the top surface of the substrate 10 and a sidewall of the mold pattern 20. In an embodiment, the sacrificial layers of the stack 100 may include the lower sacrificial layers SL1 and the upper sacrificial layers SL2. The number of the upper sacrificial layers SL2 may be equal to or less than the number of the lower sacrificial layers SL1.

As described above, the stack 100 may include a horizontal portion, which is parallel or substantially parallel to the top surface of the substrate 10, and sidewall portions, which are respectively provided on the first and second connection regions CNR1 and CNR2 of the substrate 10, and that are parallel or substantially parallel to the sidewall of the mold pattern 20. In other words, each of the lower and the upper sacrificial layers SL1 and SL2 may have a horizontal portion and sidewall portions.

Furthermore, an insulating planarization layer 30 may be formed on the horizontal portion of the stack 100, and a top surface of the insulating planarization layer 30 may be substantially coplanar with a top surface of the mold pattern 20. Additionally, the top surface of the insulating planarization layer 30 may be substantially coplanar with the top surface of the sidewall portion of the stack 100. The insulating planarization layer 30 may be formed from an insulating material that has an etch selectivity with respect to the lower and the upper sacrificial layers SL1 and SL2.

Figure 7B:
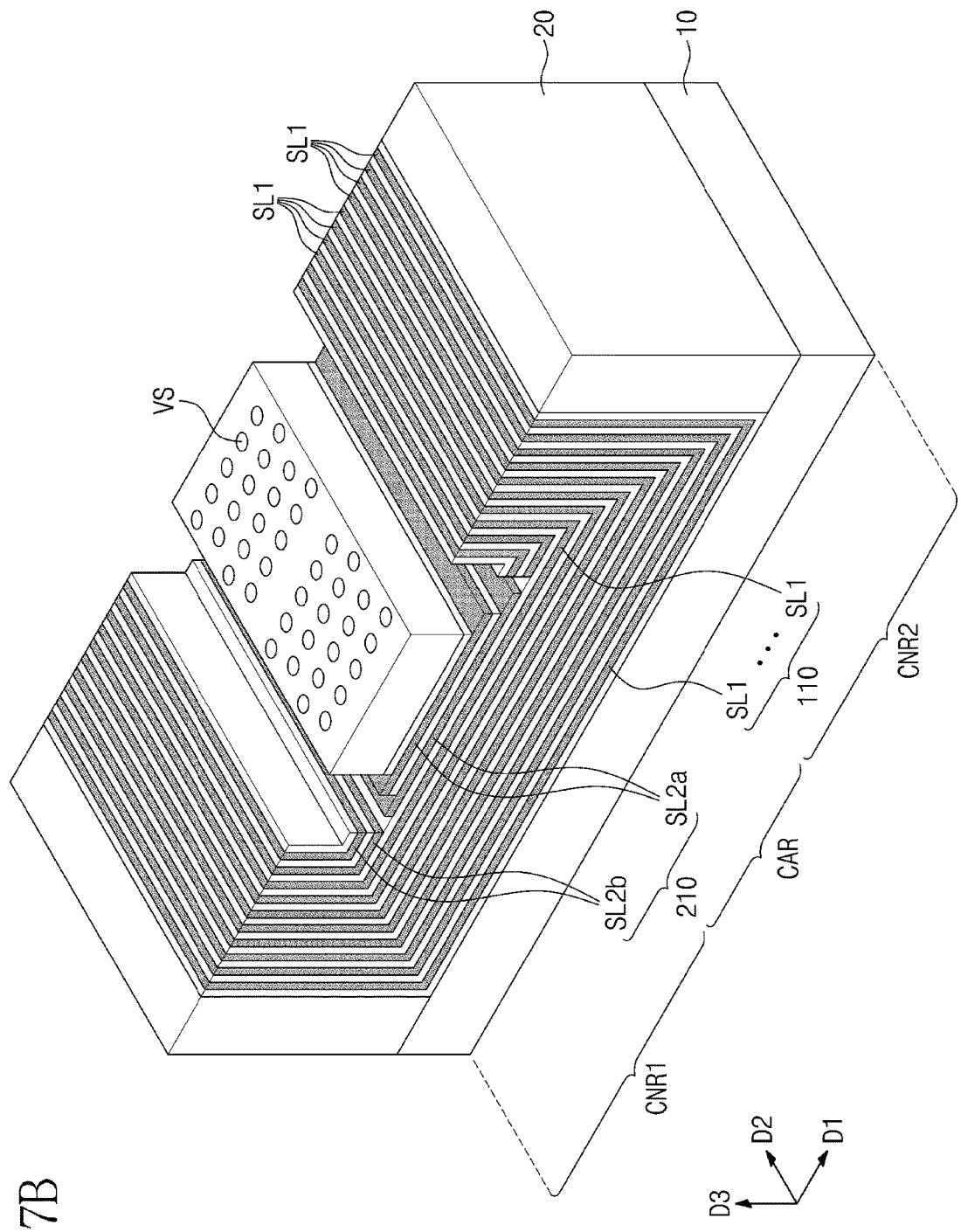

Referring to FIG. 7B, after the stack 100 has been formed, the vertical structures VS that extend in the third direction D3 may be formed on the cell array region CAR of the substrate 10. The vertical structures VS may be formed to penetrate the stack 100 and may be formed to have a zigzag arrangement in the second direction D2. The vertical structures VS may include a semiconductor material and/or a conductive material, as described above.

A pad-etching process may be performed on the upper sacrificial layers SL2 of the stack 100 to form the upper stack 210 on the lower stack 110. In an embodiment, during the pad-etching process, an etching process that etches a portion of the stack 100 using a mask pattern and a trimming process that reduces an area of the mask pattern may be alternately repeated.

In some embodiments, the upper stack 210 may include upper sacrificial patterns SL2a and a dummy sacrificial pattern SL2b. The upper sacrificial patterns SL2a may be vertically stacked on the horizontal portions of the lower sacrificial layers SL1. The dummy sacrificial pattern SL2b may be horizontally spaced apart from the upper sacrificial patterns SL2a. In an embodiment, the number of the upper sacrificial patterns SL2a formed by the pad-etching process may vary depending on the number of the sacrificial layers forming the stack.

The upper stack 210 may have, for example, a staircase-like structure that is defined by end portions of the upper sacrificial patterns SL2a. The dummy sacrificial pattern SL2b may have sidewalls that are horizontally spaced apart from sidewalls of the upper sacrificial patterns SL2a and are vertically aligned with each other.

Figure 8A:
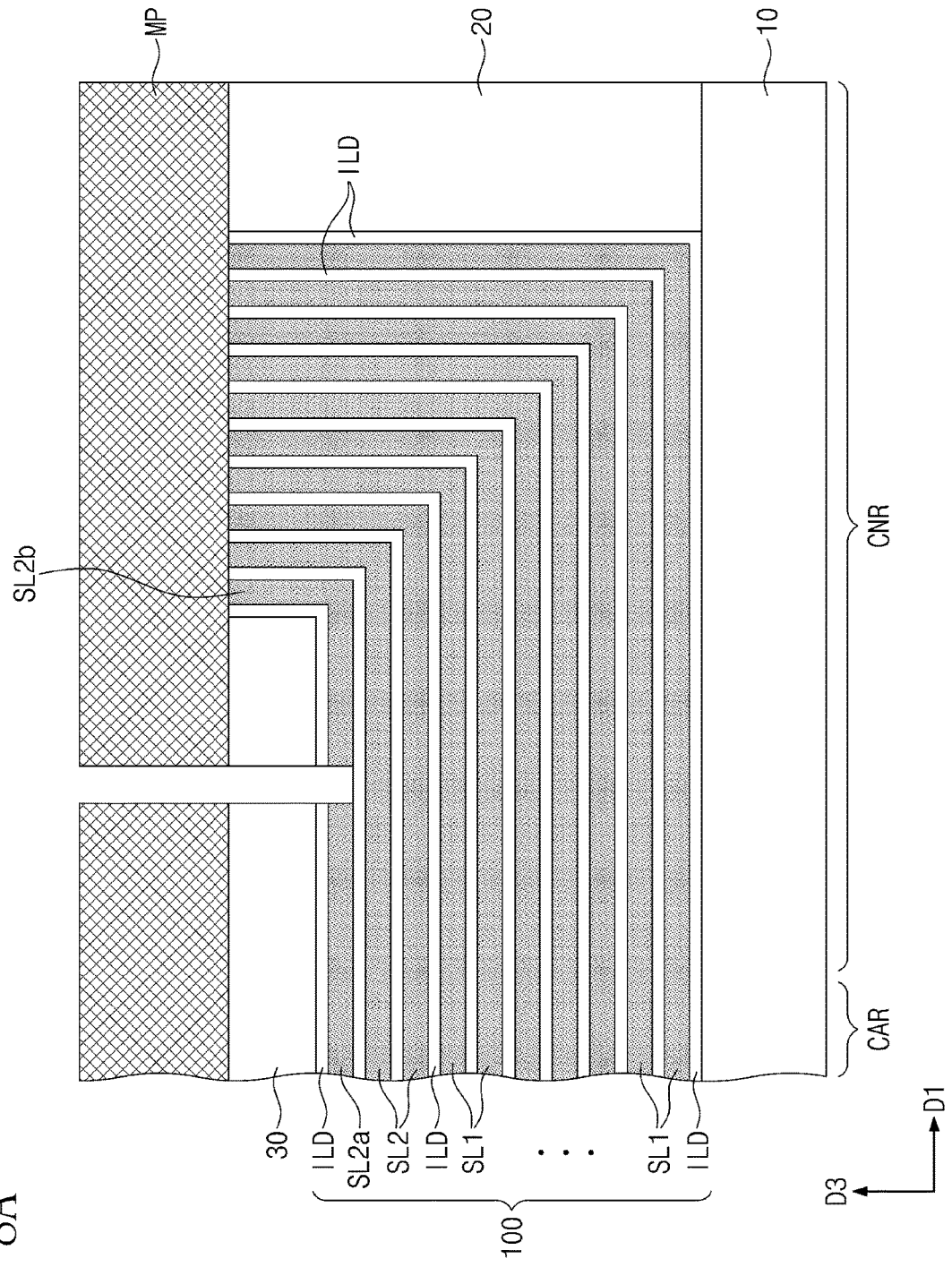
Figure 8C:
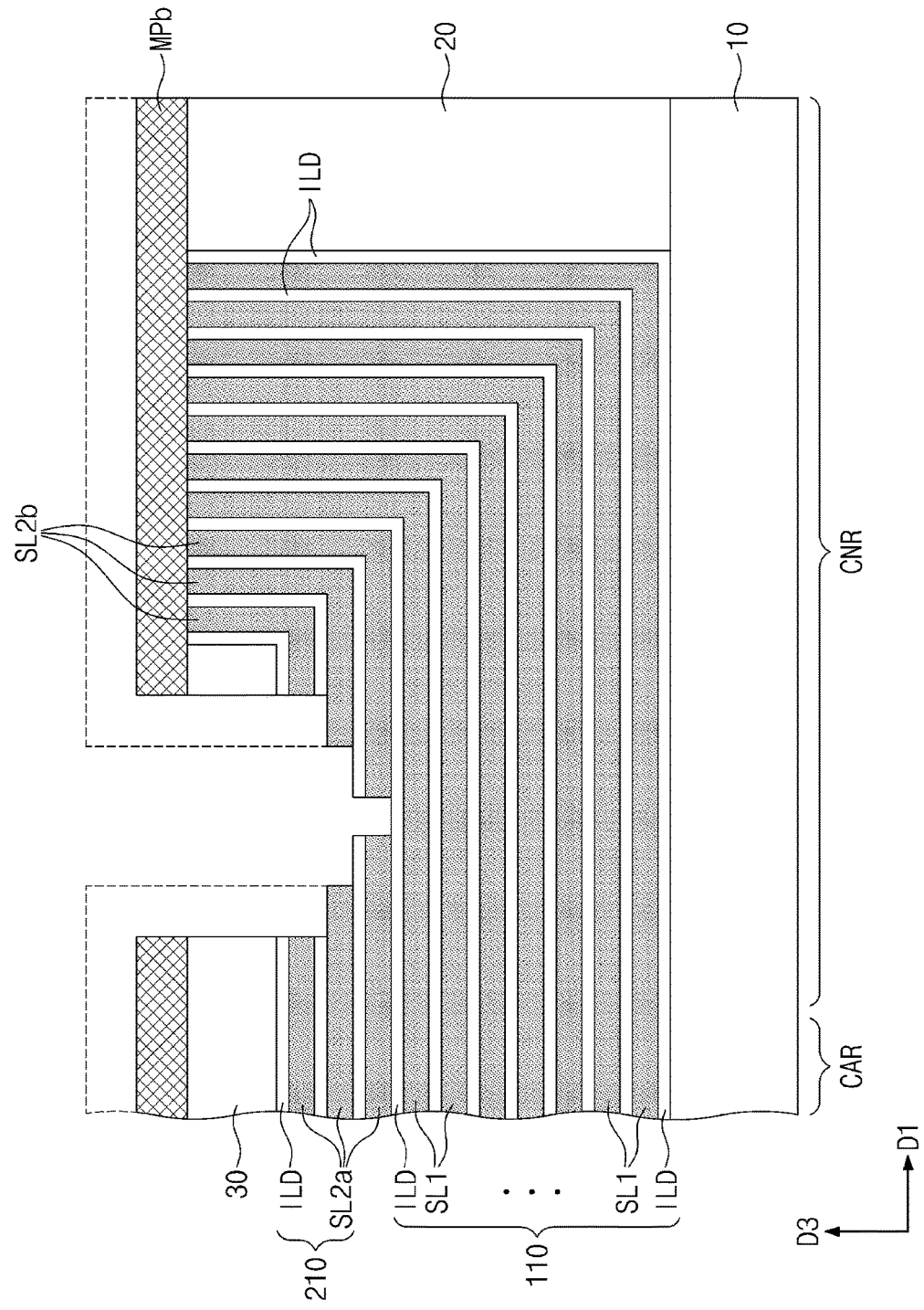

As another example, the upper stack 210 may have a first staircase-like structure that is defined by the upper sacrificial patterns SL2a and a second staircase-like structure that is defined by the dummy sacrificial pattern SL2b, as depicted in FIG. 8C. Here, the first staircase-like structure and the second staircase-like structure may be formed to be symmetric with respect to each other.

A method of forming the upper stack 210 will be described in greater detail with reference to FIGS. 8A to 8D, 9A, and 9B.

Figure 7C:
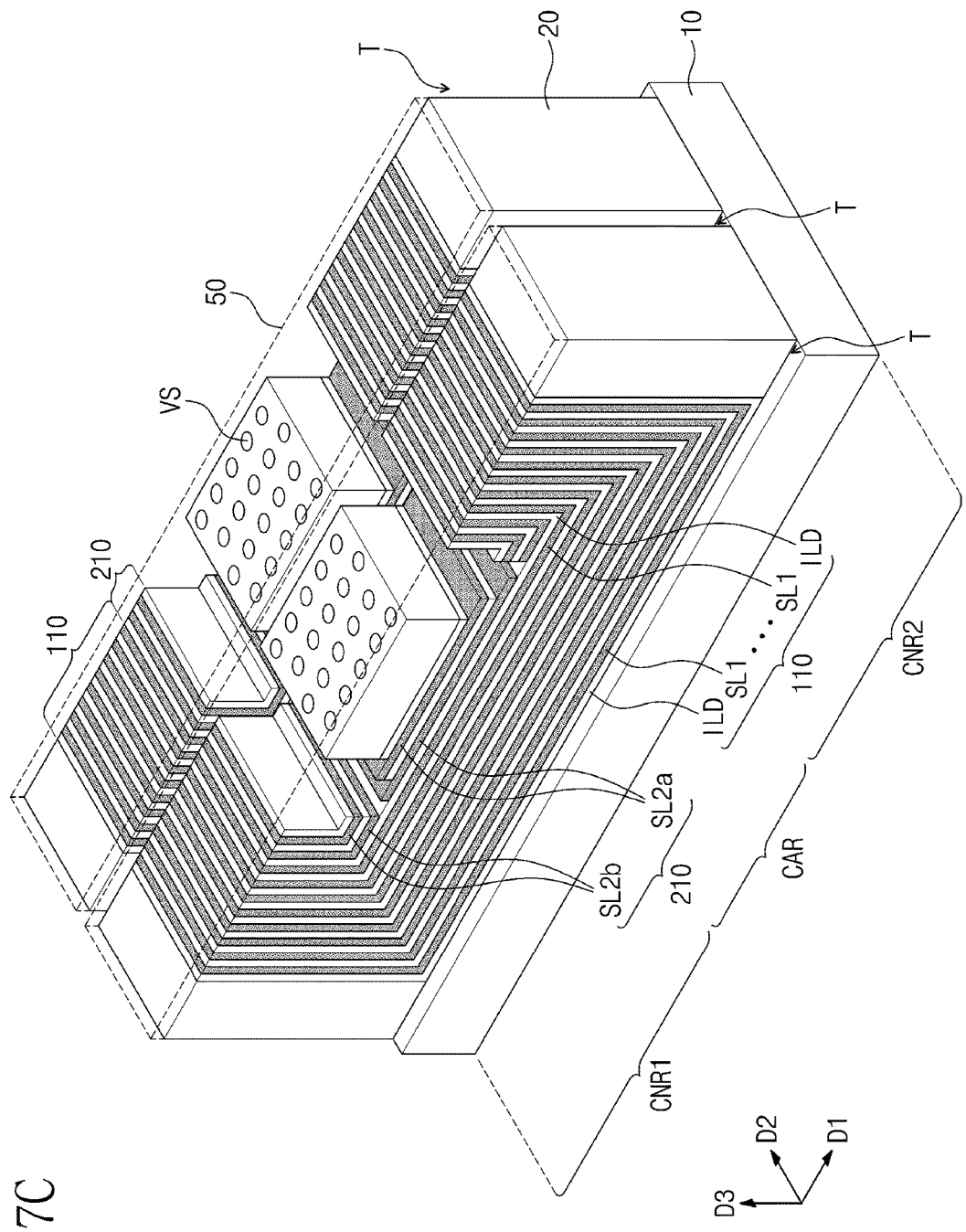

After the upper stack 210 with the staircase structures has been formed, as depicted in FIG. 7C, a capping layer 50 (depicted in phantom) may be formed to fill gap regions between the upper sacrificial patterns SL2a and the dummy sacrificial patterns SL2b. The capping layer 50 may cover top surfaces of the vertical structures VS, the lower sacrificial layers SL1, and the dummy sacrificial patterns SL2b.

After the capping layer 50 has been formed, the lower and upper stacks 110 and 210 may be patterned to form the trenches T that expose the substrate 10. As a result of forming the trenches T, the lower and upper stacks 110 and 210 may be divided into a plurality of mold structures that extend in the first direction D1 and are separated from each other in the second direction D2. The trenches T may be formed to expose sidewalls of the lower sacrificial layers SL1, the upper sacrificial patterns SL2a, and the dummy sacrificial patterns SL2b on the cell array region CAR and the first and second connection regions CNR1 and CNR2 of the substrate 10.

Figure 7D:
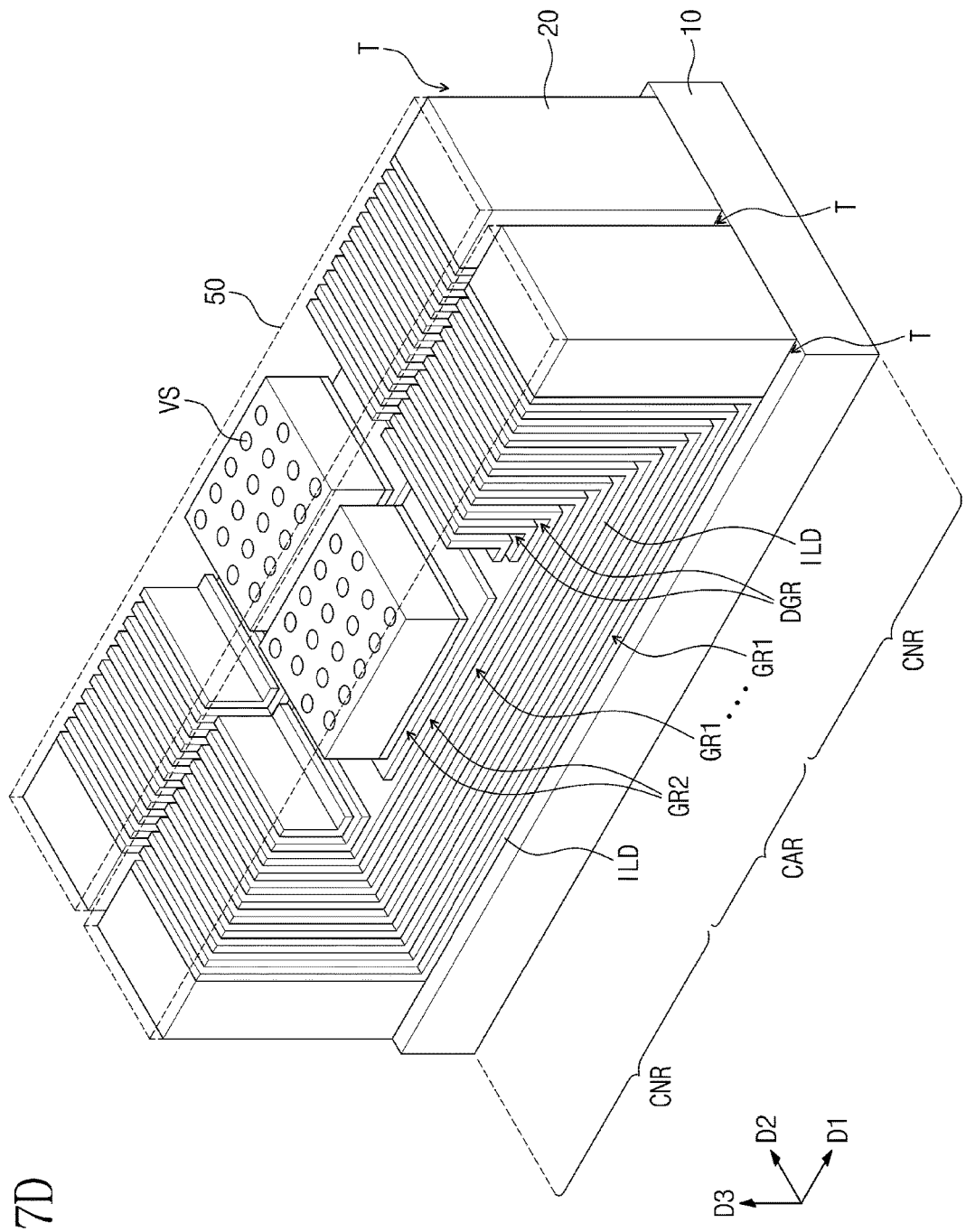

Referring to FIG. 7D, the lower sacrificial layers SL1, the upper sacrificial patterns SL2a, and the dummy sacrificial patterns SL2b that are exposed by the trenches T may be removed to form gate regions GR1 and GR2, and dummy gate regions DGR between the insulating layers ILD. The gate regions may include the lower gate regions GR1, the upper gate regions GR2, and dummy gate regions DGR, which are respectively formed by removing the lower sacrificial layers SL1, the upper sacrificial patterns SL2a, and the dummy sacrificial patterns SL2b. In an embodiment, each of the lower gate regions GR1 and the dummy gate regions DGR may have a horizontal region that is parallel or substantially parallel to the top surface of the substrate 10, and a sidewall region that is parallel or substantially parallel to the sidewall of the mold pattern 20. The upper gate regions GR2 may be parallel or substantially parallel to the top surface of the substrate 10.

Figure 7E:
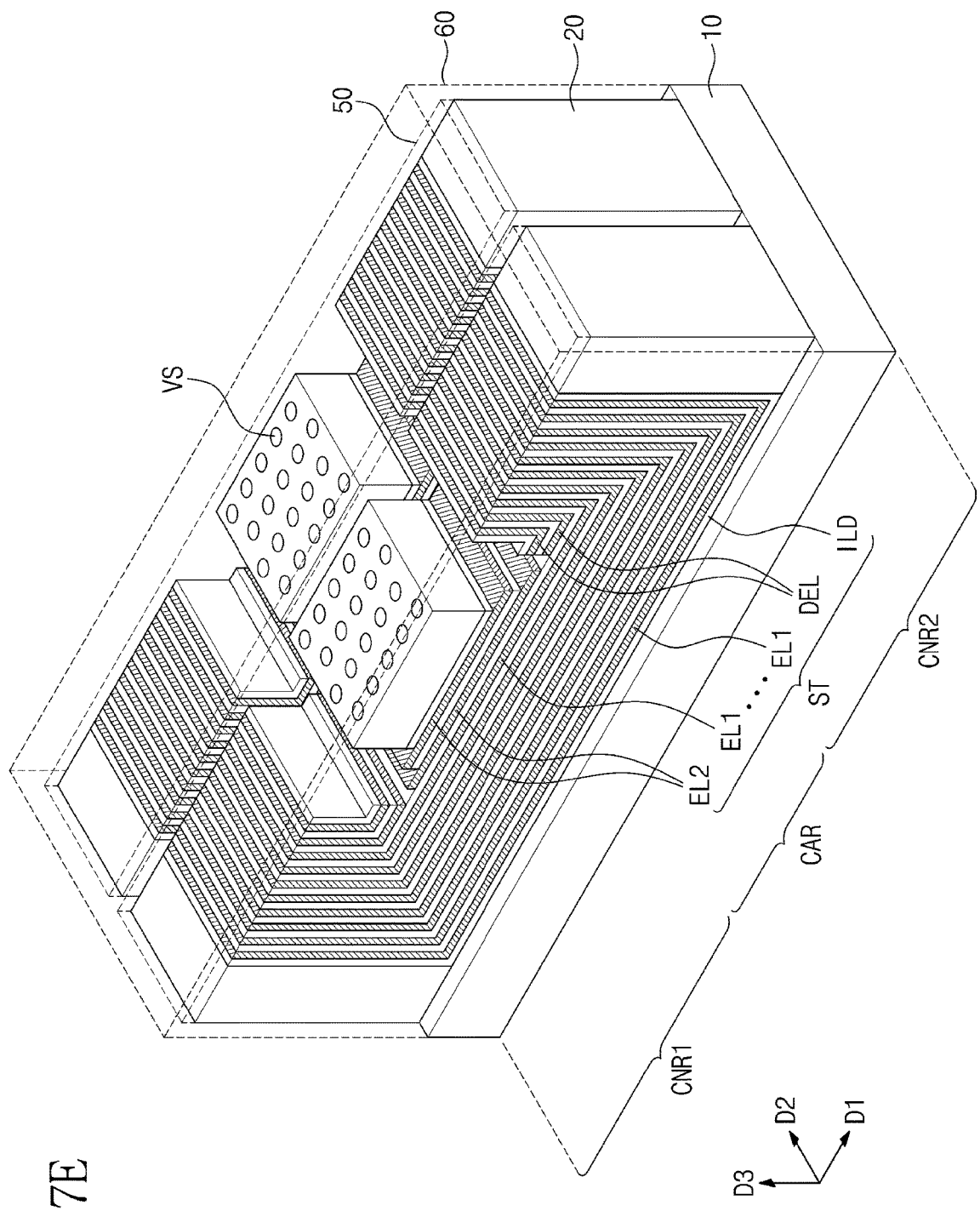

Referring to FIG. 7E, the electrode structures ST, each of which includes a plurality of electrodes EL1, EL2, and DEL, may be formed by filling the gate regions with a conductive material. As described above, the electrodes EL1, EL2, and DEL may be formed using at least one deposition technique that is capable of providing an excellent step-coverage property. In an embodiment, the electrodes may include lower electrodes EL1 that are vertically stacked on the substrate 10, and upper electrodes EL2 and dummy electrodes DEL that are formed on the lower electrodes EL1.

In greater detail, referring to FIG. 10A, the electrode structures ST may extend in the first direction D1 and may be spaced apart from each other in the second direction D2. In some embodiments, each of the electrode structures ST may include a lower electrode structure and an upper electrode structure. The lower electrode structure may include a plurality of the lower electrodes EL1 and insulating layers ILD between the lower electrodes EL1. The upper electrode structure may include a plurality of the upper electrodes EL2 and insulating layers ILD between the upper electrodes EL2. The lower electrode structure may include a horizontal portion, which is parallel or substantially parallel to the top surface of the substrate 10, and sidewall portions, which are respectively provided on the first and second connection regions CNR1 and CNR2, and are inclined with respect to the top surface of the substrate 10. The upper electrode structure may be formed to have a staircase-like structure on each of the first and second connection regions CNR1 and CNR2.

In the electrode structures ST, each of the lower electrodes EL1 may include the electrode portion EP, which is parallel or substantially parallel to the top surface of the substrate 10, and the vertical pad portions PAD, which are provided on the first and second connection regions CNR1 and CNR2 and are inclined with respect to the top surface of the substrate 10. The vertical pad portions PAD of the lower electrodes EL1 may have top surfaces that are positioned at the same level from the top surface of the substrate 10. Furthermore, the vertical pad portions PAD of the lower electrodes EL1 may be horizontally spaced apart from each other by the same distance S7, as depicted in FIG. 10A. Alternatively, as depicted in FIG. 10B, some of the vertical pad portions PAD of the lower electrodes EL1 may be spaced apart from each other by a first horizontal distance S8, and the others of the vertical pad portions may be spaced apart from each other by a second horizontal distance S9 that is greater than the first horizontal distance. In certain embodiments, as depicted in FIG. 10C, the vertical pad portions PAD of the lower electrodes EL1 may be spaced apart from each other by a first horizontal distance S10, and the dummy electrode DEL and the vertical pad portion PAD of the lower electrode EL1 that is adjacent to the vertical pad portion PAD of the lower electrode EL1 may be spaced apart from each other by a second horizontal distance S11. Here, the second horizontal distance may be greater than the first horizontal distance.

The upper electrodes EL2 may be formed on the electrode portions EP of the lower electrodes EL1, and each of the upper electrodes EL2 may include the pad portion P, which is formed on at least one of the first and second connection regions CNR1 and CNR2 of the substrate 10, and is exposed by the upper electrode EL2 that is immediately above.

The dummy electrodes DEL may be provided on the lower electrodes EL1 and may be horizontally spaced apart from the upper electrodes EL2. Similar to the lower electrodes EL1, the dummy electrodes DEL may be formed to have an "L-shaped" section on the first and second connection regions CNR1 and CNR2 of the substrate 10. In an embodiment, top surfaces of the dummy electrodes DEL may be positioned at substantially the same level as the top surfaces of the vertical pad portions PAD of the lower electrodes EL1.

Figure 7F:
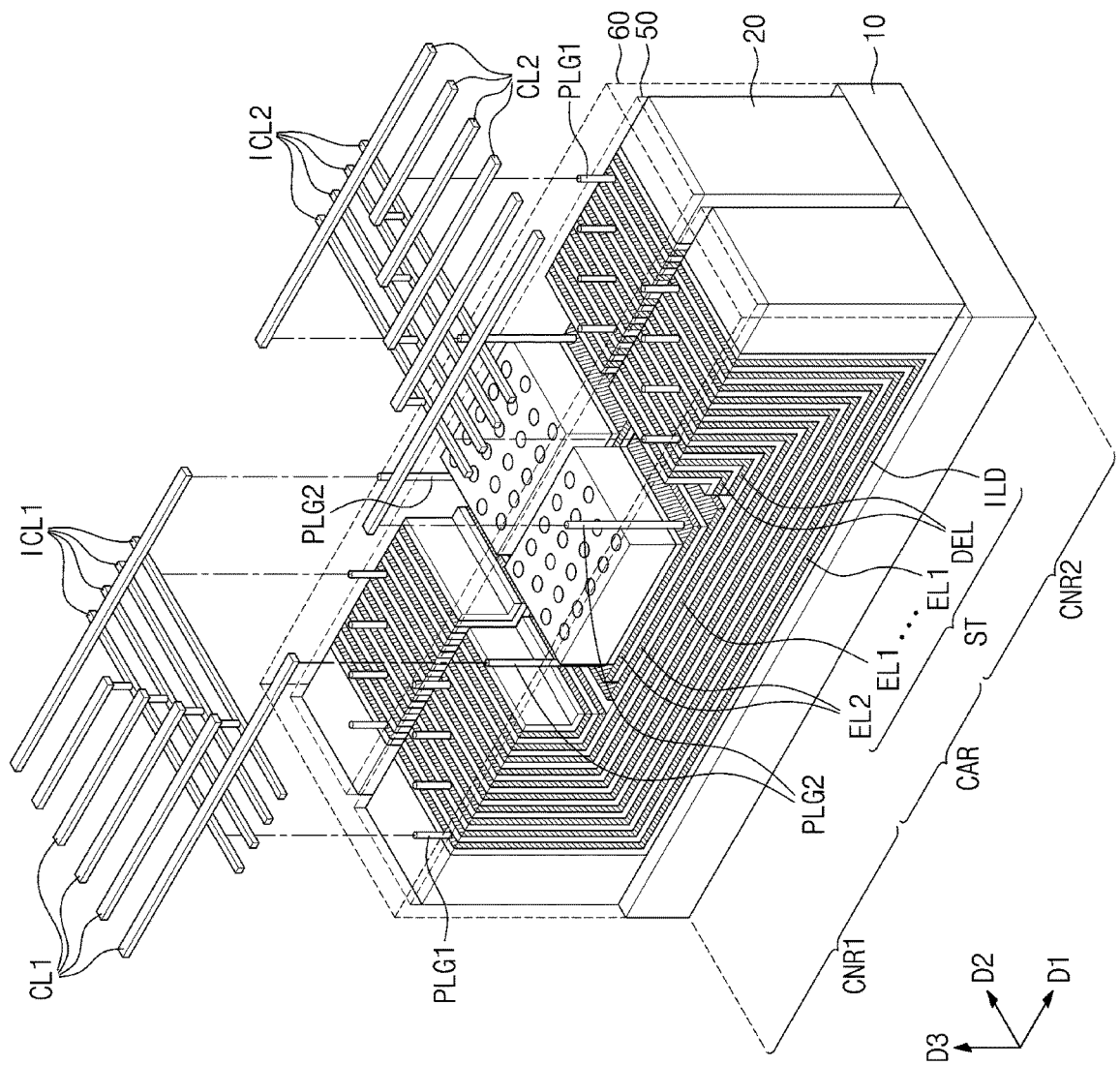

After the electrode structures ST have been formed, an insulating isolation layer 60 (shown in phantom) may be formed to fill the trenches T. Afterward, as depicted in FIG. 7F, the interconnection structure may be formed on the first and second connection regions CNR1 and CNR2 of the substrate 10, and may be connected to the electrode structures ST. In some embodiments, on the first connection region CNR1 of the substrate 10, the lower contact plugs PLG1 may be respectively coupled to the lower electrodes EL1 positioned at odd-numbered levels. On the second connection region CNR2 of the substrate 10, the lower contact plugs PLG1 may be respectively coupled to the lower electrodes EL1 positioned at even-numbered levels.

Furthermore, first interconnection lines ICL1 may be formed on the first connection region CNR1 of the substrate 10 and the lower contact plugs PLG1. Second interconnection lines ICL2 may be formed on the second connection region CNR2 of the substrate 10 and the lower contact plugs PLG1. In an embodiment, the first and second interconnection lines ICL1 and ICL2 may extend in the second direction D2. Each of the first and second interconnection lines ICL1 and ICL2 may be formed to electrically connect the lower electrodes EL1, which are positioned at the same vertical level from the substrate 10. That is, in the electrode structures ST, the lower electrodes EL1 at the same level may be in an equipotential state.

The first conductive lines CL1 that extend in the first direction D1 may be provided on the first connection region CNR1 of the substrate 10 and may be respectively electrically connected to the first interconnection lines ICL1. Also, the second conductive lines CL2 that extend in the first direction D1 may be provided on the second connection region CNR2 of the substrate 10 and may be respectively electrically connected to the second interconnection lines ICL2.

The upper contact plugs PLG2 may be coupled to the upper electrode structure with a staircase-like structure. The upper contact plugs PLG2 may be respectively coupled to the pad portions P (e.g., of FIG. 10A) of the upper electrodes EL2.

In some embodiments, the interconnection structure that is connected to the electrode structure may vary depending on design. Additionally, although not shown, bit lines that extend in the second direction D2 may be formed on the cell array region CAR of the substrate 10 and on the electrode structures ST. The bit lines may be electrically connected to the vertical structures VS through bit line contact plugs.

FIGS. 8A to 8D, 9A, and 9B are sectional views depicting a pad-etching process that may be used to fabricate a three-dimensional semiconductor device according to some embodiments of the inventive concept.

Referring to FIG. 8A, a mask pattern MP may be formed to expose a portion of the insulating planarization layer 30 on the connection region CNR of the substrate 10. The mask pattern MP may be formed to cover the sidewall portion of the stack 100 on the connection region CNR of the substrate 10 and on the horizontal portion of the stack 100 on the cell array region CAR of the substrate 10.

The insulating planarization layer 30, the uppermost layer of the insulating layers ILD, and the uppermost layer of the upper sacrificial layers SL2 may be anisotropically etched using the mask pattern MP to form upper sacrificial pattern SL2a and dummy sacrificial pattern SL2b, which are horizontally spaced apart from each other at the topmost level of the stack 100.

Thereafter, as depicted in FIG. 8B, a trimming process may be performed to reduce an area of the mask pattern MP. That is, the trimming process may be performed to increase an area of the insulating planarization layer 30 that is exposed by the mask pattern MP. The trimming process may be performed using, for example, an isotropic dry-etching process or a wet-etching process. The mask pattern MP may be etched during the trimming process, and thus, the top surface of the mask pattern MP be recessed. In other words, the trimming process may be performed to reduce an area and a thickness of the mask pattern MP.

Additionally, the stack 100 may be anisotropically etched using the trimmed mask pattern MPa. Here, a portion of the upper sacrificial pattern SL2a and the upper sacrificial layer SL2 that are below the upper sacrificial pattern SL2a may be etched to a depth that corresponds to a vertical pitch of the upper sacrificial layers SL2 (i.e., a distance between top surfaces of adjacent ones of the upper sacrificial layers SL2). Accordingly, the upper sacrificial patterns SL2a may have end portions that define a staircase-like structure on the connection region CNR. The dummy sacrificial patterns SL2b may also have end portions that define a staircase-like structure.

Referring to FIG. 8C, the trimming process on the trimmed mask pattern MPa and the anisotropic-etching process on the upper sacrificial layers SL2 may be alternately repeated. The repetition of the trimming and etching processes may make it possible to increase the numbers of the upper and dummy sacrificial patterns SL2a and SL2b forming the staircase-like structure on the connection region CNR. A first staircase-like structure of the upper sacrificial patterns SL2a may be symmetric with respect to a second staircase-like structure of the dummy sacrificial patterns SL2b.

Figure 8D:
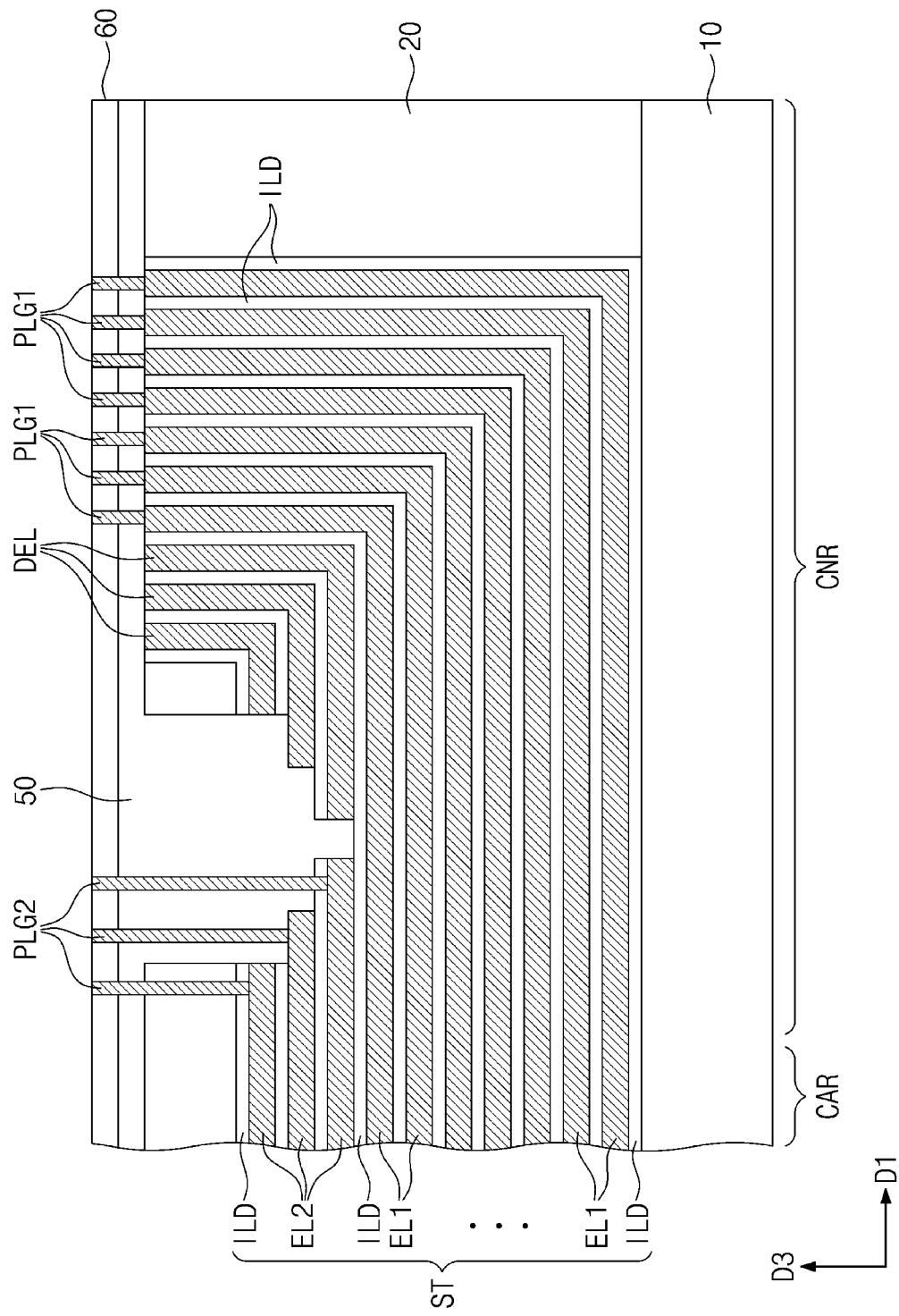

After the upper stack with the first and second staircase-like structures have been formed, as depicted in FIG. 8D, a capping layer 50 may be formed to cover the upper stack. Thereafter, as described with reference to FIGS. 7D and 7E, the upper sacrificial patterns may be replaced with the upper electrodes EL2 and the lower sacrificial layers may be replaced with the lower electrodes EL1. The dummy sacrificial patterns SL2b may be replaced with the dummy electrodes DEL. Accordingly, end portions of the upper electrodes EL2 and the dummy electrodes DEL may have the staircase-like structure on the connection region CNR of the substrate 10.

In an embodiment, on the connection region CNR of the substrate 10, the lower contact plugs PLG1 may be respectively coupled to the lower electrodes EL1, and the upper contact plugs PLG2 may be respectively coupled to the end portions of the upper electrodes EL2. As an example, the upper contact plugs PLG2 may have top surfaces that are substantially coplanar with the top surfaces of the lower contact plugs PLG1. Additionally, the lower contact plugs PLG1 may have the same length, and the upper contact plugs PLG2 may have lengths that are different from each other.

Another method of forming the upper stack will be described in more detail with reference to FIGS. 9A and 9B.

Referring to FIG. 9A, a first mask pattern MP1 may be formed to expose a portion of the insulating planarization layer 30 on the connection region CNR of the substrate 10. The first mask pattern MP1 may cover the sidewall portion of the stack 100 on the connection region CNR of the substrate 10, and may cover the horizontal portion of the stack 100 on the cell array region CAR.

At least two of the upper sacrificial layers may be anisotropically etched using the first mask pattern MP1 to form the upper sacrificial patterns SL2a and the dummy sacrificial patterns SL2b.

Figure 9B:
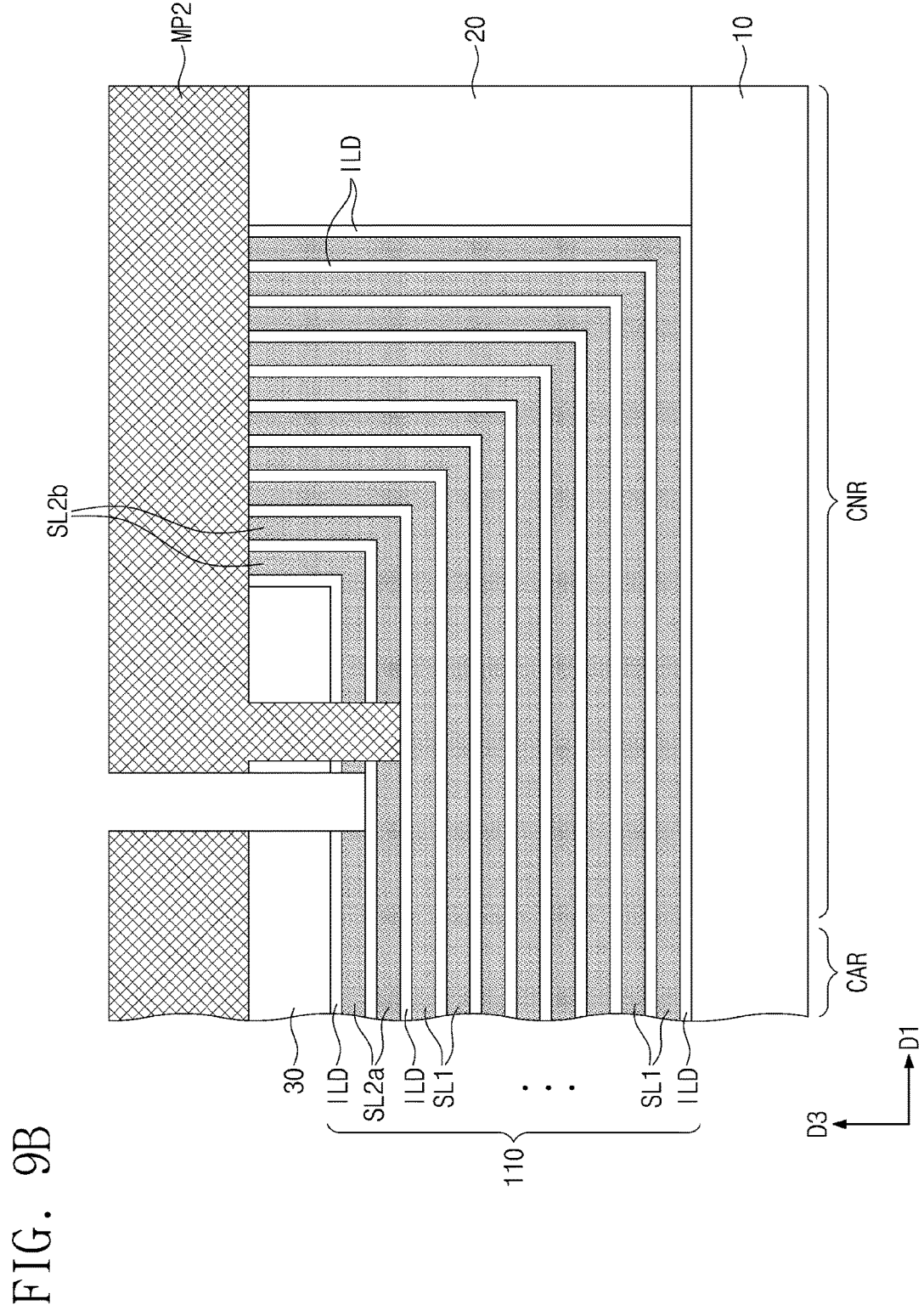

Thereafter, as depicted in FIG. 9B, a second mask pattern MP2 may be formed to fill a gap region between the upper and dummy sacrificial patterns SL2a and SL2b and to partially expose the uppermost one of the upper sacrificial patterns SL2a. The uppermost one of the upper sacrificial patterns SL2a may be anisotropically etched using the second mask pattern MP2 as an etch mask. Thus, the uppermost sacrificial pattern of the upper sacrificial patterns SL2a may expose an end portion of the upper sacrificial pattern SL2a that is underneath the uppermost sacrificial pattern.

FIGS. 11A, 11B, 12A, and 12B are perspective views depicting three-dimensional semiconductor devices according to some embodiments of the inventive concept. For ease of description, details of elements or components previously described in connection with FIGS. 7A to 7F and 10 may be omitted.

Figure 11A:
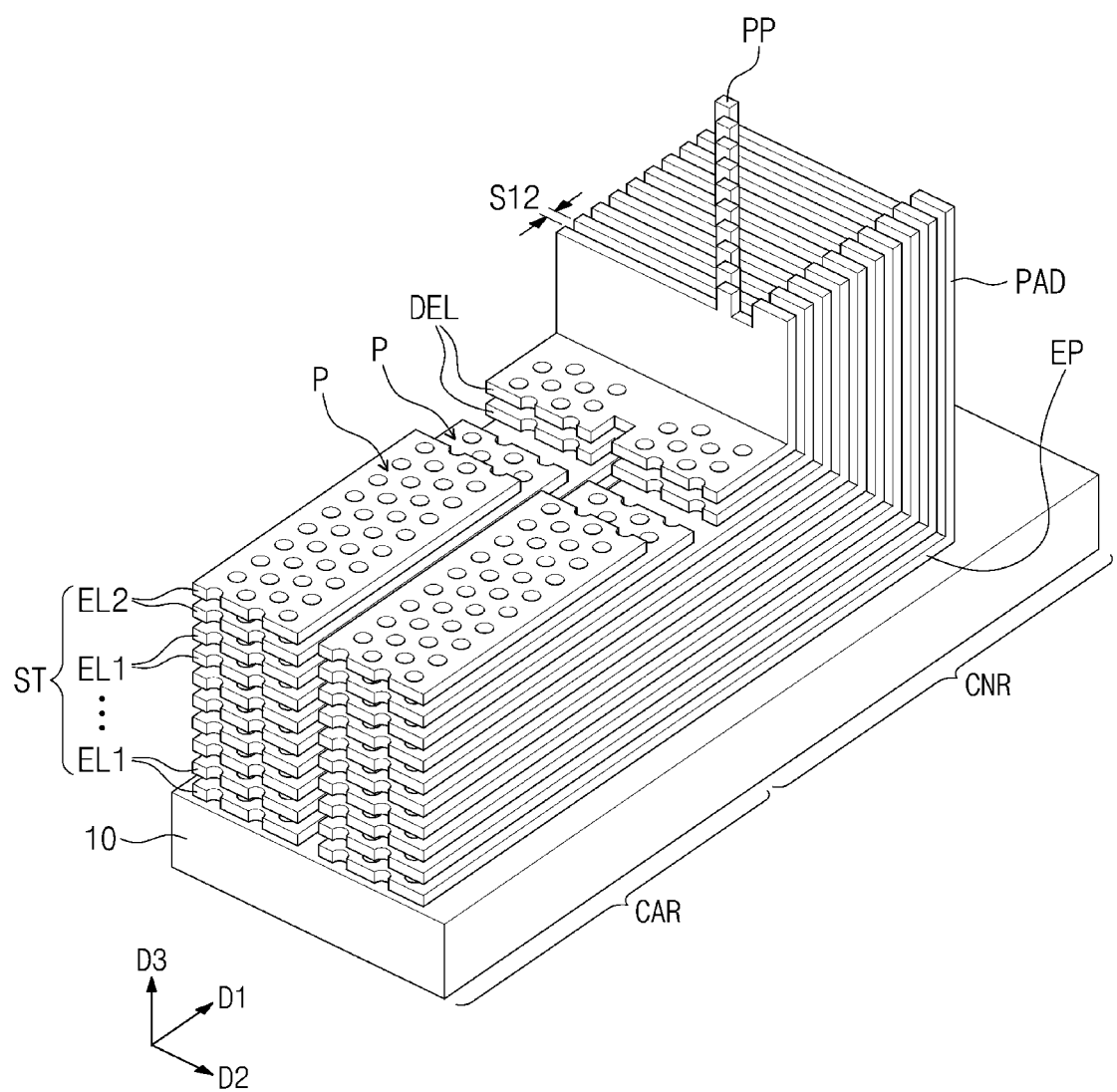
FIGS. 11A, 11B, 12A, and 12B are perspective views depicting electrode structures of three-dimensional semiconductor devices according to some embodiments of the inventive concept.
Figure 11B:
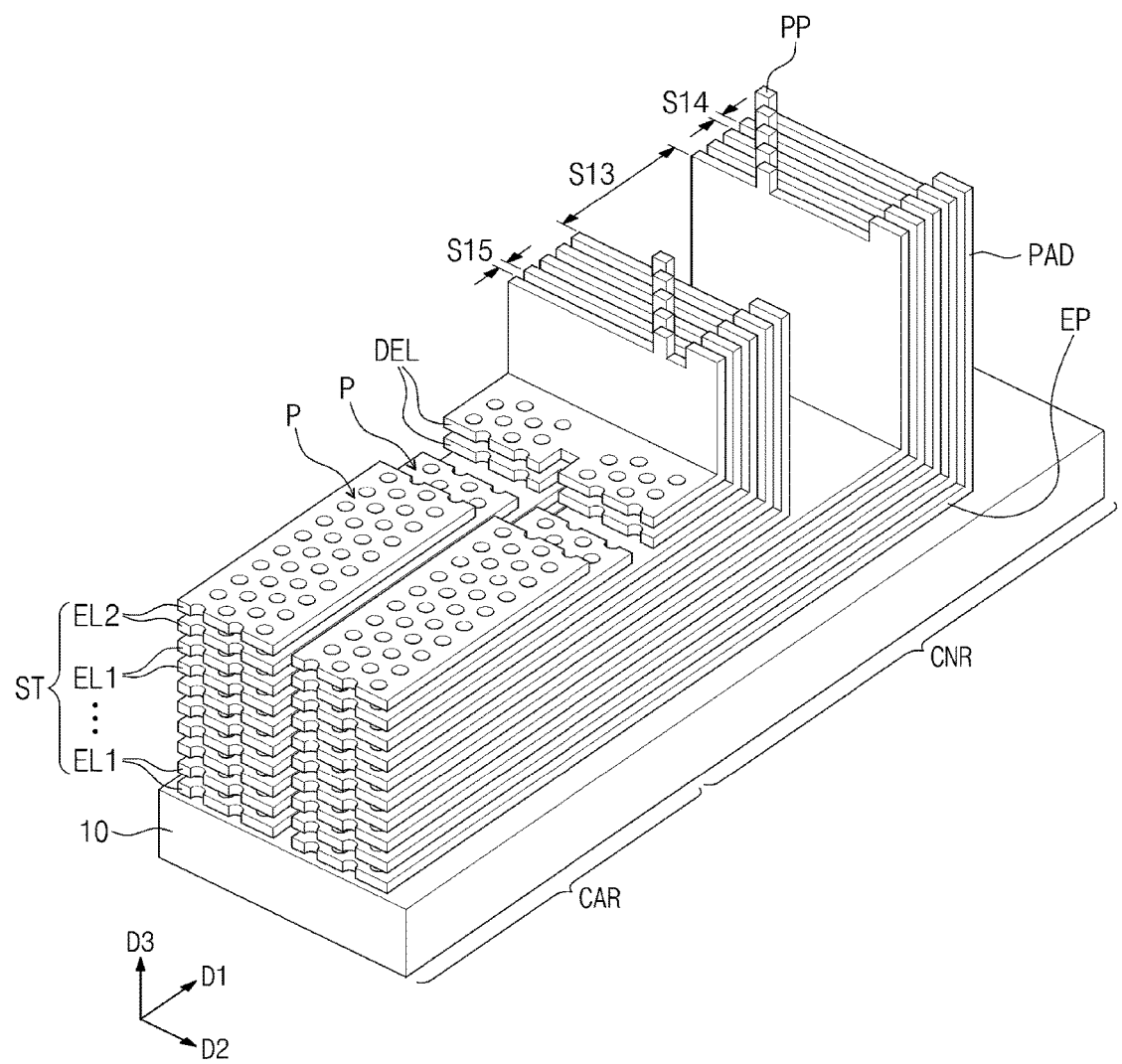

In the structures depicted in FIGS. 11A and 11B, the electrode structure ST may include a plurality of the lower electrodes EL1 that are stacked on the substrate 10 and the upper electrodes EL2 that are provided on the lower electrodes EL1.

In an embodiment, each of the lower electrodes EL1 may include an electrode portion EP, which is parallel or substantially parallel to the top surface of the substrate 10, a vertical pad portion PAD, which is inclined with respect to the top surface of the substrate 10, and a protruding portion PP, which protrudes vertically from a portion of the vertical pad portion PAD. Furthermore, as described in connection with FIGS. 4A and 4B, each of the electrode portions EP of the lower electrodes EL1 may include a plurality of the sub-electrode portions SEP and electrode connection portions ECP. The plurality of sub-electrode portions SEP may extend in the first direction D1 and are horizontally spaced apart from each other in the second direction D2. The electrode connecting portion ECP may be provided to horizontally connect the sub-electrode portions SEP to each other.

In an embodiment, the vertical pad portions PAD of the lower electrodes EL1 may have top surfaces that are positioned at the same level from the top surface of the substrate 10. The top surfaces of the vertical pad portions PAD of the lower electrodes EL1 may be positioned at a level that is lower than the top surfaces of the protruding portions PP of the lower electrodes EL1.

Furthermore, the vertical pad portions PAD of the lower electrodes EL1 may be horizontally spaced apart from each other by substantially the same distance S12, as depicted in FIG. 11A. In certain embodiments, an adjacent pair of the lower electrodes EL1 may have the vertical pad portions PAD that are spaced apart from each other by a first horizontal distance S13, as depicted in FIG. 11B. Also, another adjacent pair of the lower electrodes EL1 (not shown) may have the vertical pad portions PAD that are spaced apart from each other by a second horizontal distance (not shown). Here, the second horizontal distance may be greater than the first horizontal distance S13. In certain embodiments, the vertical pad portions PAD of the lower electrodes EL1 may be spaced apart from each other by a first horizontal distance S14, and the dummy electrode DEL and the vertical pad portion PAD of the lower electrode EL1 that are adjacent to the dummy electrode DEL may be spaced apart from each other by a second horizontal distance S15, which may be greater than the first horizontal distance.

In an embodiment, the upper electrodes EL2 may be parallel or substantially parallel to the top surface of the substrate 10 and may have a length that decreases as a distance increases from the substrate 10 as measured in the first direction D1. For example, the upper electrodes EL2 may be stacked to form a staircase-like structure on the electrode portions EP of the lower electrodes EL1. The upper electrodes EL2 may have pad portions P that are formed on the connection region CNR of the substrate 10 and that are exposed by an immediately above upper electrode EL2. Furthermore, the upper electrodes EL2 that are positioned at the same level from the top surface of the substrate 10 may be spaced apart from each other in the second direction D2.

The dummy electrodes DEL may be provided on the lower electrodes EL1 spaced apart from the upper electrodes EL2 in the first direction D1. In an embodiment, the dummy electrodes DEL may include the vertical pad portion, which is inclined with respect to the top surface of the substrate 10, and a protruding portion that protrudes from a portion of the vertical pad portion similar to the lower electrodes EL1. Additionally, the sidewalls of the dummy electrodes DEL that are adjacent to the upper electrodes EL2 may be vertically aligned with each other or may be horizontally spaced apart from each other, as described in connection with FIG. 8D.

Figure 12A:
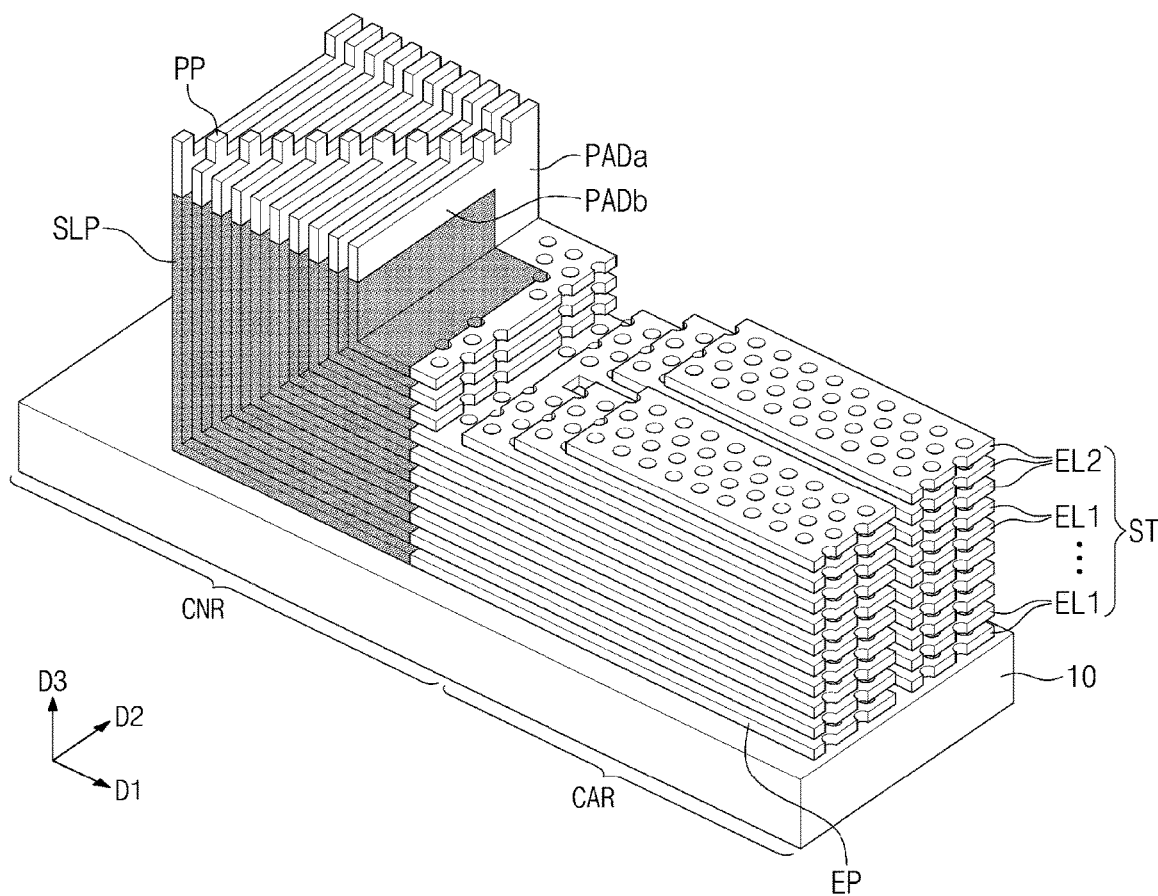
Figure 12B:
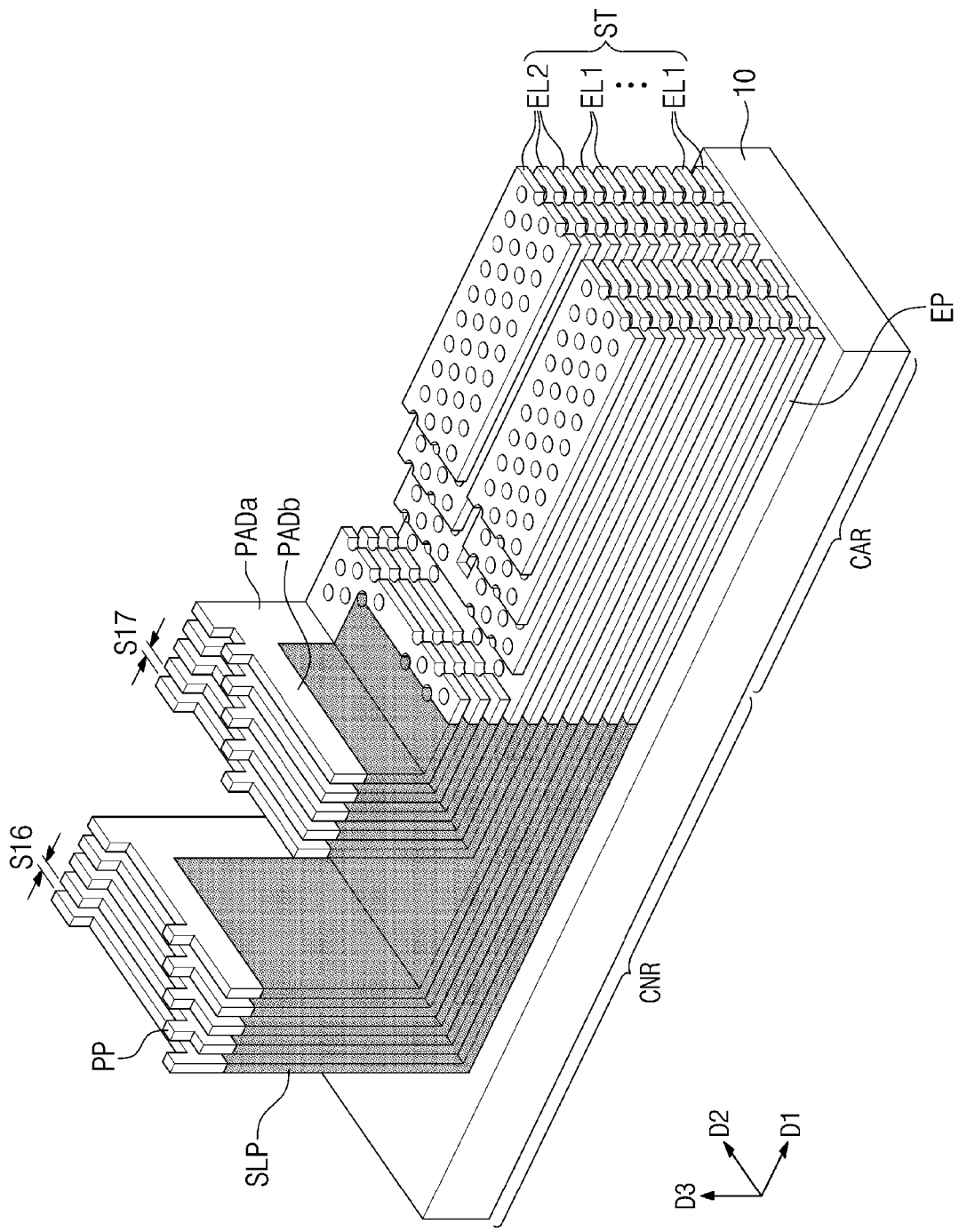

As described previously in connection with FIGS. 5A and 5B, in the structures depicted in FIGS. 12A and 12B, each of the lower electrodes EL1 may include electrode portion EP, vertical pad portions PADa, horizontal pad portion PADb, and protruding portion PP. The electrode portion EP may be is provided on the cell array region CAR of the substrate 10 and extends in the first direction D1. The vertical pad portion PADa may be provided on the connection region CNR of the substrate 10 and extends in the third direction D3. The horizontal pad portion PADb may be extended from a portion of the vertical pad portion PADa in the second direction D2. The protruding portion PP may protrude from a portion of the horizontal pad portion PADb in the third direction D3. Here, if measured in the second direction D2, a width of the vertical pad portion PADa may be less than the width of the electrode portion EP.

Furthermore, the vertical and horizontal pad portions PADa and PADb of the lower electrodes EL1 may be horizontally spaced apart from each other by substantially the same distance, as depicted in FIG. 12A. In certain embodiments, an adjacent pair of the lower electrodes EL1 may have the vertical pad portions PADa that are spaced apart from each other by a first horizontal distance S16, as depicted in FIG. 12B. Also, another adjacent pair of the lower electrodes EL1 may have the vertical pad portions PADa that are spaced apart from each other by a second horizontal distance S17. Here, the second horizontal distance S17 may be greater than the first horizontal distance S16. In certain embodiments, the vertical pad portions PADa of the lower electrodes EL1 may be spaced apart from each other by a first horizontal distance S16, and the dummy electrode DEL and the vertical pad portion PADa of the lower electrode EL1 adjacent to the dummy electrode DEL may be spaced apart from each other by a second horizontal distance S17, which may be greater than the first horizontal distance.

Each of the electrode portions EP of the lower electrodes EL1, as described in connection with FIGS. 5A and 5B, may include sub-electrode portions SEP, electrode-connecting portion ECP, and extended portion EXP. The sub-electrode portions SEP may be are spaced apart from each other in the second direction D2 and extend in the first direction D1. The electrode-connecting portion ECP may be provided on the connection region CNR of the substrate 10 to connect the sub-electrode portions SEP to each other. The extended portion EXP may extended from a portion of the electrode-connecting portion ECP in the first direction D1.

In some embodiments, the upper electrodes EL2 may be stacked on the electrode portions EP of the lower electrodes EL1 to form a staircase-like structure. For example, on the connection region CNR of the substrate 10, the sidewalls of the upper electrodes EL2 may be horizontally spaced apart from each other. Also, the upper electrodes EL2, which are positioned at the same level from the substrate 10, may be spaced apart from each other in the second direction D2. Similar to the lower electrodes EL1, the lowermost upper electrode EL2 may include the electrode portions, which are spaced apart from each other in the second direction D2, and the electrode-connecting ECP portion connecting the electrode portions to each other.

In an embodiment, the dummy electrodes DEL may include a vertical pad portion PADa, a horizontal pad portion PADb, and protruding portion PP similar to the lower electrodes EL1. The vertical pad portion PADa may be inclined to the top surface of the substrate 10. The horizontal pad portion PADb may extend from a portion of the vertical pad portion PADa in the second direction D2. The protruding portion PP may extend from a portion of the horizontal pad portion PADb in the third direction D3. The dummy electrodes DEL may have sidewalls that are formed to face the sidewalls of the upper electrodes EL2 and that are vertically aligned with each other.

On the connection region CNR of the substrate 10, the sacrificial patterns SLP may be disposed below the horizontal pad portions PADb of the lower electrodes EL1 and the dummy electrodes DEL. Each of the sacrificial patterns SLP may have an "L-shaped" section and may be in contact with bottom surfaces of the horizontal pad portions PADb of the lower and upper electrodes EL1 and EL2.

FIGS. 13A to 13F are perspective views depicting another method of fabricating a three-dimensional semiconductor device according to some embodiments of the inventive concept. For ease of description, details of elements or components previously described in connection with FIGS. 2A to 2I may be omitted.

Figure 13A:
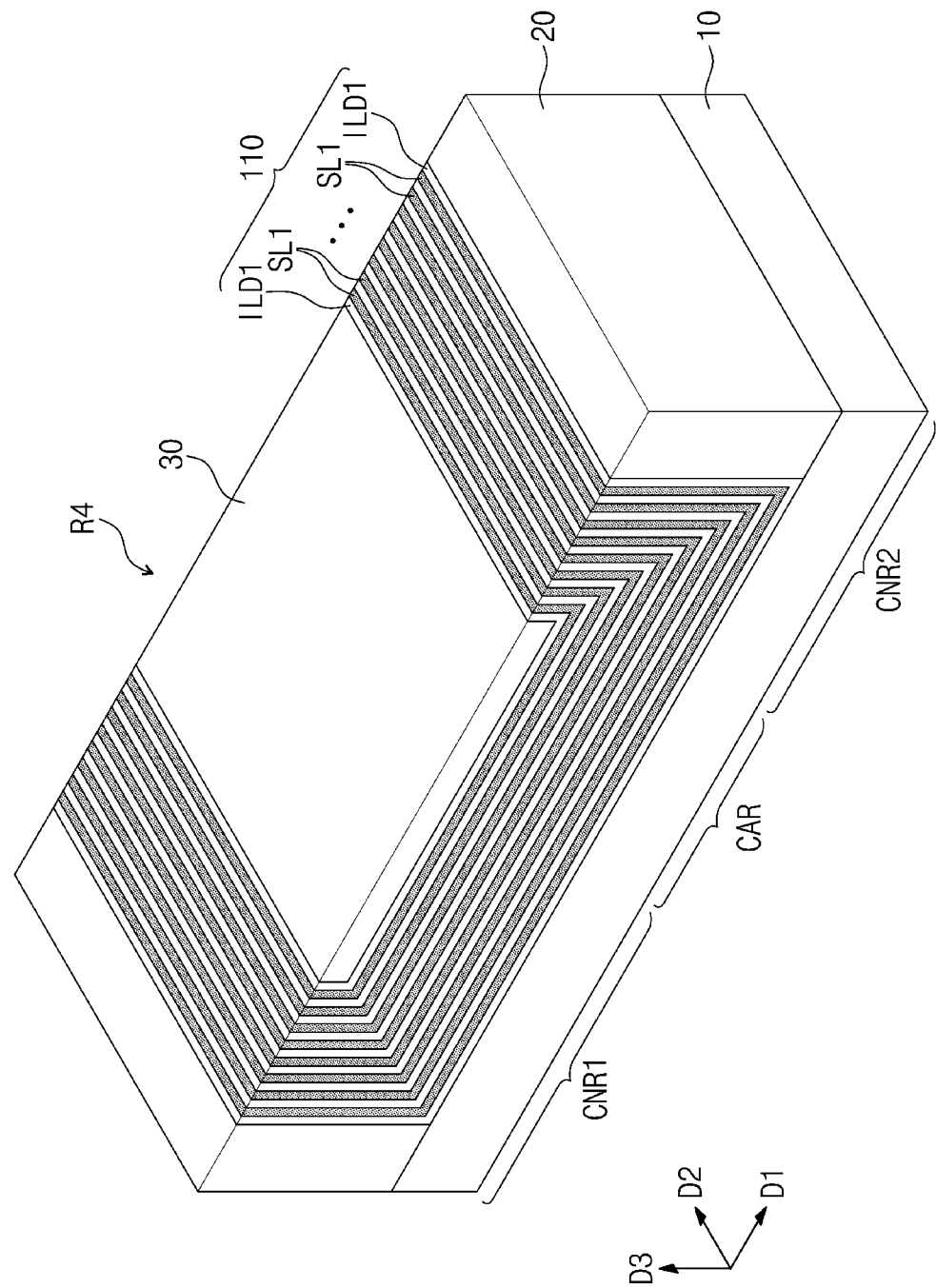
FIGS. 13A to 13F are perspective views depicting a method of fabricating a three-dimensional semiconductor device according to some embodiments of the inventive concept.

Referring to FIG. 13A, the substrate 10 may include first and second connection regions CNR1 and CNR2 and a cell array region CAR between the first and second connection regions CNR1 and CNR2. A mold pattern 20 may be formed on the substrate 10 to define a recess region R4. The mold pattern 20 may be formed to have a sidewall at an angle with respect to the top surface of the substrate 10. As an example, the mold pattern 20 may be formed on portions of the first and second connection regions CNR1 and CNR2 to expose the substrate 10 within the cell array region CAR. The mold pattern 20 may be formed from an insulating material or from the same material as the substrate 10.

A lower stack 110 may be formed in the recess region R4 of the mold pattern 20. The lower stack 110 may include lower insulating layers ILD1 and lower sacrificial layers SL1, which are alternately stacked on the substrate 10 and the mold pattern 20. The lower stack 110 may include a horizontal portion, which is parallel or substantially parallel to the top surface of the substrate 10, and sidewall portions, which are inclined with respect to the sidewall of the mold pattern 20. The sidewall portions of the lower stack 110 may have top surfaces that may be substantially coplanar with the top surface of the mold pattern 20. For example, on the first and second connection regions CNR1 and CNR2 of the substrate 10, the top surfaces of the lower sacrificial layers SL1 may be positioned at substantially the same level from the substrate 10.

Furthermore, an insulating planarization layer 30 may be formed on the horizontal portion of the lower stack 110, and a top surface of the insulating planarization layer 30 may be substantially coplanar with the top surface of the mold pattern 20. In other words, the top surface of the insulating planarization layer 30 may be substantially coplanar with the top surface of the sidewall portion of the lower stack 110. The insulating planarization layer 30 may be formed from an insulating material having an etch selectivity with respect to the lower sacrificial layers SL1.

Figure 13B:
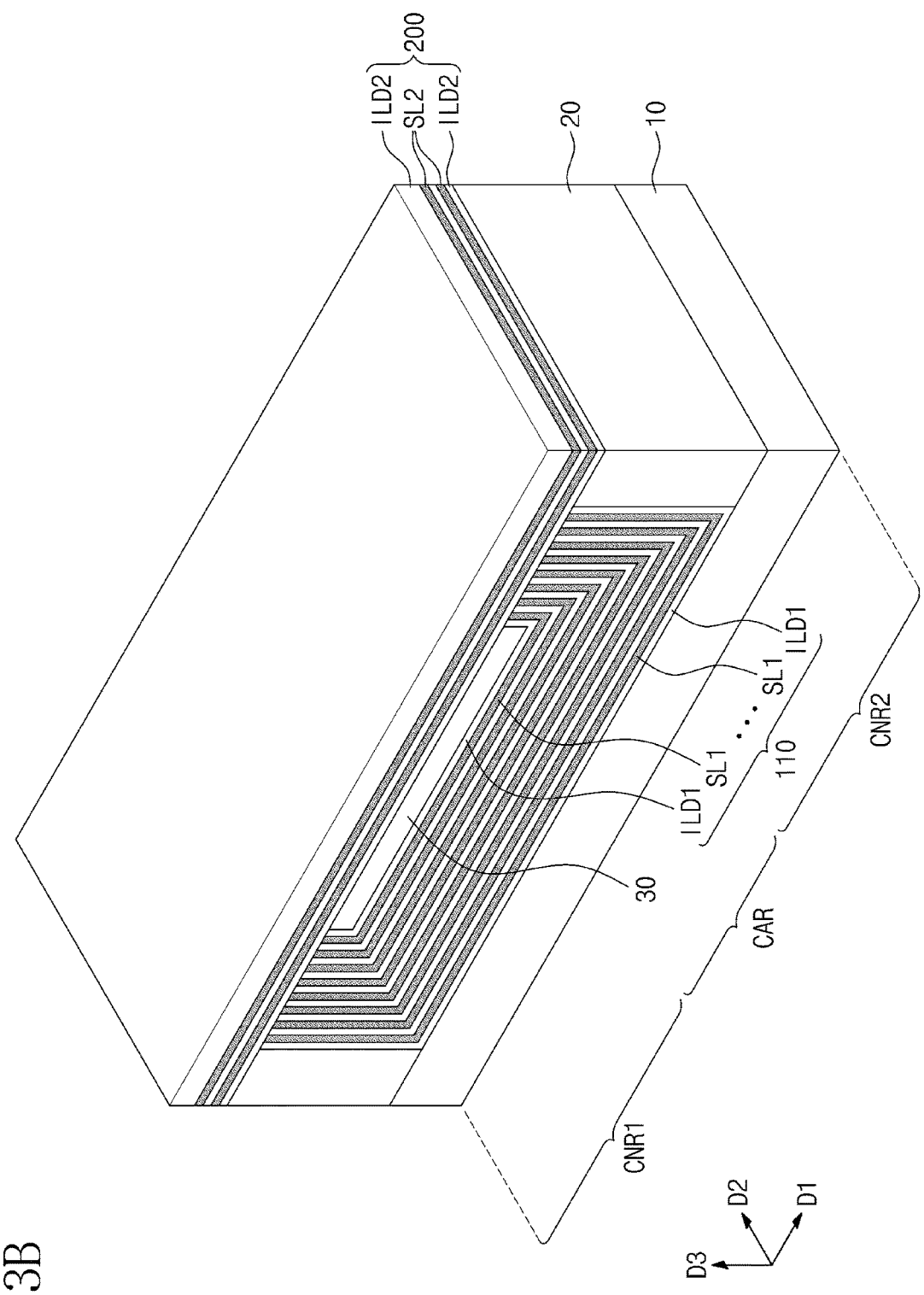

Referring to FIG. 13B, an upper layered structure 200 may be formed on the mold pattern 20 and the lower stack 110. The upper layered structure 200 may include upper insulating layers ILD2 and upper sacrificial layers SL2 which are alternately and vertically stacked on the substrate 10. Although the upper layered structure 200 is depicted as having two upper sacrificial layers SL2, the number of the upper sacrificial layers SL2 may be different.

In an embodiment, the lowermost layer of the upper insulating layers ILD2 may be in contact with the top surfaces of the lower sacrificial layers SL1. The upper sacrificial layers SL2 may be formed from the same material as the lower sacrificial layers SL1 and may have substantially the same thickness as the lower sacrificial layers SL1.

Figure 13C:
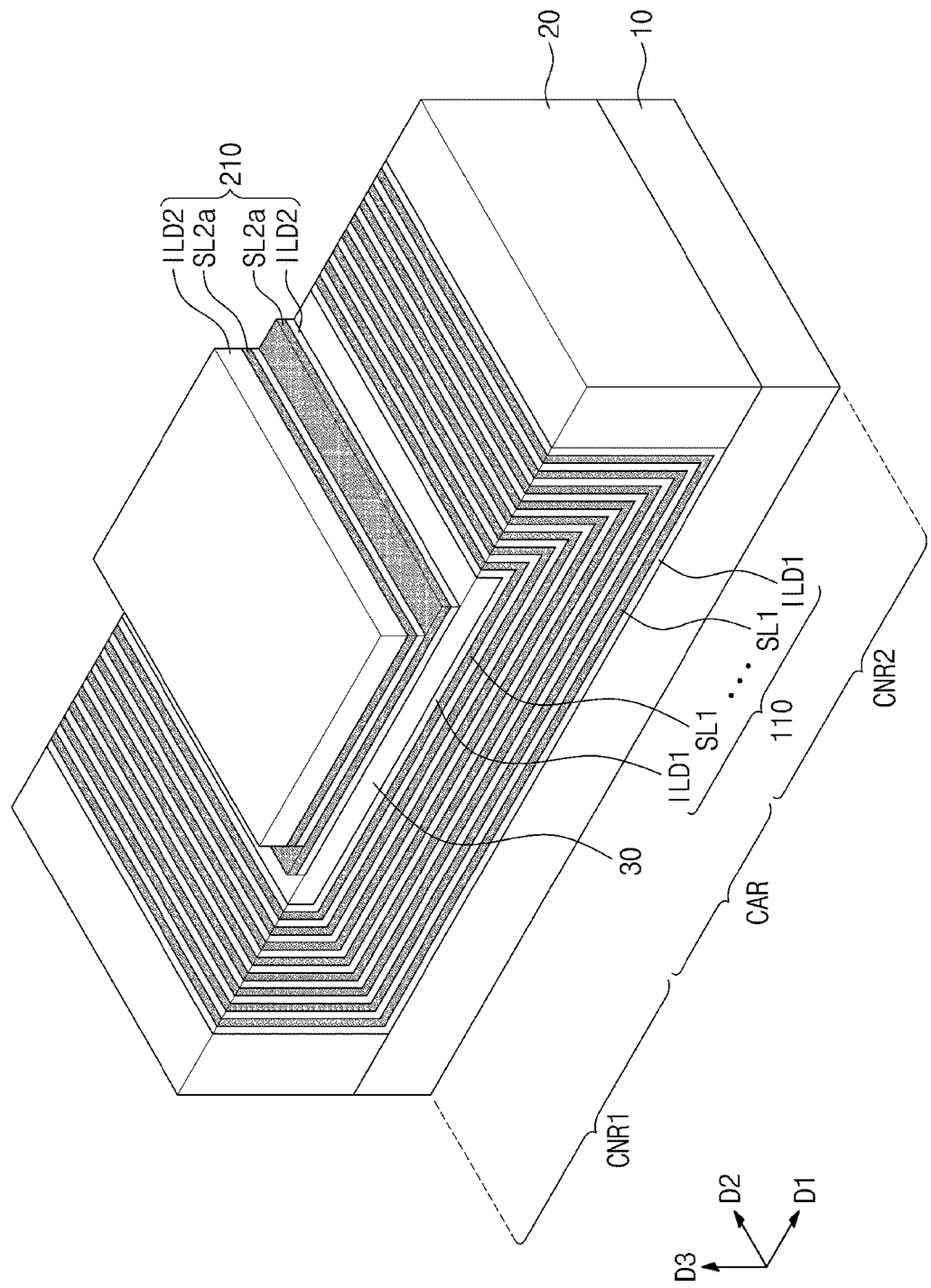

Referring to FIG. 13C, a pad-etching process may be performed on the upper layered structure 200 to form the upper stack 210 on the horizontal portion of the lower stack 110.

In an embodiment, as described with reference to FIGS. 8A to 8D, during the pad-etching process, a portion of the upper layered structure 200 may be repeatedly etched using a mask pattern followed by a trimming process that reduces an area of the mask pattern. A depth of the etching process may be substantially equal to a vertical pitch of the upper sacrificial layers SL2. As a result of the pad-etching process, the upper stack 210 may have a staircase-like structure on the first and second connection regions CNR1 and CNR2 of the substrate 10. For example, the upper stack 210 may include the upper insulating layers ILD2 and the upper sacrificial patterns SL2a, which are vertically and alternately stacked on the insulating planarization layer 30. Here, each of the upper sacrificial patterns SL2a may include pad portions that are formed on the first and second connection regions CNR1 and CNR2 of the substrate 10 and that are exposed by the upper sacrificial pattern SL2a formed above.

In some embodiments, the upper stack 210 may be formed to expose the sidewall portions of the lower stack 110. For example, the upper stack 210 may be formed to expose the top surfaces of the lower sacrificial layers SL1 on the first and second connection regions CNR1 and CNR2 of the substrate 10.

Figure 13D:
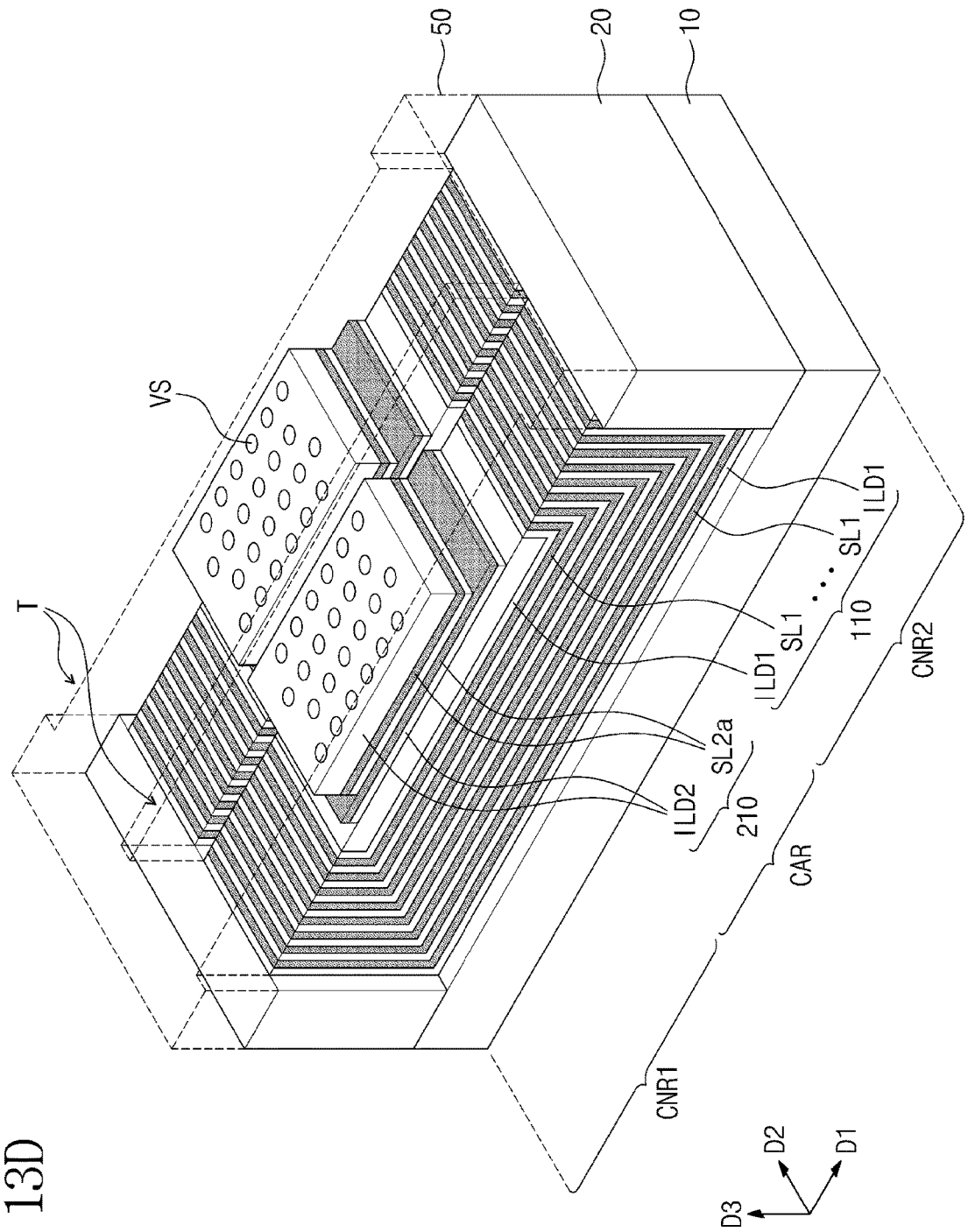

Referring to FIG. 13D, after the formation of the upper stack 210, the capping layer 50 (shown in phantom) may be formed to cover the lower stack 110 and the upper stack 210. After the formation of the capping layer 50, the vertical structures VS may be formed on the cell array region CAR of the substrate 10 to penetrate the lower and upper stacks 110 and 210, as described in connection with FIG. 2E.

After the vertical structures VS have been formed, the lower and upper stacks 110 and 210 may be patterned to form the trenches T that expose the substrate 10. As a result of forming the trenches T, the lower and upper stacks 110 and 210 may be divided into a plurality of mold structures that extend in the first direction D1. On the cell array region CAR and on the first and second connection regions CNR1 and CNR2 of the substrate 10, the lower sacrificial layers SL1 and the upper sacrificial patterns SL2a may have sidewalls that are exposed by the trenches T.

Figure 13E:
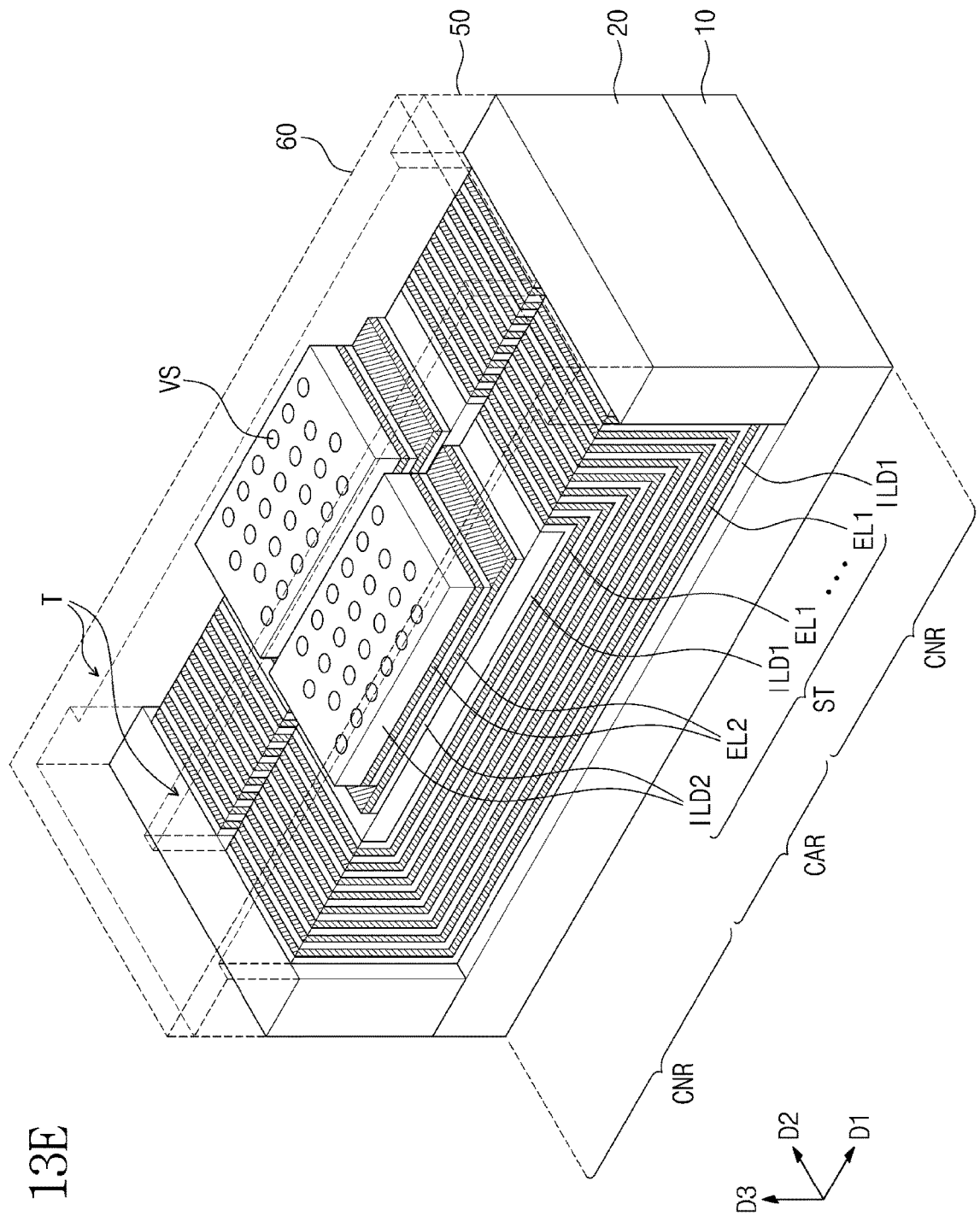

Next, as described in connection with FIGS. 7D and 7E, the lower sacrificial layers SL1 and the upper sacrificial patterns SL2a may be replaced by the electrodes EL1 and EL2 using a replacement process. Accordingly, as depicted in FIG. 13E, the electrodes EL1 and EL2 may be vertically stacked on the substrate 10, thereby forming the electrode structure ST.

In the electrode structures ST, each of the lower electrodes EL1 may include electrode portion EP and vertical pad portions PAD. The electrode portion EP may be parallel or substantially parallel to the top surface of the substrate 10.

The vertical pad portions PAD may be provided on the first and second connection regions CNR1 and CNR2 of the substrate 10, and may be inclined with respect to the top surface of the substrate 10, as described in connection with FIG. 10A. The vertical pad portions PAD of the lower electrodes EL1 may have top surfaces that are positioned at the same level from the top surface of the substrate 10.

In an embodiment, the vertical pad portions PAD of the lower electrodes EL1 may be horizontally spaced apart from each other by substantially the same distance. The horizontal distance between the vertical pad portions PAD may be substantially equal to or greater than the horizontal distance between the electrode portions EP.

In certain embodiments, an adjacent pair of the lower electrodes EL1 may have the vertical pad portions PAD that are spaced apart from each other by a first horizontal distance S14, as shown in FIG. 11B, as described in connection with FIG. 3. Also, another adjacent pair of the lower electrodes EL1 may have the vertical pad portions PAD that are spaced apart from each other by a second horizontal distance S15. Here, the second horizontal distance S15 may be greater than the first horizontal distance S14.

The upper electrodes EL2 may be stacked on the electrode portions of the lower electrodes EL1 to have a staircase-like structure on the first and second connection regions CNR1 and CNR2 of the substrate 10. In an embodiment, the lowermost upper electrode EL2 may have a bottom surface that is positioned at a level that is higher than top surfaces of the vertical pad portions PAD of the lower electrodes EL1.

Figure 13F:
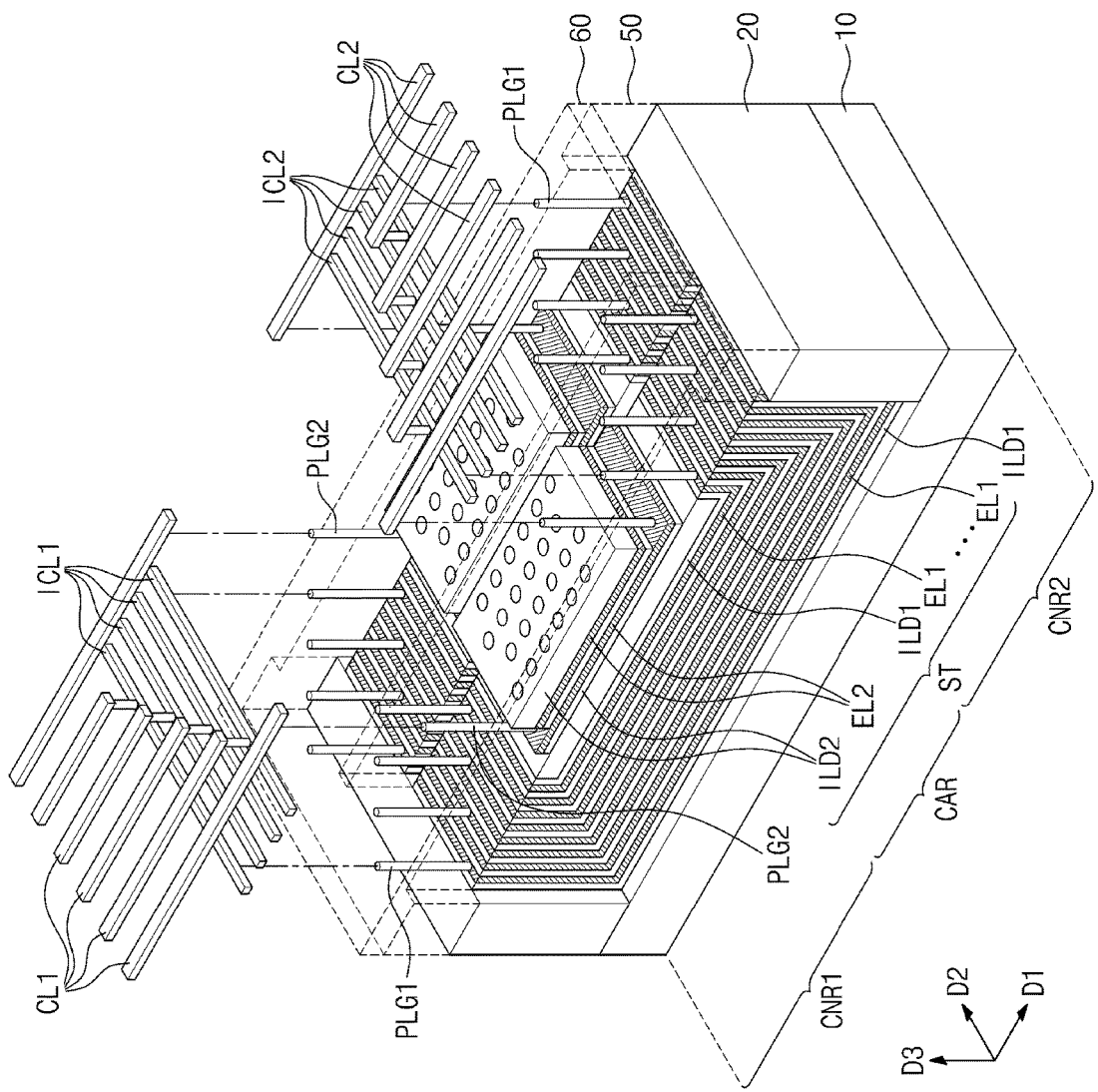

Referring to FIG. 13F, an interconnection structure may be formed that is connected to the electrode structure ST. In some embodiments, on the first connection region CNR1 of the substrate 10, the lower contact plugs PLG1 may be respectively coupled to the lower electrodes EL1 positioned at odd-numbered levels, and on the second connection region CNR2, the lower contact plugs PLG1 may be respectively coupled to the lower electrodes EL1 positioned at even-numbered levels, as described in connection with FIG. 7F. On the first and second connection regions CNR1 and CNR2 of the substrate 10, the upper contact plugs PLG2 may be respectively coupled to the pad portions of the upper electrodes EL2.

In an embodiment, the lower contact plugs PLG1 may be formed to have top surfaces that are substantially coplanar with the top surfaces of the upper contact plugs PLG2. The lower contact plugs PLG1 may have substantially the same length, but the length of the lower contact plugs PLG1 may be different from the length of the upper contact plugs PLG2.

Furthermore, as described in connection with FIG. 7F, the interconnection lines and the conductive lines may be connected to the lower and upper contact plugs PLG1 and PLG2.

Figure 14:
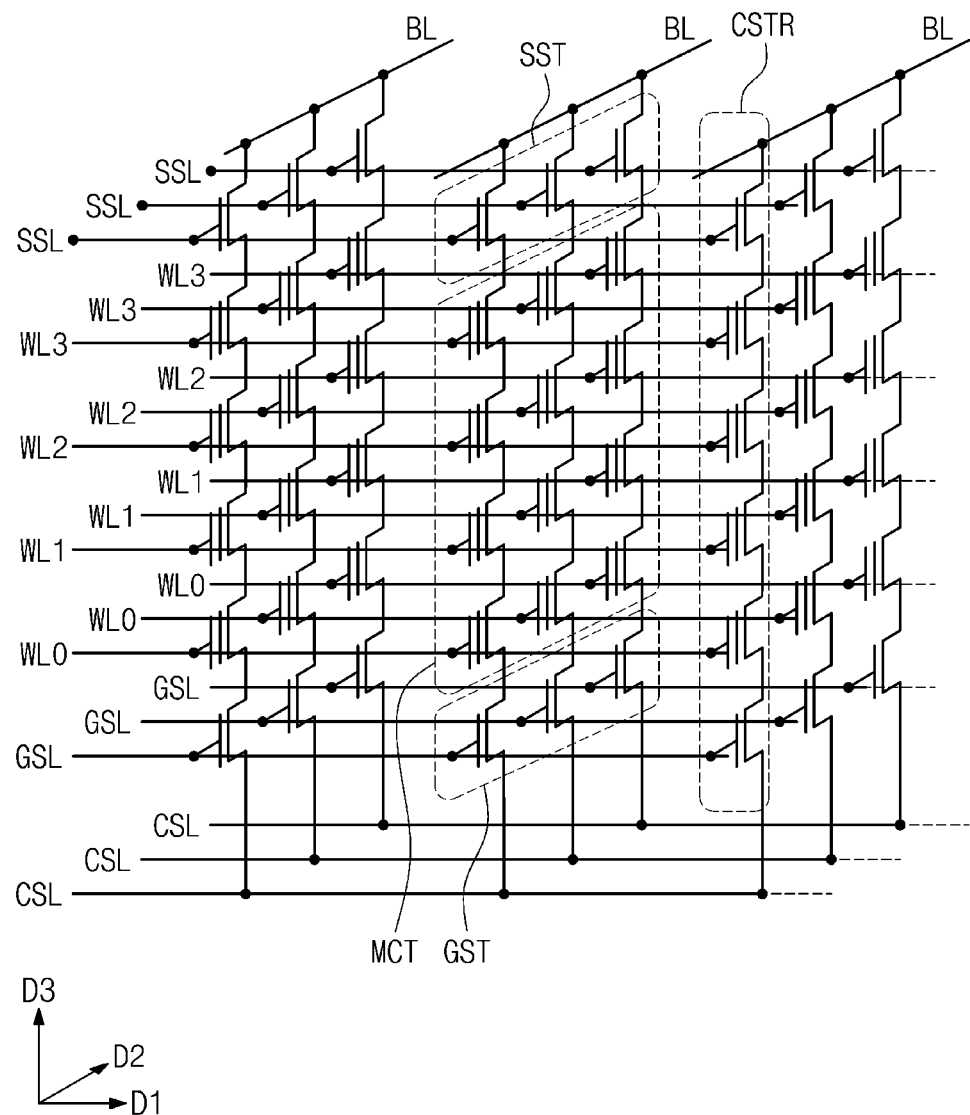
FIG. 14 is a circuit diagram depicting an example of a three-dimensional semiconductor memory device having an electrode structure according to example embodiments of the inventive concept.

FIG. 14 is a circuit diagram depicting an example of a three-dimensional semiconductor memory device having an electrode structure according to example embodiments of the inventive concept. FIGS. 15A to 15D are sectional views depicting a portion of a three-dimensional semiconductor memory device according to some embodiments of the inventive concept.

Referring to FIG. 14, a three-dimensional semiconductor memory device may include a common source line CSL, a plurality of bit lines BL, and a plurality of cell strings CSTR disposed between the common source line CSL and the bit lines BL.

The common source line CSL may be a conductive pattern provided on the substrate 10 or an impurity region formed in the substrate 10. The bit lines BL may be conductive patterns (e.g., metal lines) that are disposed over and separated from the substrate 10. The bit lines BL may be spaced apart from and parallel to each other, and a plurality of the cell strings CSTR may be connected in parallel to each of the bit lines BL. Thus, if viewed in a plan view, the cell strings CSTR may be two-dimensionally arranged on the common source line CSL or the substrate 10.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the string selection transistor SST, and the memory cell transistors MCT may be connected in series to each other. Furthermore, a ground selection line GSL, a plurality of word lines WL0-WL3, and a plurality of string selection lines SSL, which are disposed between the common source line CSL and the bit lines BL, may be respectively used as gate electrodes of the ground selection transistor GST, the memory cell transistors MCT, and the string selection transistors SST.

The ground selection transistors GST may be disposed at the substantially same level (for example, with respect to the substrate 10), and the gate electrodes thereof may be connected in common to the ground selection line GSL, thereby being in an equipotential state. Similarly, the gate electrodes of the memory cell transistors MCT at the same level may be connected in common to one of the word lines WL0-WL3, thereby being in an equipotential state. Since each of the cell strings CSTR includes a plurality of the memory cell transistors MCT disposed at different levels from each other, the word lines WL0-WL3 may be disposed to form a multi-layered structure between the common source line CSL and the bit lines BL. The multi-layered structure of the word lines WL0-WL3 may be configured to have substantially the same features as the electrode structures described in connection with FIGS. 2A to 13.

Each of the cell strings CSTR may include a semiconductor pattern that is vertically extended from the common source line CSL and is connected to one of the bit line BL. A memory layer or a memory element may be provided between the word lines WL0-WL3 and the semiconductor pattern. In some embodiments, the memory layer or the memory element may include a material or a layer structure in which electric charges can be selectively stored. For example, the memory layer may include one of an insulating layer with many trap sites (e.g., a silicon nitride layer), a floating gate electrode, or an insulating layer provided with conductive nano dots.

Hereinafter, the memory layer or a data-storing layer will be described in more detail with reference to FIGS. 15A to 15D.

In some embodiments, the three-dimensional semiconductor memory device may comprise a NAND FLASH memory device. For example, a data-storing layer DS may be interposed between the electrode structure ST and the vertical structure VS, and may include a tunnel insulating layer TIL, a charge-storing layer CIL, and a blocking insulating layer BLK. Data stored in the data-storing layer DS may be changed using a Fowler-Nordheim FN tunneling effect, which may be caused by a voltage difference between the vertical structure VS and the electrodes EL.

Figure 15A:
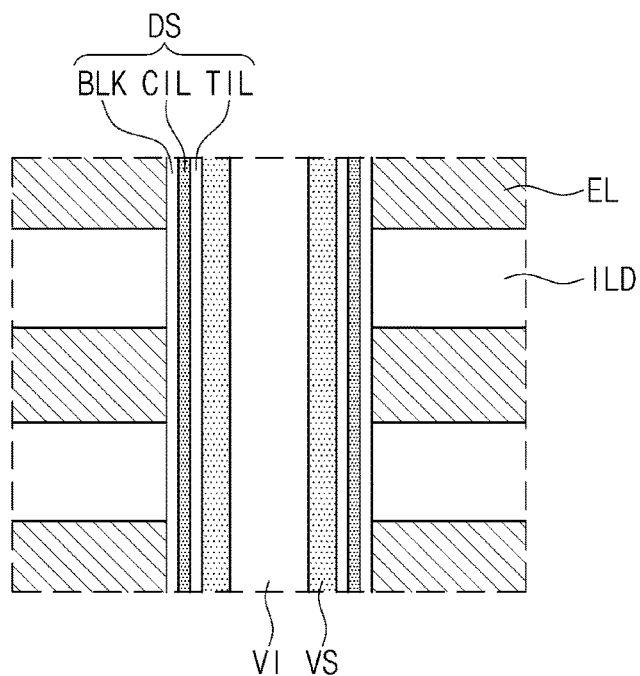
FIGS. 15A to 15D are sectional views depicting a portion of a three-dimensional semiconductor memory device according to some embodiments of the inventive concept.

In the structures shown in FIG. 15A, the tunnel insulating layer TIL, the charge-storing layer CIL, and the blocking insulating layer BLK may be extended from a region between the electrodes EL and the vertical structure VS to another region between the insulating layer ILD and the vertical structure VS.

Figure 15B:
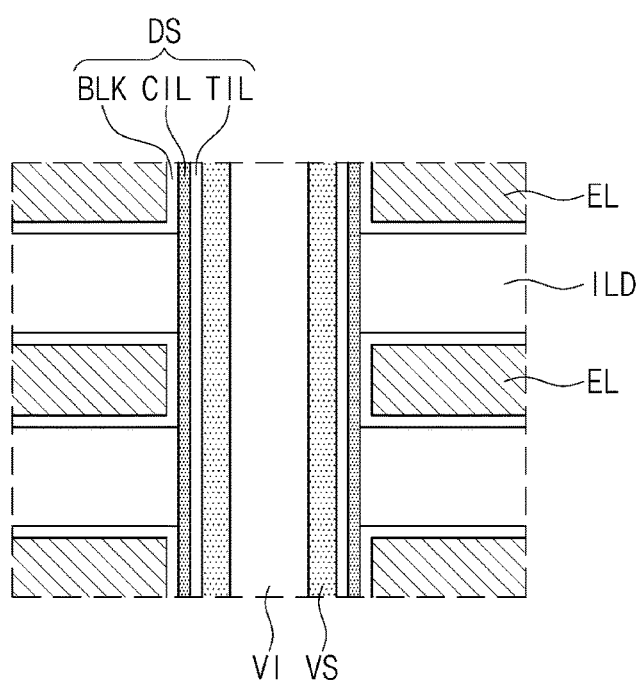

In the structures shown in FIG. 15B, the tunnel insulating layer TIL and the charge-storing layer CIL may be extended from a region between the electrodes EL and the vertical structure VS to another region between the insulating layer ILD and the vertical structure VS. Also, the blocking insulating layer BLK may be extended from a region between the electrodes EL and the vertical structure VS to cover top and bottom surfaces of the electrodes EL.

Figure 15C:
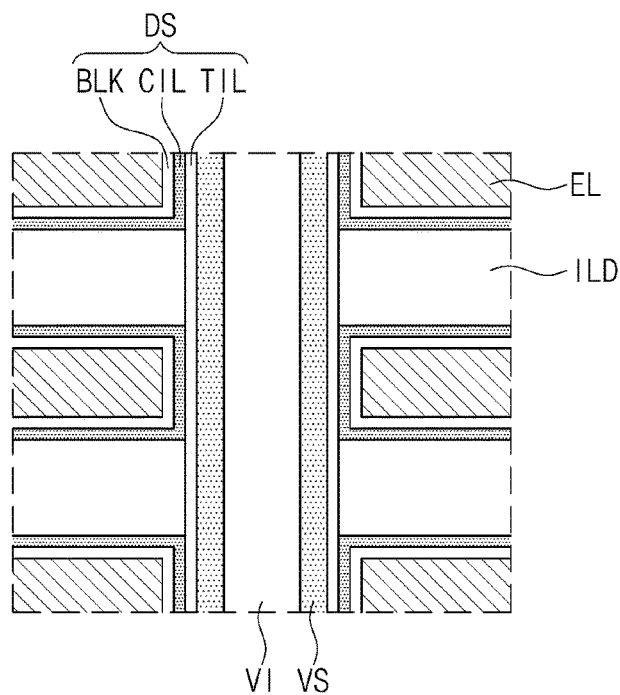

In the structures shown in FIG. 15C, the tunnel insulating layer TIL may be extended from a region between the electrodes EL and the vertical structure VS to another region between the insulating layer ILD and the vertical structure VS, and the charge-storing layer CIL and the blocking insulating layer BLK may be extended from a region between the electrodes EL and the vertical structure VS to cover top and bottom surfaces of the electrodes EL.

Figure 15D:
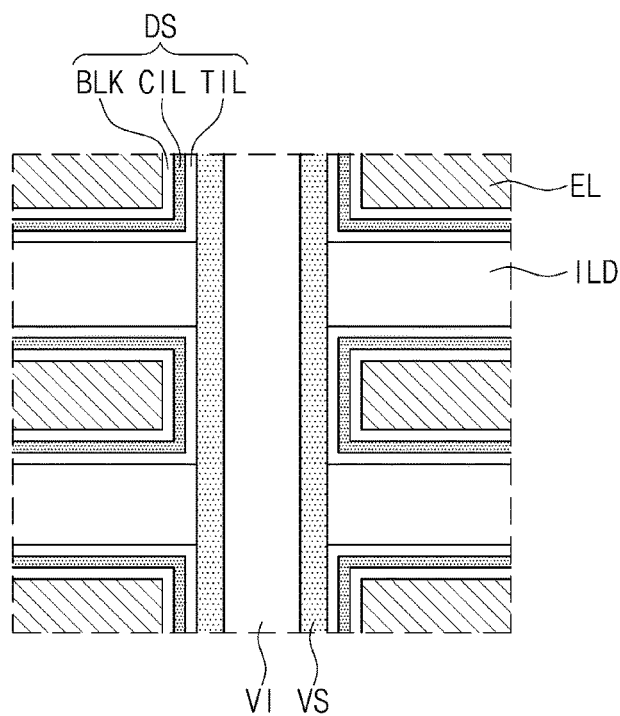

In the structures shown in FIG. 15D, the tunnel insulating layer TIL, the charge-storing layer CIL, and the blocking insulating layer BLK may be extended from a region between the electrodes EL and the vertical structure VS to cover top and bottom surfaces of the electrodes EL.

In the data-storing layer, the charge-storing layer CIL may be one of an insulating layer with many trap sites and an insulating layer with nano particles and may be formed by a CVD or atomic layer deposition (ALD) process. For example, the charge-storing layer CIL may be formed from or include a trap insulating layer, a floating-gate electrode, or an insulating layer containing conductive nano dots. In certain embodiments, the charge-storing layer CIL may be formed from or include at least a silicon nitride layer, a silicon oxynitride layer, a silicon-rich nitride layer, a nanocrystalline silicon layer, a laminated trap layer or a combination thereof.

The tunnel insulating layer TIL may be one of materials having a greater band gap than the charge-storing layer CIL and be formed by a CVD or ALD process. For example, the tunnel insulating layer TIL may be a silicon oxide layer, which may be formed by one of the afore-described deposition techniques. In certain embodiments, the tunnel insulating layer TIL may be formed from or may include at least one of high-k dielectric materials (e.g., aluminum oxide and hafnium oxide).

The blocking insulating layer BLK may include first and second blocking insulating layers formed from different materials. In some embodiments, one of the first and second blocking insulating layers may be formed from a material having a band gap that is smaller than the band gap of the tunnel insulating layer TIL and is greater than the band gap of the charge storing layer CIL. The first and second blocking insulating layers may be formed by a CVD or ALD process. One of the first and second blocking insulating layers may be formed by a wet-oxidation process. As an example, the first blocking insulating layer may be formed from a high-k dielectric material (e.g., aluminum oxide and hafnium oxide) and the second blocking insulating layer may be formed from a material having a dielectric constant that is less than the dielectric constant of the first blocking insulating layer. As another example, the second blocking insulating layer may be formed from a high-k dielectric material, and the first blocking insulating layer may be formed from a material having a dielectric constant that is less than the second blocking insulating layer.

According to some embodiments of the inventive concept, the minimum distance between vertical pad portions of adjacent lower and upper electrodes may be greater than the distance between the vertical pad portions of adjacent lower electrodes. This may make it possible to increase a process margin in a process for forming contact plugs that are respectively coupled to the vertical pad portions of the lower and upper electrodes.

According to some embodiments of the inventive concept, the lower electrodes may include vertical pad portions, which are inclined with respect to a top surface of a substrate, and may have electrode portions that are parallel or substantially parallel to the top surface of the substrate. The upper electrodes may be stacked to form a staircase-like structure on the electrode portions of the lower electrodes. This may make it possible to increase a process margin in a process of forming an interconnection structure (e.g., including contact plugs and conductive lines) that is coupled to the vertical pad portions of the lower electrodes and end portions of the upper electrodes.

FIG. 16 depicts an electronic device 1600 that comprises one or more integrated circuits (chips) comprising a three-dimensional semiconductor memory device according to embodiments disclosed herein. Electronic device 1600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 1600 may comprise a controller 1610, an input/output device 1620 such as, but not limited to, a keypad, a keyboard, a display, or a touch-screen display, a memory 1630, and a wireless interface 1640 that are coupled to each other through a bus 1650. The controller 1610 may comprise, for example, at least one microprocessor, at least one digital signal process, at least one microcontroller, or the like. The memory 1630 may be configured to store a command code to be used by the controller 1610 or a user data. Electronic device 1600 and the various system components may comprise a semiconductor device that includes a three-dimensional semiconductor storage device according to embodiments disclosed herein. The electronic device 1600 may use a wireless interface 1640 configured to transmit data to or receive data from a wireless communication network using a RF signal. The wireless interface 1640 may include, for example, an antenna, a wireless transceiver and so on. The electronic system 1600 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
   a lower electrode structure including a plurality of lower electrodes that are vertically stacked on a substrate; and
   an upper electrode structure including a plurality of upper electrodes that are stacked on the lower electrode structure,
   wherein each of the lower and upper electrodes comprises an electrode portion that is substantially parallel to a top surface of the substrate and a vertical pad portion that is inclined with respect to the top surface of the substrate,
   the vertical pad portions of adjacent lower electrodes are spaced apart from each other by a first horizontal distance, and
   the vertical pad portions of adjacent lower and upper electrodes are spaced apart from each other by a second horizontal distance that is greater than the first horizontal distance.

2. The device of claim 1, wherein the vertical pad portions of the lower and upper electrodes comprise top surfaces that are positioned at substantially a same level from the substrate.

3. The device of claim 1, wherein, in an adjacent pair of the lower and upper electrodes, a vertical distance between the electrode portions is less than the second horizontal distance between the vertical pad portions.

4. The device of claim 1, wherein the electrode portions of adjacent lower electrodes are spaced apart from each other by a first vertical distance that is substantially the same as the first horizontal distance.

5. The device of claim 1, wherein the vertical pad portions of adjacent upper electrodes are spaced apart from each other by the first horizontal distance, and
   the electrode portions of adjacent upper electrodes are spaced apart from each other by a first vertical distance that is substantially a same distance as the first horizontal distance.

6. The device of claim 1, further comprising a mold pattern that is interposed between the vertical pad portions of the adjacent pair of the lower and upper electrodes.

7. The device of claim 6, wherein a top surface of the mold pattern is positioned at substantially the same level as the top surfaces of the vertical pad portions of the lower and upper electrodes with respect to the top surface of the substrate.

8. The device of claim 1, wherein the lower electrode structure further comprises lower insulating layers that are respectively provided between the lower electrodes,
   wherein the upper electrode structure further comprises upper insulating layers that are respectively provided between the upper electrodes,
   wherein the three-dimensional semiconductor device further comprises a buffer pattern that is provided between the vertical pad portions of the adjacent pair of the lower and upper electrodes, and the buffer pattern is formed from an insulating material that is different from a material forming the lower and upper insulating layers.

9. The device of claim 1, further comprising:
   first contact plugs respectively coupled to the vertical pad portions of the lower electrodes; and
   second contact plugs respectively coupled to the vertical pad portions of the upper electrodes,
   wherein the first contact plugs have substantially a same length as a length of the second contact plugs.

10. The device of claim 1, wherein the lower and upper electrode structures extend in a first direction that is substantially parallel to the top surface of the substrate, and
    a length, in the first direction, of the electrode portions of the lower and upper electrodes decreases with increasing distance from the substrate.

11. A semiconductor memory device, comprising:
    a first layered electrode structure on a surface of a substrate, the first layered electrode structure comprising a plurality of first electrodes stacked in a first direction away from the substrate, each first electrode comprising a horizontal electrode portion and a vertical pad portion disposed at a first end of the horizontal portion, the horizontal electrode portion of a first electrode extending substantially in a second direction and the vertical pad portion of a first electrode extending substantially in the first direction, the second direction being substantially parallel to the surface of the substrate, the first ends of the horizontal portions and the corresponding vertical pad portions of the first electrodes being grouped together, and the vertical pad portions of the first electrodes being spaced apart from each other in the second direction by a first distance; and
    a second layered electrode structure on the first layered electrode structure, the second layered electrode structure comprising a plurality of second electrodes stacked in the first direction away from the substrate, each second electrode comprising a horizontal electrode portion and a vertical pad portion disposed at a first end of the horizontal portion, the horizontal electrode portion of a second electrode extending substantially in the second direction and the vertical pad portion of a second electrode extending substantially in the first direction, the first ends of the horizontal portions and the vertical pad portions of the second electrodes being grouped together, the grouped-together vertical pad portions of the second electrodes being spaced apart in the second direction from the grouped-together vertical pad portions of the first electrodes by a second distance that is greater than the first distance.

12. The semiconductor device of claim 11, wherein the first direction forms an angle with a top surface of the substrate that ranges from about 90 degrees to about 130 degrees with respect to the top surface of the substrate.

13. The semiconductor device of claim 11, wherein the first direction is substantially perpendicular to the top surface of the substrate.

14. The semiconductor device of claim 11, wherein the vertical pad portions of the first electrodes and the vertical pad portions of the second electrodes each comprise a top surface, and
    wherein the top surfaces of the vertical pad portions of the first electrodes and the top surfaces of the second electrodes are at substantially a same level from the top surface of the substrate.

15. The semiconductor device of claim 11, further comprising a plurality of vertical structures each extending substantially in a fourth direction through the horizontal portions of the plurality of first electrodes and the horizontal portions of the plurality of second electrodes, at least one vertical structure comprising a memory device structure, and the fourth direction being perpendicular to the top surface of the substrate.

16. The semiconductor device of claim 15, wherein the memory device structure comprises a plurality of memory cells, each memory cell corresponding to one of the first electrodes or one of the second electrodes.

17. The semiconductor device of claim 16, wherein the memory device structure comprises a NAND FLASH memory device.

18. The semiconductor device of claim 11, wherein the plurality of first electrodes are further arranged into a plurality of stacks of first electrodes, each stack of first electrodes being separated from each other in a third direction, the third direction being substantially perpendicular to the second direction, and wherein the plurality of second electrodes are further arranged into a plurality of stacks of second electrodes, each stack of first electrodes being separated from each other in the third direction and each stack of second electrodes corresponding to a stack of first electrodes.

19. The semiconductor device of claim 18, further comprising a plurality of vertical structures each extending through the horizontal portions of the plurality of first electrodes and the horizontal portions of the plurality of second electrodes, at least one vertical structure comprising a memory device structure.

20. The semiconductor device of claim 15, wherein each first electrode and each second electrode further comprises a connecting portion disposed between the horizontal electrode portion and the vertical pad portion of the electrode.

\* \* \* \* \*